US011563050B2

(12) United States Patent
Asatsuma et al.

(10) Patent No.: US 11,563,050 B2
(45) Date of Patent: Jan. 24, 2023

(54) IMAGING DEVICE AND ELECTRONIC DEVICE

(71) Applicant: SONY CORPORATION, Tokyo (JP)

(72) Inventors: Tomohiko Asatsuma, Kanagawa (JP); Minoru Ishida, Tokyo (JP)

(73) Assignee: SONY CORPORATION, Tokyo (JP)

( * ) Notice: Subject to any disclaimer, the term of this patent is extended or adjusted under 35 U.S.C. 154(b) by 637 days.

(21) Appl. No.: 16/080,575

(22) PCT Filed: Feb. 24, 2017

(86) PCT No.: PCT/JP2017/006987
§ 371 (c)(1),
(2) Date: Aug. 28, 2018

(87) PCT Pub. No.: WO2017/154605
PCT Pub. Date: Sep. 14, 2017

(65) Prior Publication Data
US 2021/0193727 A1 Jun. 24, 2021

(30) Foreign Application Priority Data
Mar. 10, 2016 (JP) .............................. JP2016-046633

(51) Int. Cl.
*H01L 27/146* (2006.01)
(52) U.S. Cl.
CPC .... *H01L 27/14645* (2013.01); *H01L 27/1464* (2013.01); *H01L 27/14621* (2013.01); *H01L 27/14623* (2013.01); *H01L 27/14627* (2013.01)
(58) Field of Classification Search
CPC .......................... H01L 27/14654–14656; H04N 5/35536–35563
See application file for complete search history.

(56) References Cited

U.S. PATENT DOCUMENTS 6,850,278 B1 * 2/2005 Sakurai .............. H04N 5/35563
250/208.1
7,319,242 B2 * 1/2008 Shimizu ............... G02B 3/0031
257/294
(Continued)

FOREIGN PATENT DOCUMENTS

CN 1812507 A 8/2006
CN 101562707 A 10/2009
(Continued)

OTHER PUBLICATIONS

International Search Report and Written Opinion of PCT Application No. PCT/JP2017/006987, dated May 23, 2017, 11 pages.
(Continued)

*Primary Examiner* — Jarrett J Stark
(74) *Attorney, Agent, or Firm* — Chip Law Group

(57) ABSTRACT

Provided are a first photoelectric conversion unit, a second photoelectric conversion unit having a smaller electric charge amount to be converted per unit time than the first photoelectric conversion unit, a charge accumulation unit that accumulates an electric charge generated by the second photoelectric conversion unit, a charge voltage conversion unit, a first transfer gate unit that transfers an electric charge from the first photoelectric conversion unit to the charge voltage conversion unit, a second transfer gate unit that couples potentials of the charge voltage conversion unit and the charge accumulation unit, a third transfer gate unit that transfers an electric charge from the second photoelectric conversion unit to the charge accumulation unit, an overflow path formed under a gate electrode of the third transfer gate unit and transfers an electric charge overflowing from the second photoelectric conversion unit to the charge accumulation unit, and a light reducing unit that reduces light to enter the second photoelectric conversion unit.

17 Claims, 39 Drawing Sheets

(56) References Cited

U.S. PATENT DOCUMENTS

| | | | |
|---|---|---|---|
| 7,446,294 B2* | 11/2008 | Lin | H01L 27/14627 250/208.1 |
| 7,821,559 B2* | 10/2010 | Kishi | H04N 5/359 348/308 |
| 9,372,286 B2* | 6/2016 | Li | B29D 11/00451 |
| 10,840,280 B2* | 11/2020 | Tomekawa | H01L 27/14607 |
| 2002/0130957 A1 | 9/2002 | Gallagher et al. | |
| 2005/0078377 A1* | 4/2005 | Li | B29D 11/00365 359/619 |
| 2005/0110093 A1* | 5/2005 | Altice | H01L 27/14654 257/359 |
| 2008/0211945 A1* | 9/2008 | Hong | H04N 9/045 348/294 |
| 2008/0266434 A1* | 10/2008 | Sugawa | H04N 5/35554 348/308 |
| 2008/0290382 A1* | 11/2008 | Hirota | H01L 27/14627 257/291 |
| 2009/0251582 A1 | 10/2009 | Oike | |
| 2010/0201834 A1 | 8/2010 | Maruyama et al. | |
| 2011/0076001 A1* | 3/2011 | Iwasaki | H04N 9/045 396/114 |
| 2011/0121162 A1* | 5/2011 | Murata | H01L 27/14645 250/208.1 |
| 2011/0175981 A1* | 7/2011 | Lai | H01L 27/14621 348/46 |
| 2011/0215223 A1* | 9/2011 | Nagami | H01L 27/148 250/208.1 |
| 2011/0228149 A1* | 9/2011 | Naruse | H01L 27/1463 348/273 |
| 2012/0086845 A1* | 4/2012 | Enomoto | H01L 27/14614 348/311 |
| 2012/0217601 A1* | 8/2012 | Miyanami | H01L 27/14623 257/432 |
| 2012/0262616 A1* | 10/2012 | Sa | H04N 5/3745 348/311 |
| 2012/0267744 A1 | 10/2012 | Tsuji | |
| 2013/0027591 A1 | 1/2013 | Lukac et al. | |
| 2013/0256510 A1 | 10/2013 | Lyu | |
| 2014/0253767 A1* | 9/2014 | Kato | H01L 27/14621 348/280 |
| 2015/0084144 A1* | 3/2015 | Suzuki | H04N 9/045 257/432 |
| 2016/0276396 A1* | 9/2016 | Tayanaka | H01L 27/14645 |
| 2017/0099422 A1* | 4/2017 | Goma | H04N 5/355 |
| 2018/0115727 A1* | 4/2018 | Yanagita | H04N 5/37457 |
| 2018/0152650 A1* | 5/2018 | Sakakibara | H04N 5/379 |
| 2018/0184025 A1* | 6/2018 | Yanagita | H04N 5/369 |
| 2018/0191973 A1* | 7/2018 | Hirota | H04N 5/374 |
| 2018/0241955 A1* | 8/2018 | Sakano | H04N 5/378 |
| 2018/0308883 A1* | 10/2018 | Yanagita | H04N 5/35563 |
| 2018/0366513 A1* | 12/2018 | Yang | H04N 5/37452 |
| 2019/0019820 A1* | 1/2019 | Takizawa | H01L 27/14614 |
| 2019/0043900 A1* | 2/2019 | Oka | H04N 5/37213 |
| 2019/0096933 A1* | 3/2019 | Kido | H01L 27/14614 |
| 2019/0098232 A1* | 3/2019 | Mori | H04N 5/3559 |
| 2019/0222811 A1* | 7/2019 | Yamaguchi | H04N 9/045 |
| 2019/0341411 A1* | 11/2019 | Lim | H01L 27/14641 |
| 2019/0341418 A1 | 11/2019 | Suzuki et al. | |
| 2020/0154066 A1* | 5/2020 | Johnson | H04N 5/3559 |
| 2020/0404204 A1* | 12/2020 | Kawazu | H04N 5/37457 |

FOREIGN PATENT DOCUMENTS

| | | |
|---|---|---|
| CN | 101800233 A | 8/2010 |
| CN | 101841666 A | 9/2010 |
| CN | 102209206 A | 10/2011 |
| CN | 102714702 A | 10/2012 |
| CN | 102905090 A | 1/2013 |
| CN | 103247642 A | 8/2013 |
| CN | 103258829 A | 8/2013 |
| CN | 103369266 A | 10/2013 |
| CN | 103650479 A | 3/2014 |
| CN | 104969540 A | 10/2015 |
| DE | 102012213189 A1 | 1/2013 |
| EP | 1227661 A2 | 7/2002 |
| EP | 2107610 A2 | 10/2009 |
| EP | 2216818 A2 | 8/2010 |
| JP | 08-125933 A | 5/1996 |
| JP | 2002-305685 A | 10/2002 |
| JP | 2009-268083 A | 11/2009 |
| JP | 2010-186818 A | 8/2010 |
| JP | 2012-227474 A | 11/2012 |
| JP | 2013-081154 A | 5/2013 |
| JP | 2015-133469 A | 7/2015 |
| KR | 10-2009-0105871 A | 10/2009 |
| KR | 10-2010-0091891 A | 8/2010 |
| KR | 10-2013-0010937 A | 1/2013 |
| KR | 10-2013-0012935 A | 2/2013 |
| KR | 10-2016-0097121 A | 8/2016 |
| TW | 201002057 A | 1/2010 |
| TW | 201104852 A | 2/2011 |
| TW | 201347158 A | 11/2013 |
| TW | 201523861 A | 6/2015 |
| WO | 2015/012098 A1 | 1/2015 |
| WO | 2015/087515 A2 | 6/2015 |

OTHER PUBLICATIONS

Office Action for CN Patent Application No. 201780014844.3, dated Sep. 23, 2022, 07 pages of English Translation and 05 pages of Office Action.

* cited by examiner

FIG. 35A

| G | R | G | R |
| B | G | B | G |
| G | R | G | R |
| B | G | B | G |

| G | R | G | R |
| B | C | B | C |
| G | R | G | R |
| B | C | B | C |

| C | R | C | R |
| C | C | C | C |
| C | R | C | R |
| C | C | C | C |

R/C/C/C

IMAGING DEVICE AND ELECTRONIC DEVICE

CROSS REFERENCE TO RELATED APPLICATIONS

This application is a U.S. National Phase of International Patent Application No. PCT/JP2017/006987 filed on Feb. 24, 2017, which claims priority benefit of Japanese Patent Application No. JP 2016-046633 filed in the Japan Patent Office on Mar. 10, 2016. Each of the above-referenced applications is hereby incorporated herein by reference in its entirety.

TECHNICAL FIELD

The present technology relates to an imaging device and an electronic device, and in particular to an imaging device and an electronic device enabling expansion of a dynamic range.

BACKGROUND ART

An imaging device including a photoelectric conversion element
(1) desirably has high sensitivity in the photoelectric conversion element in capturing an object with low illuminance, and
(2) desirably has a less easily saturated photoelectric conversion element in capturing an object with high illuminance,
in order to output a signal having a gradation property.

As an imaging device aiming at realization of the above two characteristics, providing a first photoelectric conversion element having high sensitivity and a second photoelectric conversion element having low sensitivity but capable of storing a lot of electric charges in one pixel, thereby to expand an illuminance range of an object to capture an image with a gradation property, in other words, to expand a dynamic range of the imaging device is proposed (for example, see Patent Document 1).

CITATION LIST

Patent Document

Patent Document 1: WO2015/012098

SUMMARY OF THE INVENTION

Problems to be Solved by the Invention

However, both in the first photoelectric conversion element and the second photoelectric conversion element provided in Patent Document 1, the means for storing electric charges is means for storing electric charges in a well of a potential caused in a depleted photodiode. Since the mechanism of storing electric charges is the same, amounts of electric charge that can be accumulated per unit area by charge accumulation units of the first photoelectric conversion element and the second photoelectric conversion element are substantially equal.

Therefore, it has been difficult to expand the dynamic range by increasing the amount of electric charges to be stored in the charge accumulation unit of the second photoelectric conversion element more than an area ratio between the charge accumulation unit of the first photoelectric conversion element and the charge accumulation unit of the second photoelectric conversion element.

The present technology has been made in view of the foregoing, and enables further expansion of the dynamic range.

Solutions to Problems

An imaging device of one aspect of the present technology includes a first photoelectric conversion unit, a second photoelectric conversion unit having a smaller electric charge amount to be converted per unit time than the first photoelectric conversion unit, a charge accumulation unit configured to accumulate an electric charge generated by the second photoelectric conversion unit, a charge voltage conversion unit, a first transfer gate unit configured to transfer an electric charge from the first photoelectric conversion unit to the charge voltage conversion unit, a second transfer gate unit configured to couple potentials of the charge voltage conversion unit and the charge accumulation unit, a third transfer gate unit configured to transfer an electric charge from the second photoelectric conversion unit to the charge accumulation unit, an overflow path formed under a gate electrode of the third transfer gate unit, and configured to transfer an electric charge overflowing from the second photoelectric conversion unit to the charge accumulation unit, and a light reducing unit configured to reduce light to enter the second photoelectric conversion unit.

An electronic device of one aspect of the present technology includes an imaging device including a first photoelectric conversion unit, a second photoelectric conversion unit having a smaller electric charge amount converted per unit time than the first photoelectric conversion unit, a charge accumulation unit configured to accumulate an electric charge generated by the second photoelectric conversion unit, a charge voltage conversion unit, a first transfer gate unit configured to transfer an electric charge from the first photoelectric conversion unit to the charge voltage conversion unit, a second transfer gate unit configured to couple potentials of the charge voltage conversion unit and the charge accumulation unit, a third transfer gate unit configured to transfer an electric charge from the second photoelectric conversion unit to the charge accumulation unit, an overflow path formed under a gate electrode of the third transfer gate unit, and configured to transfer an electric charge overflowing from the second photoelectric conversion unit to the charge accumulation unit, and a light reducing unit configured to reduce light entering the second photoelectric conversion unit.

In the imaging device of one aspect of the present technology, the first photoelectric conversion unit, the second photoelectric conversion unit having a smaller charge amount to be converted per unit time than the first photoelectric conversion unit, the charge accumulation unit configured to accumulate an electric charge generated by the second photoelectric conversion unit, the charge voltage conversion unit, the first transfer gate unit configured to transfer an electric charge from the first photoelectric conversion unit to the charge voltage conversion unit, the second transfer gate unit configured to couple potentials of the charge voltage conversion unit and the charge accumulation unit, the third transfer gate unit configured to transfer an electric charge from the second photoelectric conversion unit to the charge accumulation unit, the overflow path formed under a gate electrode of the third transfer gate unit, and configured to transfer an electric charge overflowing from the second photoelectric conversion unit to the charge accumulation unit, and the light reducing unit configured to reduce light to enter the second photoelectric conversion unit are provided.

The electronic device of one aspect of the present technology includes the imaging device.

Effects of the Invention

According to one aspect of present technology, a dynamic range can be further expanded.

Note that the effects described here are not necessarily limited and may be any of the effects described in the present disclosure.

BRIEF DESCRIPTION OF DRAWINGS

FIG. 5 is a diagram for describing a planar layout regarding arrangement of transistors and the like.

FIG. 12 is a diagram for describing a planar layout regarding arrangement of transistors and the like.

FIGS. 35A, 35B, and 35C are diagrams for describing color arrangement of a color filter.

MODE FOR CARRYING OUT THE INVENTION

Hereinafter, modes for implementing the present technology (hereinafter referred to as embodiments) will be described. Note that the description will be given in the following order.

1. Imaging Device to Which Present Technology is Applied
2. First Embodiment
3. Modifications of First Embodiment
4. Second Embodiment
5. Modification of Second Embodiment
6. Arrangement Position of Light Reducing Filter
7. Third Embodiment
8. Fourth Embodiment
9. Color Arrangement of Color Filter
10. Use Example of Imaging Device Imaging Device to which Present Technology is Applied {Basic System Configuration}

Figure 1:
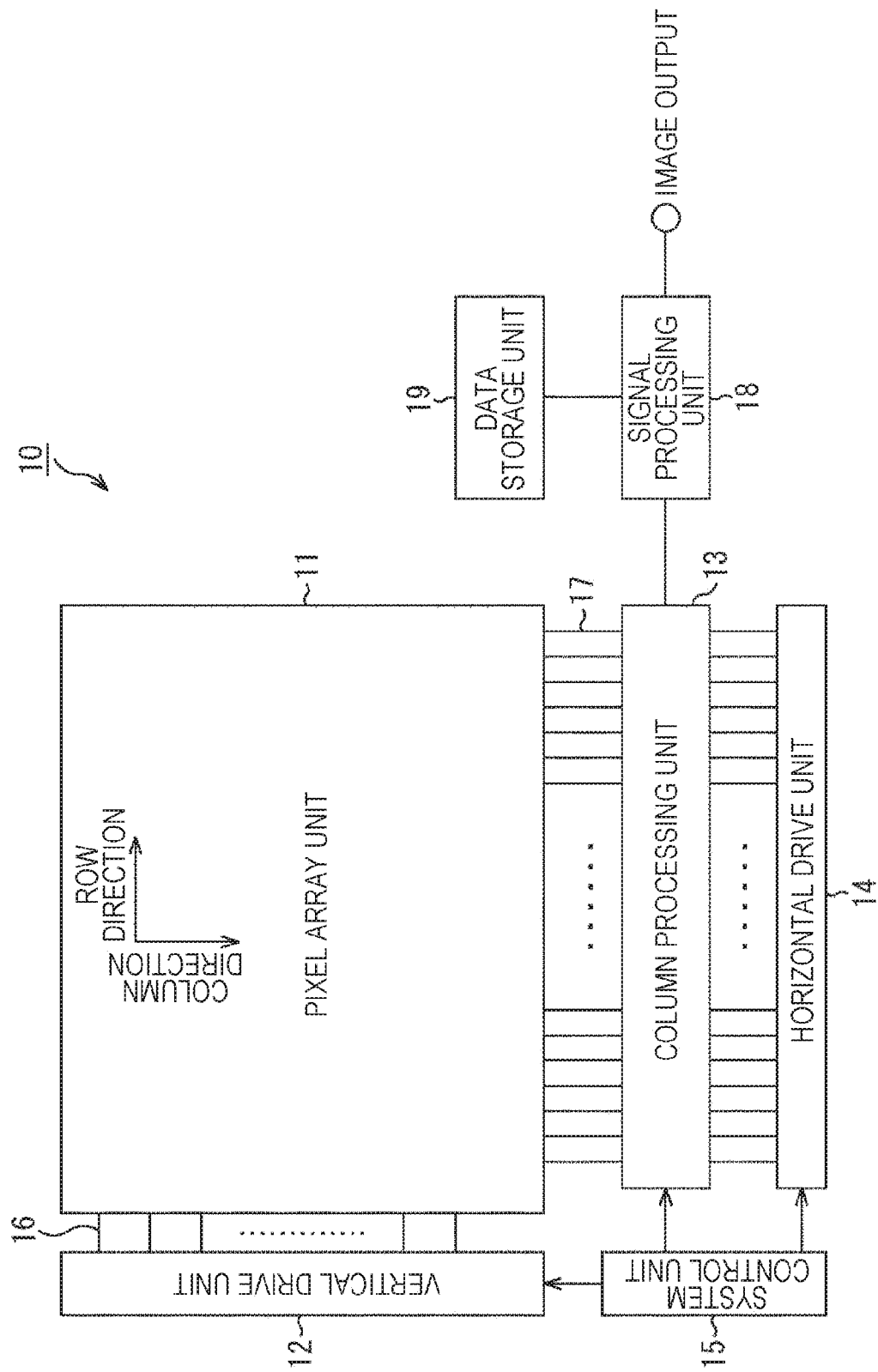
FIG. 1 is a system configuration diagram illustrating an outline of a configuration of a CMOS image sensor to which the present technology is applied.

FIG. 1 is a system configuration diagram illustrating an outline of a configuration of an imaging device to which the present technology is applied, for example, a CMOS image sensor that is one type of an X-Y address imaging device. Here, the CMOS image sensor is an image sensor created by applying or partially using a CMOS process. For example, an imaging device is configured by a backside illumination CMOS image sensor.

A CMOS image sensor 10 according to the present application example has a configuration including a pixel array unit 11 formed on a semiconductor substrate (chip) (not illustrated) and a peripheral circuit unit integrated on the same semiconductor substrate as the pixel array unit 11.

The peripheral circuit unit includes, for example, a vertical drive unit 12, a column processing unit 13, a horizontal drive unit 14, and a system control unit 15.

The CMOS image sensor 10 further includes a signal processing unit 18 and a data storage unit 19. The signal processing unit 18 and the data storage unit 19 may be mounted on the same substrate as the CMOS image sensor 10 or may be arranged on a separate substrate from the CMOS image sensor 10. Furthermore, the processing of the signal processing unit 18 and the data storage unit 19 can be performed by an external signal processing unit provided on a separate substrate from the CMOS image sensor 10, for example, by a digital signal processor (DSP) circuit or software.

The pixel array unit 11 has a configuration in which a unit pixel (hereinafter may be simply referred to as "pixel") having a photoelectric conversion unit that generates and accumulates electric charges according to a received light amount is two-dimensionally arranged in a row direction and in a column direction, in other words, in a matrix manner. Here, the row direction refers to an array direction of pixels in a pixel row (in other words, a horizontal direction), and the column direction refers to an array direction of pixels in a pixel column (in other words, a vertical direction). Details of a specific circuit configuration and a pixel structure of the unit pixel will be described below.

In the pixel array unit 11, a pixel drive line 16 is wired along the row direction for each pixel row and a vertical signal line 17 is wired along the column direction for each pixel column, with respect to the pixel array in the matrix manner. The pixel drive line 16 transmits a drive signal for driving a pixel when reading a signal from the pixel. In FIG. 1, one wire is illustrated for the pixel drive line 16, but the number of the pixel drive lines 16 is not limited to one. One end of the pixel drive line 16 is connected to an output end corresponding to each row of the vertical drive unit 12.

The vertical drive unit 12 is configured by a shift register, an address decoder, and the like, and drives all of pixels of the pixel array unit 11 at the same time, drives the pixels on a row basis, or the like. In other words, the vertical drive unit 12 constitutes a drive unit for controlling operation of the pixels of the pixel array unit 11 together with the system control unit 15 that controls the vertical drive unit 12. Although a specific configuration of the vertical drive unit 12 is not illustrated, in general, the vertical drive unit 12 has a configuration including two scanning systems of a read-out scanning system and a sweep-out scanning system.

The read-out scanning system sequentially selects and scans the unit pixels of the pixel array unit 11 on a row basis in order to read signals from the unit pixels. The signal read from the unit pixel is an analog signal. The sweep-out scanning system performs sweep-out scanning ahead of the read-out scanning by an exposure time with respect to a readout row for which the read-out scanning is to be performed by the read-out scanning system.

By the sweep-out scanning by the sweep-out scanning system, unnecessary electric charges are swept out from the photoelectric conversion unit of the unit pixel in the readout row, and the photoelectric conversion unit is reset. Then, a so-called electronic shutter operation is performed by sweeping out (resetting) unnecessary electric charges by the sweep-out scanning system. Here, the electronic shutter operation refers to an operation of discarding electric charges of the photoelectric conversion unit and starting a new exposure (starting accumulation of electric charges).

The signal read out by the read-out operation by the read-out scanning system corresponds to the light amount received on or after the immediately preceding read-out operation or the electronic shutter operation. Then, a period from read-out timing by the immediately preceding read-out operation or from sweep-out timing by the electronic shutter operation to read-out timing by the read-out operation of this time is an exposure period of electric charges in the unit pixel.

The signal output from each unit pixel in the pixel row selectively scanned by the vertical drive unit 12 is input to the column processing unit 13 through each of the vertical signal lines 17 for each pixel column. For each pixel column of the pixel array unit 11, the column processing unit 13 performs predetermined signal processing for the signal output from each pixel in the selected row through the vertical signal line 17, and temporarily stores the pixel signal after the signal processing.

Specifically, the column processing unit 13 performs at least noise removal processing, for example, correlated double sampling (CDS) processing or double data sampling (DDS) processing, as the signal processing. For example, the CDS processing removes reset noise and pixel-specific fixed pattern noise such as threshold variation of an amplifier transistor in the pixel. The column processing unit 13 can have, for example, an analog-digital (AD) conversion function, and convert an analog pixel signal into a digital signal and output the digital signal, in addition to the noise removal processing.

The horizontal drive unit 14 is configured by a shift register, an address decoder, and the like, and sequentially selects a unit circuit corresponding to the pixel column of the column processing unit 13. By the selective scanning by the horizontal drive unit 14, pixel signals processed in the column processing unit 13 for each unit circuit are sequentially output.

The system control unit 15 is configured by a timing generator that generates various timing signals, and the like, and drives and controls the vertical drive unit 12, the column processing unit 13, the horizontal drive unit 14, and the like, on the basis of various types of timing generated by the timing generator.

The signal processing unit 18 has at least an arithmetic processing function and performs various types of signal processing such as arithmetic processing for the pixel signal output from the column processing unit 13. The data storage unit 19 temporarily stores data necessary for the signal processing in the signal processing unit 18.

{Another System Configuration}

The CMOS image sensor 10 to which the present technology is applied is not limited to the one having the above-described system configuration. As another system configuration, the following system configurations can be cited.

Figure 2:
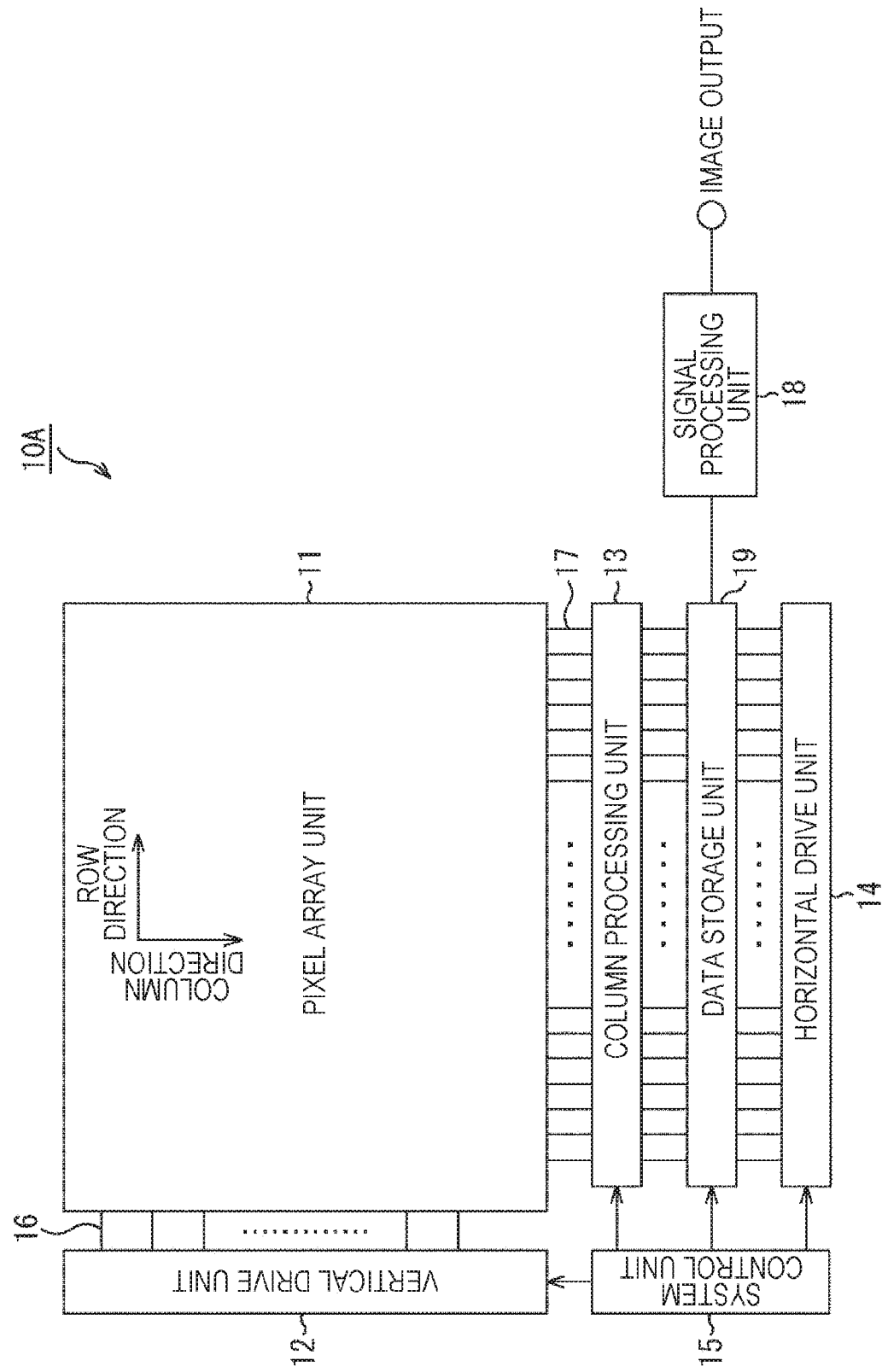
FIG. 2 is a system configuration diagram (part 1) illustrating another system configuration of the CMOS image sensor to which the present technology is applied.

For example, as illustrated in FIG. 2, a CMOS image sensor 10A can be cited, which has a system configuration in which the data storage unit 19 is arranged at a rear stage of the column processing unit 13, and the pixel signal output from the column processing unit 13 is supplied to the signal processing unit 18 via the data storage unit 19.

Figure 3:
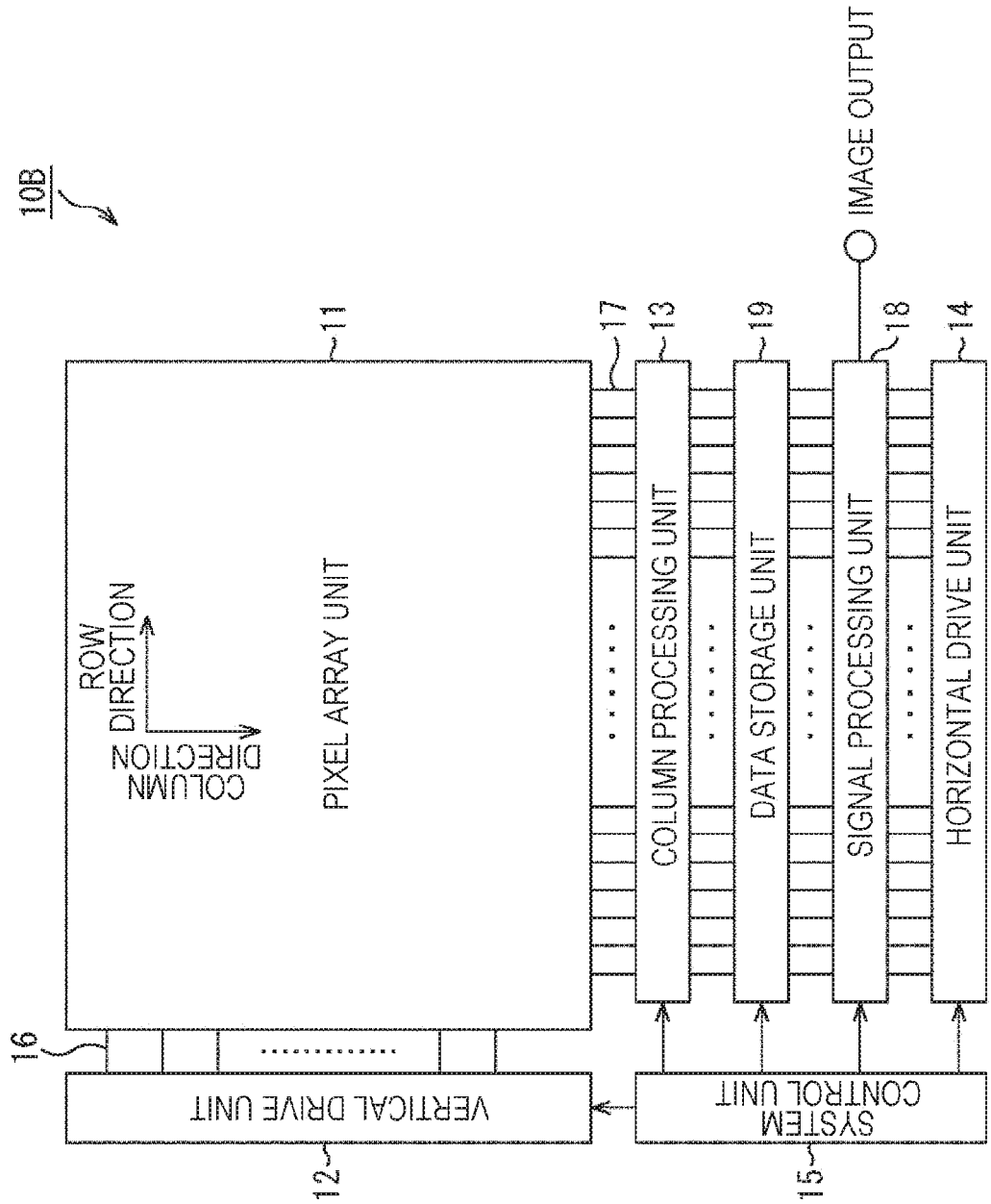
FIG. 3 is a system configuration diagram (part 2) illustrating another system configuration of the CMOS image sensor to which present technology is applied.

Further, as illustrated in FIG. 3, a CMOS image sensor 10B can be cited, which has a system configuration in which the column processing unit 13 has an AD conversion function for performing AD conversion for each column of the pixel array unit 11 or for each plurality of columns, and the data storage unit 19 and the signal processing unit 18 are provided in parallel to the column processing unit 13.

First Embodiment

A first embodiment to which present technology is applied will be described with reference to FIGS. 4 to 11.

{Circuit Configuration of Unit Pixel}

Figure 4:
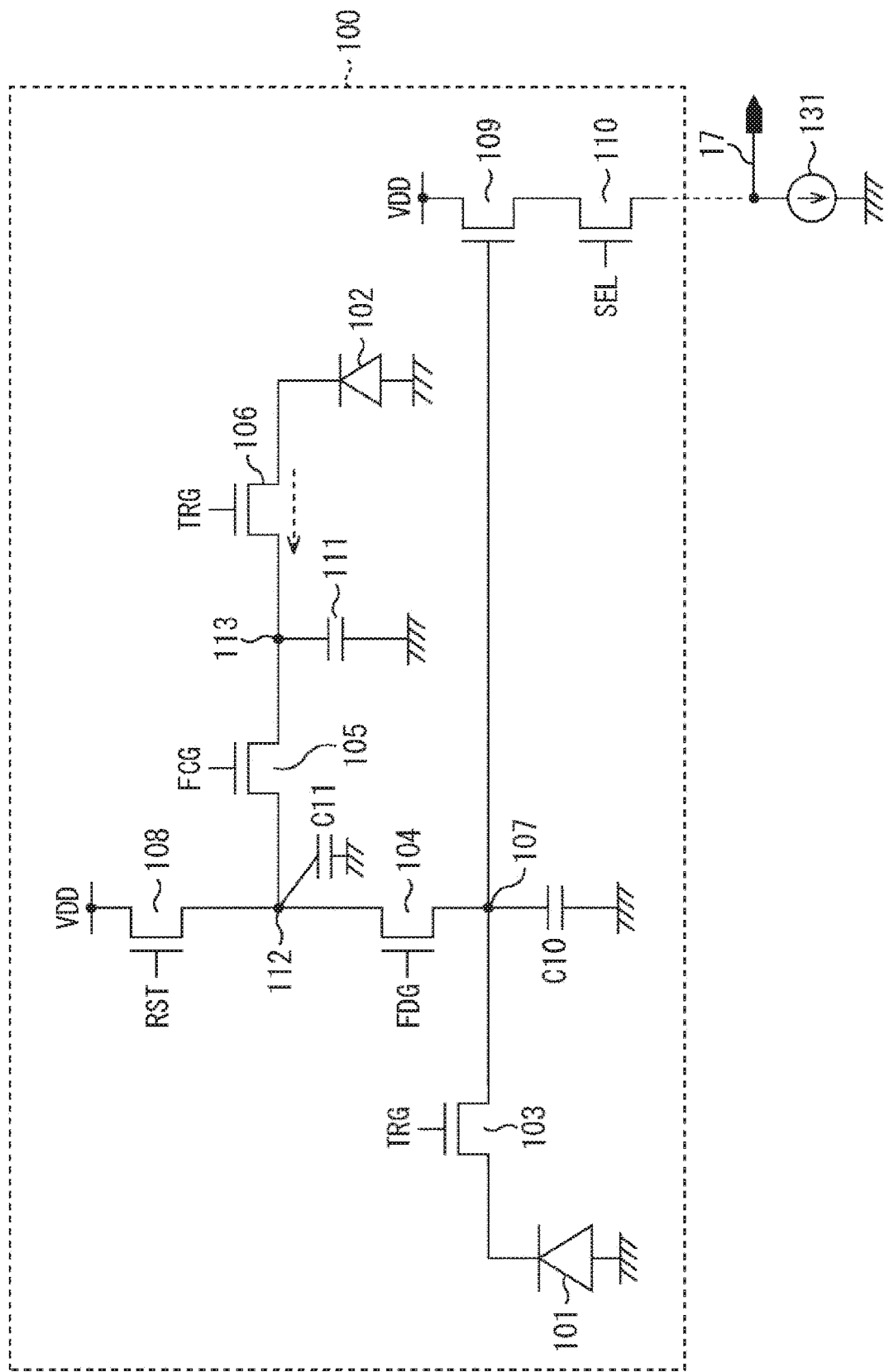
FIG. 4 is a circuit diagram of a unit pixel.

FIG. 4 is a circuit diagram illustrating a configuration example of a unit pixel 100 arranged in the pixel array unit 11 in FIGS. 1 to 3.

The unit pixel 100 includes a first photoelectric conversion unit 101, a second photoelectric conversion unit 102, a first transfer transistor 103, a second transfer transistor 104, a third transfer transistor 105, a fourth transfer transistor 106, a floating diffusion (FD) portion 107, a reset transistor 108, an amplifier transistor 109, and a selection transistor 110.

The reset transistor 108 and the amplifier transistor 109 are connected to a power supply VDD. The first photoelectric conversion unit 101 includes a so-called embedded photodiode in which an n-type impurity region is formed inside a p-type impurity region formed in a silicon semiconductor substrate. Similarly, the second photoelectric conversion unit 102 includes an embedded photodiode. The first photoelectric conversion unit 101 and the second photoelectric conversion unit 102 generate electric charges corresponding to a received light amount and accumulate the generated charges up to a certain amount.

The unit pixel 100 further includes a charge accumulation unit 111. The charge accumulation unit 111 is, for example, a MOS capacitor or a MIS capacitor.

In FIG. 4, the first transfer transistor 103, the second transfer transistor 104, the third transfer transistor 105, and the fourth transfer transistor 106 are connected in series between the first photoelectric conversion unit 101 and the second photoelectric conversion unit 102. A floating diffusion layer connected between the first transfer transistor 103 and the second transfer transistor 104 serves as the FD portion 107. The FD portion 107 has a parasitic capacitance C10.

A floating diffusion layer connected between the second transfer transistor 104 and the third transfer transistor 105 serves as a node 112. The node 112 has a parasitic capacitance C11. A floating diffusion layer connected between the third transfer transistor 105 and the fourth transfer transistor 106 serves as a node 113. The charge accumulation unit 111 is connected to the node 113.

A plurality of drive lines is wired, for example, in each pixel row in the unit pixel 100, as the pixel drive lines 16 in FIGS. 1 to 3. Then, various drive signals TGL, FDG, FCG, TGS, RST and SEL are supplied from the vertical drive unit 12 in FIGS. 1 to 3 via the plurality of drive lines. Since the transistors of the unit pixel 100 are NMOS transistors, these drive signals are pulse signals in which a high level state (for example, a power supply voltage VDD) becomes an active state, and a low level state (for example, a negative potential) becomes an inactive state.

The drive signal TGL is applied to a gate electrode of the first transfer transistor 103. When the drive signal TGL becomes the active state, the first transfer transistor 103 becomes a conductive state, and the electric charge accumulated in the first photoelectric conversion unit 101 is transferred to the FD portion 107 via the first transfer transistor 103.

The drive signal FDG is applied to a gate electrode of the second transfer transistor 104. When the drive signal FDG becomes the active state and the second transfer transistor 104 becomes the conductive state, potentials of the FD portion 107 and of the node 112 are coupled to form one charge accumulation region.

The drive signal FCG is applied to a gate electrode of the third transfer transistor 105. When the drive signal FDG and the drive signal FCG become the active state and the second transfer transistor 104 and the third transfer transistor 105 becomes the conductive state, potentials from the FD portion 107 to the charge accumulation unit 111 are coupled to form one charge accumulation region.

The drive signal TGS is applied to a gate electrode of the fourth transfer transistor 106. When the drive signal TGS becomes the active state, the fourth transfer transistor 106 becomes the conductive state, and the electric charge accumulated in the second photoelectric conversion unit 102 is transferred to the charge accumulation unit 111 via the fourth transfer transistor 106. In a case where the fourth transfer transistor 106, the third transfer transistor 105, and the second transfer transistor 104 are the active state, the potentials from the charge accumulation unit 111 to the FD portion 107 are coupled, and the electric charge accumulated in the second photoelectric conversion unit 102 is transferred to the coupled charge accumulation region.

Moreover, a channel region under the gate electrode of the fourth transfer transistor 106 has a potential in a slightly more positive direction (in other words, slightly deeper) than a channel region under the gate electrode of the first transfer transistor 103, the second transfer transistor 104, or the third transfer transistor 105, for example, and as a result, an overflow path of changes is formed. In a case where an electric charge exceeding a saturation charge amount of the second photoelectric conversion unit 102 is generated as a result of the photoelectric conversion in the second photoelectric conversion unit 102, the electric charge exceeding the saturation charge amount overflows from the second photoelectric conversion unit 102 to the charge accumulation unit 111 via the overflow path. The overflowing charges are accumulated in the charge accumulation unit 111.

Note that the overflow path formed in the channel region under the gate electrode of the fourth transfer transistor 106 is hereinafter simply referred to as an overflow path of the fourth transfer transistor 106.

In FIG. 4, a first electrode, of two electrodes included in the charge accumulation unit 111, is a node electrode connected to the node 113 between the third transfer transistor 105 and the fourth transfer transistor 106. A second electrode, of the two electrodes included in the charge accumulation unit 111, is a grounded ground electrode.

Note that the second electrode may be connected to a specific potential other than a ground potential, for example, a power supply potential, as a modification.

In a case where the charge accumulation unit 111 is a MOS capacitor or MIS capacitor, for example, the second electrode is an impurity region formed in the silicon substrate, the dielectric film forming the capacitance is an oxide film or a nitride film formed on the silicon substrate. The first electrode is an electrode formed by a material having conductivity, for example, polysilicon or metal above the second electrode and the dielectric film.

In a case where the second electrode is set to the ground potential, the second electrode may be a p-type impurity region electrically connected to the p-type impurity region provided in the first photoelectric conversion unit 101 or the second photoelectric conversion unit 102. In a case where the second electrode is set to a specific potential other than the ground potential, the second electrode may be an n-type impurity region formed in the p-type impurity region.

The reset transistor 108 is also connected to the node 112, in addition to the second transfer transistor 104. A specific potential, for example, the power supply VDD is connected to an end of the reset transistor. The drive signal RST is applied to a gate electrode of the reset transistor 108. When the drive signal RST becomes the active state, the reset transistor 108 becomes the conductive state, and the potential of the node 112 is reset to the level of the voltage VDD.

When the drive signal FDG of the second transfer transistor 104 and the drive signal FCG of the third transfer transistor 105 are made to be in the active state in setting the drive signal RST to the active state, the coupled potential of the node 112, the FD portion 107, and the charge accumulation unit 111 is reset to the level of the voltage VDD.

Note that, it is needless to say that the potentials of the FD portion 107 and the charge accumulation unit 111 can be individually (independently) reset to the level of the voltage VDD by separately controlling the drive signal FDG and the drive signal FCG.

The FD portion 107 which is a floating diffusion layer is charge-voltage conversion means. In other words, when charges are transferred to the FD portion 107, the potential of the FD portion 107 changes in accordance with the amount of transferred electric charges.

The amplifier transistor 109 has a source side connected to a current source 131 connected to one end of the vertical signal line 17 and has a drain side connected to the power supply VDD, and constitutes a source follower circuit together with the current source 131 and the power supply VDD. The FD portion 107 is connected to a gate electrode of the amplifier transistor 109, and this serves as an input to the source follower circuit.

The selection transistor 110 is connected between a source of the amplifier transistor 109 and the vertical signal line 17. The drive signal SEL is applied to a gate electrode of the selection transistor 110. When the drive signal SEL becomes the active state, the selection transistor 110 becomes the conductive state, and the unit pixel 100 becomes a selected state.

When electric charges are transferred to the FD portion 107, the potential of the FD portion 107 becomes a potential corresponding to the amount of transferred electric charges, and the potential is input to the above-described source follower circuit. When the drive signal SEL becomes the active state, the potential of the FD portion 107 corresponding to the amount of the electric charges is output to the vertical signal line 17 via the selection transistor 110 as an output of the source follower circuit.

The first photoelectric conversion unit 101 has a larger light receiving area of the photodiode than the second photoelectric conversion unit 102. Therefore, in a case where an object with certain illuminance is captured with a certain exposure time, the electric charge generated in the first photoelectric conversion unit 101 is larger than the electric charge generated in the second photoelectric conversion unit 102.

Therefore, when the electric charge generated in the first photoelectric conversion unit 101 and the electric charge generated in the second photoelectric conversion unit 102 are transferred to the FD portion 107 and are respectively converted into voltages, voltage change before and after transferring the electric charge generated in the first photoelectric conversion unit 101 to the FD portion 107 is larger than voltage change before and after transferring the electric charge generated in the second photoelectric conversion unit 102 to the FD portion 107. Accordingly, when making a comparison between the first photoelectric conversion unit 101 and the second photoelectric conversion unit 102, the first photoelectric conversion unit 101 has higher sensitivity than the second photoelectric conversion unit 102.

In contrast, the second photoelectric conversion unit 102 can accumulate the electric charge generated exceeding the saturation charge amount to the charge accumulation unit 111 even in a case where light with high illuminance enters and the electric charge exceeding the saturation charge amount of the second photoelectric conversion unit 102 is generated. Therefore, when charge-voltage conversion is performed for the electric charge caused in the second photoelectric conversion unit 102, the charge-voltage conversion can be performed after adding both the charge accumulated in the second photoelectric conversion unit 102 and the charge accumulated in the charge accumulation unit 111.

With the characteristic, the second photoelectric conversion unit 102 can capture an image having a gradation property over a wide illuminance range, in other words, can capture an image with a wide dynamic range, than the first photoelectric conversion unit 101.

Two images of an image with high sensitivity captured using the first photoelectric conversion unit 101 and an image with a wide dynamic range captured using the second photoelectric conversion unit 102 are, for example, synthesized into one image through wide dynamic range image synthesis processing of synthesizing one image from two images, in an image signal processing circuit included inside the CMOS image sensor 10 or an image signal processing device externally connected to the CMOS image sensor 10.

{Planar Layout of Unit Pixel}

FIGS. 5 to 9 are planar layout diagrams illustrating an embodiment of the unit pixel 100 illustrated in FIG. 4. FIGS. 5 to 9 illustrate a structure of a case where the unit pixel 100 is a so-called backside illumination imaging device, as an example.

Figure 5:
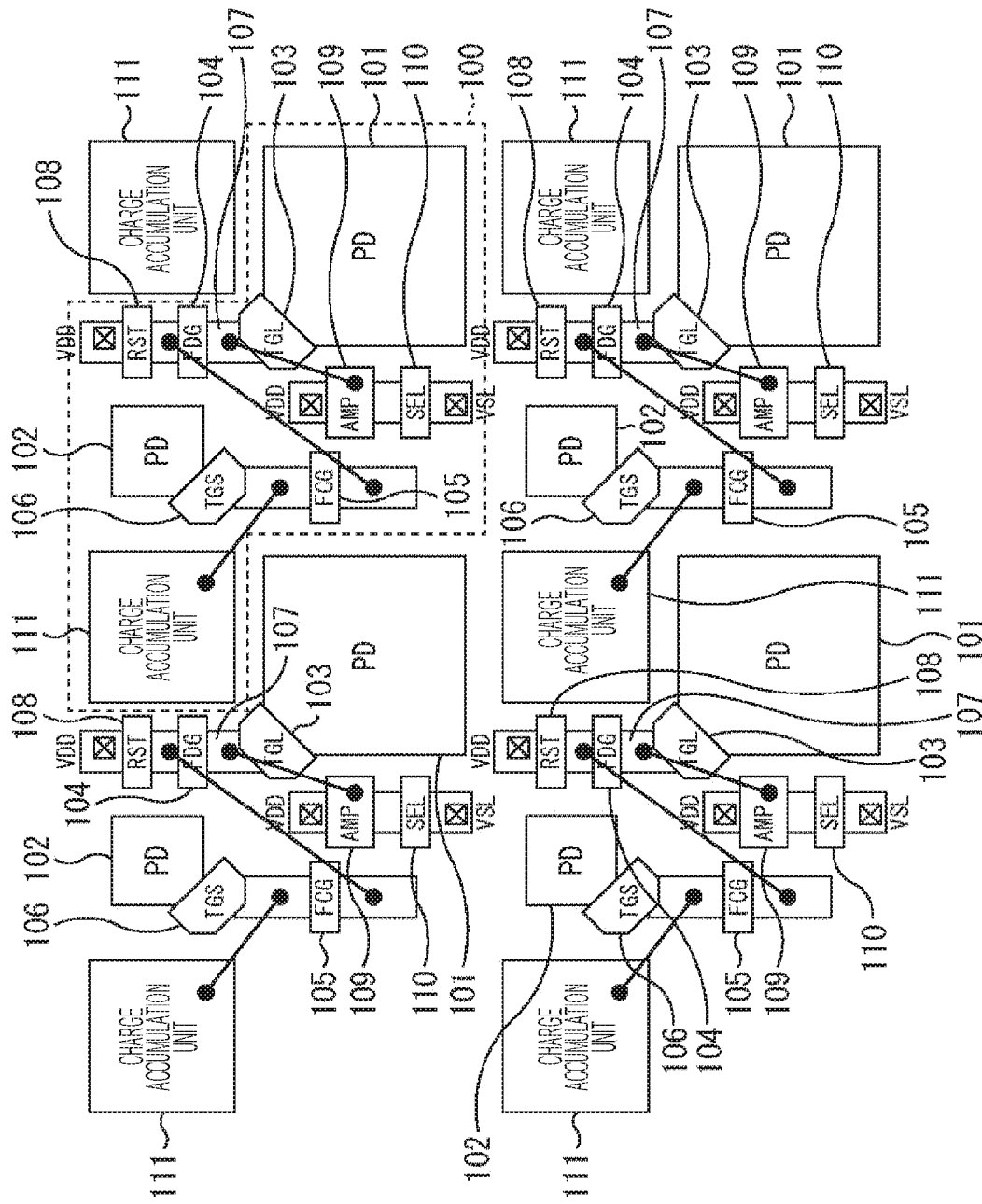

In the backside illumination imaging device, the silicon substrate on which the first photoelectric conversion unit 101 and the second photoelectric conversion unit 102 are formed has a first surface serving as a light incidence surface to a photodiode, and a second surface facing the first surface. FIG. 5 is a planar layout diagram on the second surface of the silicon substrate related to the unit pixel 100, and is a planar layout diagram of active regions, the photoelectric conversion units, the pixel transistors, the charge accumulation unit, and wiring connecting the aforementioned elements included in the unit pixel 100.

In FIG. 5, the first photoelectric conversion unit 101, the first transfer transistor 103, the FD portion 107, the second transfer transistor 104, a part of the node 112, the reset transistor 108, and a connection portion to the power supply VDD are formed on a continuous first active region.

Aside from the above, the second photoelectric conversion unit 102, the fourth transfer transistor 106, the node 113, the third transfer transistor 105, and the other part of the node 112 are formed on a continuous second active region.

Aside from the above, a connection portion to the vertical signal line 17, the selection transistor 110, the amplifier transistor 109, and a connection portion to the power supply VDD are formed on a continuous third active region.

Moreover, the charge accumulation unit 111 is formed on a fourth active region (not illustrated) different from the active regions. A dielectric film is arranged on the fourth active region in which an impurity region serving as a lower electrode of the charge accumulation unit 111 is formed, and an upper electrode is arranged on the dielectric film. Therefore, only the upper electrode can be seen in FIG. 5. The fourth active region in which the lower electrode is formed is arranged under the upper electrode.

In FIG. 5, the FD portion 107 and the gate electrode of the amplifier transistor 109 are connected by wiring arranged above the gate electrode. Furthermore, the part of the node 112 formed in the first active region and the other part of the node 112 formed in the second active region are also connected by wiring arranged above the gate electrodes illustrated in FIG. 5.

Moreover, the node 113 and the upper electrode of the charge accumulation unit of the charge accumulation unit 111 are also connected by wiring arranged above the gate electrodes illustrated in FIG. 5 and the upper electrode of the charge accumulation unit 111.

The region surrounded by the dotted line illustrated in FIG. 5 is the region of one pixel of the unit pixel 100 illustrated in FIG. 4.

Figure 6:
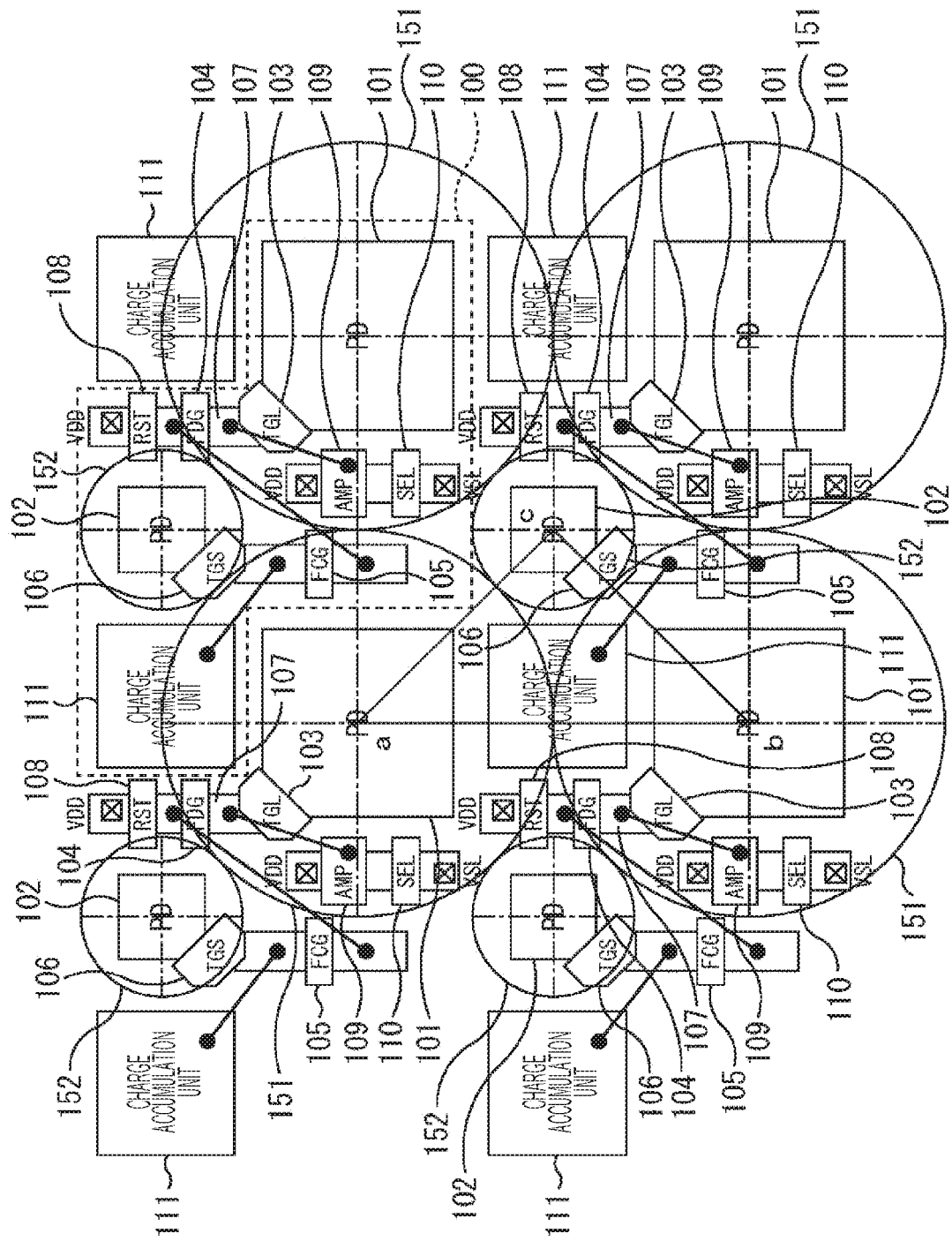
FIG. 6 is a diagram for describing a size of an on-chip lens.

FIG. 6 is a planar layout diagram related to the unit pixel 100, and is a diagram in which the planar layout diagram on the second surface and the planar layout diagram on the first surface, of the silicon substrate, are superimposed and illustrated. FIG. 6 illustrates a planar layout of the active regions, the photoelectric conversion units, the pixel transistors, the charge accumulation unit, and the wiring connecting the aforementioned elements arranged on the second surface, and of the photoelectric conversion units and on-chip lenses arranged on the first surface.

The region surrounded by the dotted line illustrated in FIG. 6 is the region of one pixel of the unit pixel 100 illustrated in FIG. 4.

In FIG. 6, the first photoelectric conversion unit 101 and the second photoelectric conversion unit 102 are arranged at the same positions on the second surface and on the first surface.

A first on-chip lens 151 that condenses light to enter the first photoelectric conversion unit 101 is arranged to cover the first photoelectric conversion unit 101. Similarly, a second on-chip lens 152 that condenses light to enter the second photoelectric conversion unit 102 is arranged to cover the second photoelectric conversion unit 102.

How large the first on-chip lens 151 and the second on-chip lens 152 are made can be set according to factors of pixel design, such as what range of light is condensed and made incident on the photoelectric conversion unit on the first surface, or how large the photoelectric conversion units, the pixel transistors, and the charge accumulation unit are thereby how large one pixel is and how large a pixel pitch is in a case where pixels are arranged in an array manner on the second surface.

For example, in a case where the on-chip lens is too large on the first surface, the resolution of the imaging device is lowered and an unnecessary region where no constituent elements of the unit pixel are arranged is generated on the second surface. On the other hand, in a case where the on-chip lens is too small on the first surface, the light to enter the photoelectric conversion unit is decreased, resulting in an imaging device with poor sensitivity. Therefore, the size of the on-chip lens on the first surface and the size of each constituent element of the unit pixel on the second surface are favorably appropriately designed to obtain high sensitivity and resolution without waste.

The planar layout illustrated in FIG. 6 is a diagram of a case in which the diameter of the first on-chip lens 151 can be made equal to the pixel pitch, and a total of four first on-chip lenses 151 are arrayed where two are arranged right and left and two are arranged up and down, and the diameter of the second on-chip lens 152 is designed to be accommodated in a central portion of the first on-chip lenses 151, where no first on-chip lens 151 is arranged, as a result of the pixel design.

In this case, a distance ab between a center a of the first on-chip lens 151 provided in a certain first pixel and a center b of the first on-chip lens 151 provided in a second pixel adjacent to the first pixel, a distance ac between the center a of the first on-chip lens 151 provided in the first pixel and a center c of the second on-chip lens 152 provided in a third pixel, a distance bc between the center b of the first on-chip lens 151 provided in the second pixel and the center c of the second on-chip lens 152 provided in the third pixel, a radius r1 of the first on-chip lens 151 provided in each pixel, and a radius r2 of the second on-chip lens 152 provided in each pixel have the following relationship.

$$\text{The distance } ab = r1 \times 2 \quad (1)$$

$$\text{The distance } ac = \text{the distance } bc = \text{the distance } ab \times \sqrt{2}/2 \quad (2)$$

$$r2 \leq r1 \times (\sqrt{2}-1) \quad (3)$$

According to the expression (1), the distance ab is twice the radius r1 of the first on-chip lens 151, and the distance ab is equal to the diameter of the first on-chip lens 151. Furthermore, according to the expression (2), the distance ac and the distance bc are the same distance, and are a value obtained by multiplying the distance ab by the square root of 2 and dividing the product by 2. In other words, the distance ac (distance bc) is a value obtained by multiplying the radius r1 of the first on-chip lens 151 by the square root of 2. According to the expression (3), the radius r2 of the second on-chip lens 152 can be derived from the expressions (1) and (2) and is equal to or less than a value obtained by subtracting 1 from the square root of 2 and multiplying the difference by the radius r1.

Figure 7:
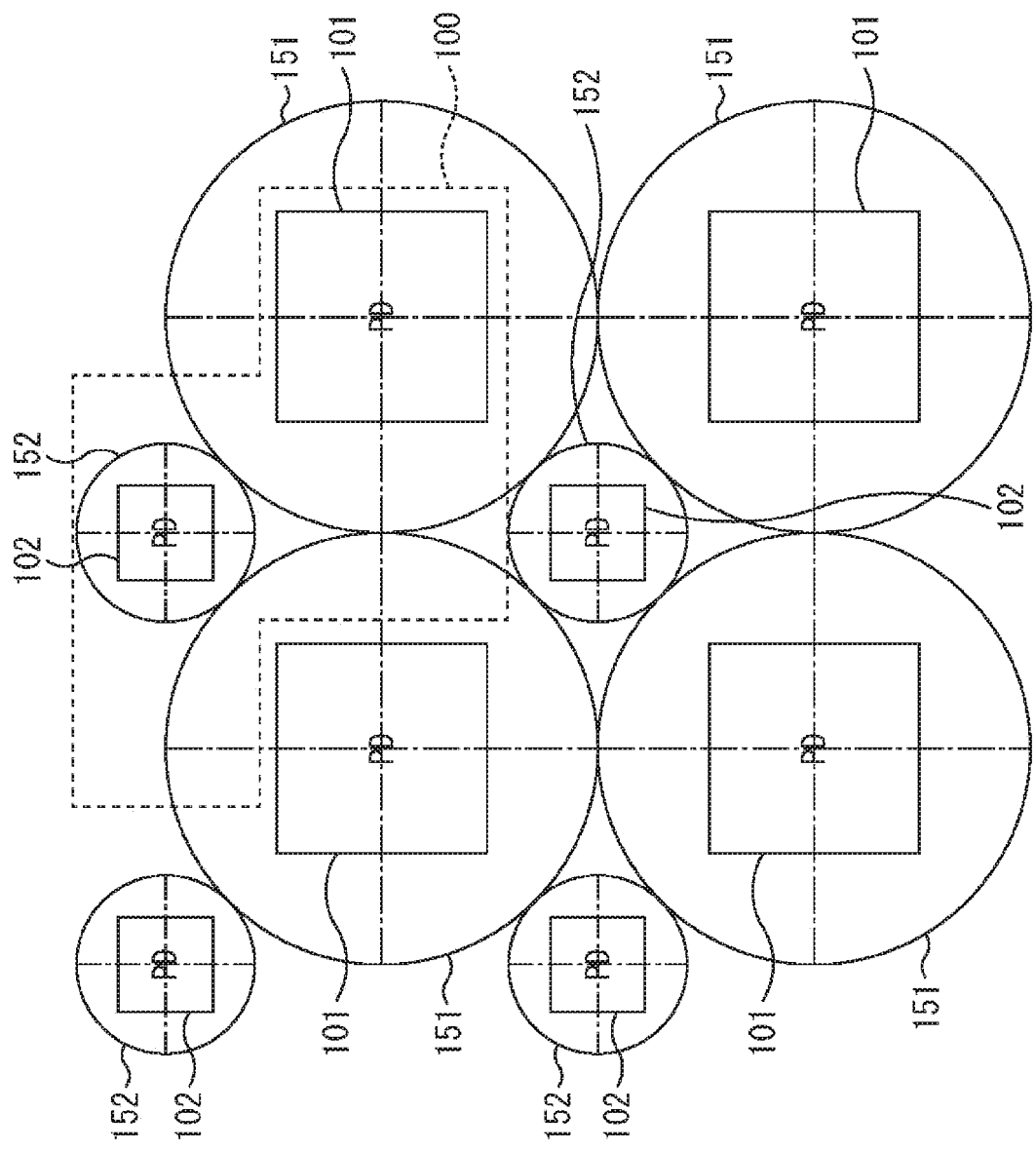
FIG. 7 is a diagram for describing a planar layout of the on-chip lens.

FIG. 7 is a planar layout diagram related to the unit pixel 100, and illustrates the planar layout of the first photoelectric conversion unit 101, the second photoelectric conversion unit 102, the first on-chip lens 151, and the second on-chip lens 152, on the first surface, which is extracted from FIG. 6. The region surrounded by the dotted line illustrated in FIG. 7 is the region of one pixel of the unit pixel 100 illustrated in FIG. 4.

In FIG. 7, similarly to FIG. 6, the diameter of the first on-chip lens 151 is made equal to the pixel pitch, and a total of four first on-chip lenses 151 are arrayed where two are arranged right and left and two are arranged up and down, and the diameter of the second on-chip lens 152 is designed to be accommodated in the central portion of the first on-chip lenses 151, where no first on-chip lens 151 is arranged.

Figure 8:
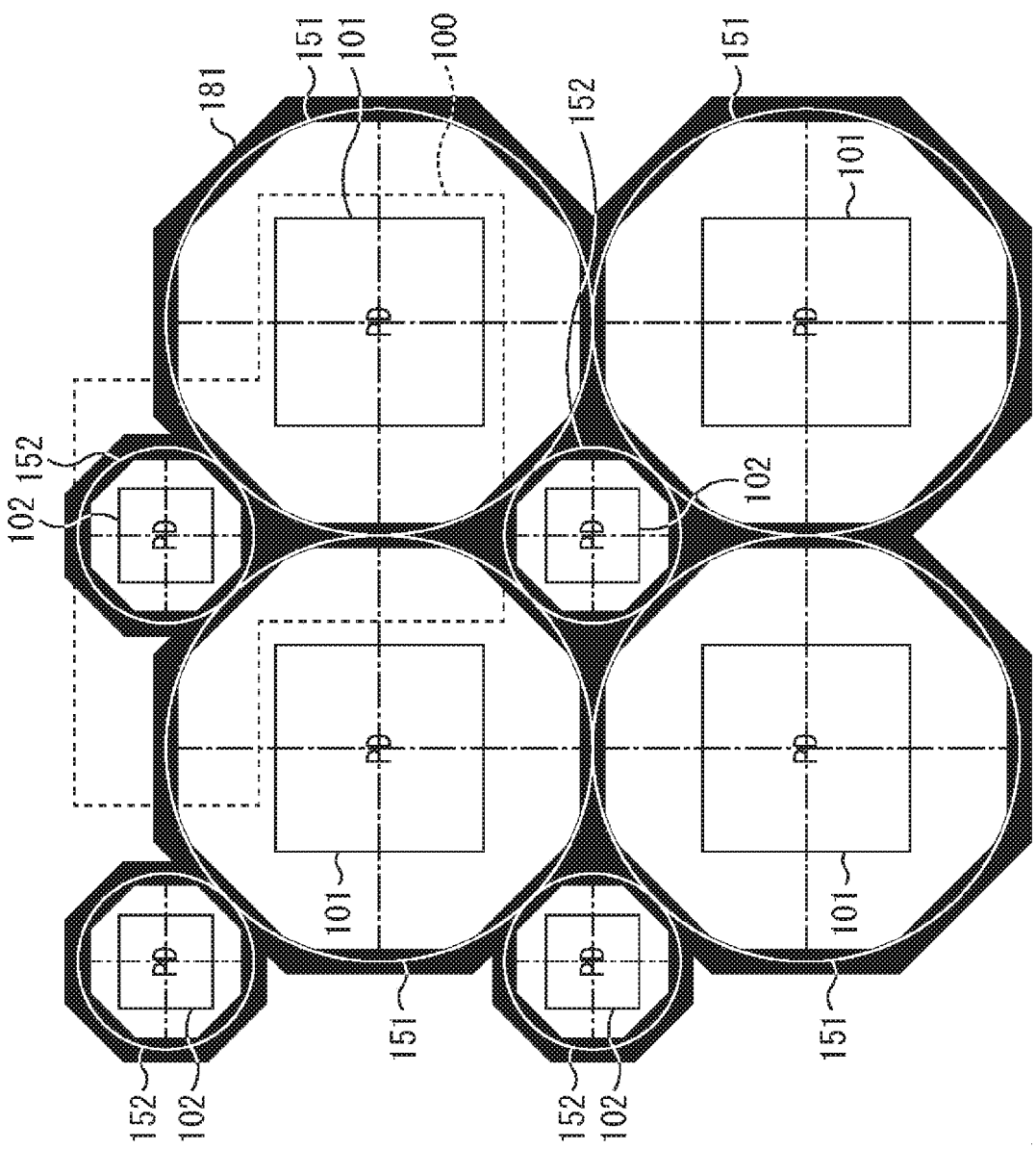
FIG. 8 is a diagram for describing a planar layout of an inter-pixel light shielding unit.

FIG. 8 is a planar layout diagram related to the unit pixel 100, and illustrates a planar layout of an inter-pixel light shielding unit 181 provided between pixels, on the first surface of the unit pixel 100, in addition to the planar layout of the first photoelectric conversion unit 101, the second photoelectric conversion unit 102, the first on-chip lens 151, and the second on-chip lens 152 on the first surface illustrated in FIG. 7.

The inter-pixel light shielding unit 181 is provided to prevent leakage of light into adjacent pixels. The inter-pixel light shielding unit 181 is arranged in inward directions of the two on-chip lenses with the same width in a portion where the first on-chip lens 151 of a certain pixel and the first on-chip lens 151 of a pixel adjacent thereto come closest to each other.

Furthermore, the inter-pixel light shielding unit 181 is arranged in inward directions of the two on-chip lenses with the same width in a portion where the first on-chip lens 151 and the second on-chip lens 152 come closest to each other.

Figure 9:
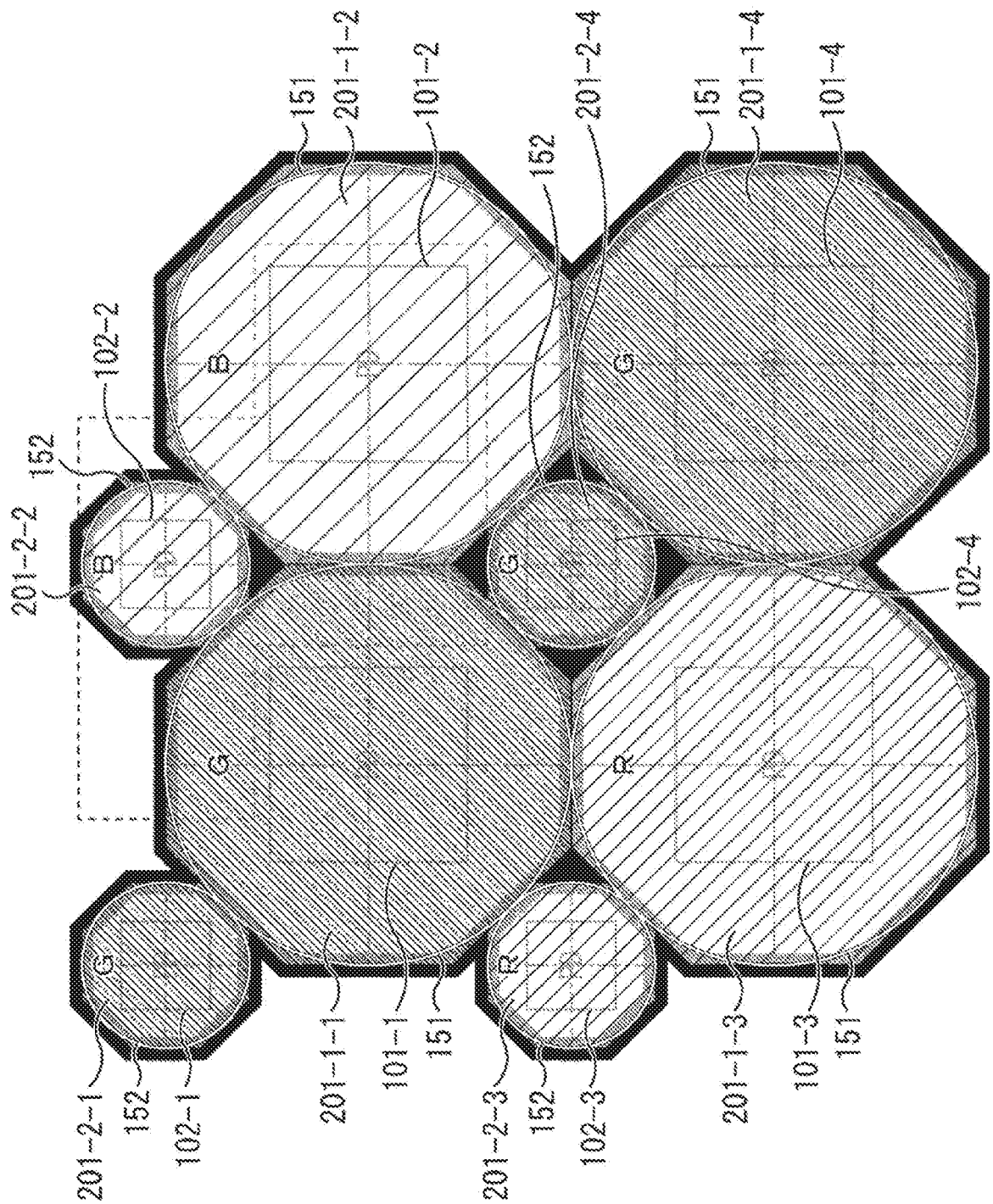
FIG. 9 is a diagram for describing a planar layout of a color filter.

FIG. 9 is a planar layout diagram related to the unit pixel 100, and illustrates a planar layout of a color filter 201 provided in each pixel, on the first surface of the unit pixel 100, in addition to the planar layout of the first photoelectric conversion unit 101, the second photoelectric conversion unit 102, the first on-chip lens 151, the second on-chip lens 152, and the inter-pixel light shielding unit 181 on the first surface illustrated in FIG. 8.

The color filter 201 is arranged under the two on-chip lenses in a portion where the first on-chip lens 151 of a certain pixel and the first on-chip lens 151 of a pixel adjacent thereto come closest to each other.

Furthermore, the color filter 201 is arranged under the two on-chip lenses in a portion where the first on-chip lens 151 and the second on-chip lens 152 come closest to each other.

The color filter 201 illustrated in FIG. 9 illustrates a case where the color filter has an RGB Bayer arrangement. For example, a green (G) color filter 201-1-1 and a green (G) color filter 201-2-1 are respectively arranged on a first photoelectric conversion unit 101-1 and a second photoelectric conversion unit 102-1 located at the upper left in FIG. 9.

Furthermore, for example, a blue (B) color filter 201-1-2 and a blue (B) color filter 201-2-2 are respectively arranged on a first photoelectric conversion unit 101-2 and a second photoelectric conversion unit 102-2 located at the upper right in FIG. 9. Furthermore, for example, a red (R) color filter 201-1-3 and a red (R) color filter 201-2-3 are respectively arranged on a first photoelectric conversion unit 101-3 and a second photoelectric conversion unit 102-3 located at the lower left in FIG. 9.

Furthermore, for example, a green (G) color filter 201-1-4 and a green (G) color filter 201-2-4 are respectively arranged on a first photoelectric conversion unit 101-4 and a second photoelectric conversion unit 102-4 located at the lower right in FIG. 9.

In this way, the color filters 201 of the same colors are arranged on the first photoelectric conversion unit 101 and the second photoelectric conversion unit 102 constituting the unit pixel 100.

{Cross Section of Unit Pixel}

Figure 10:
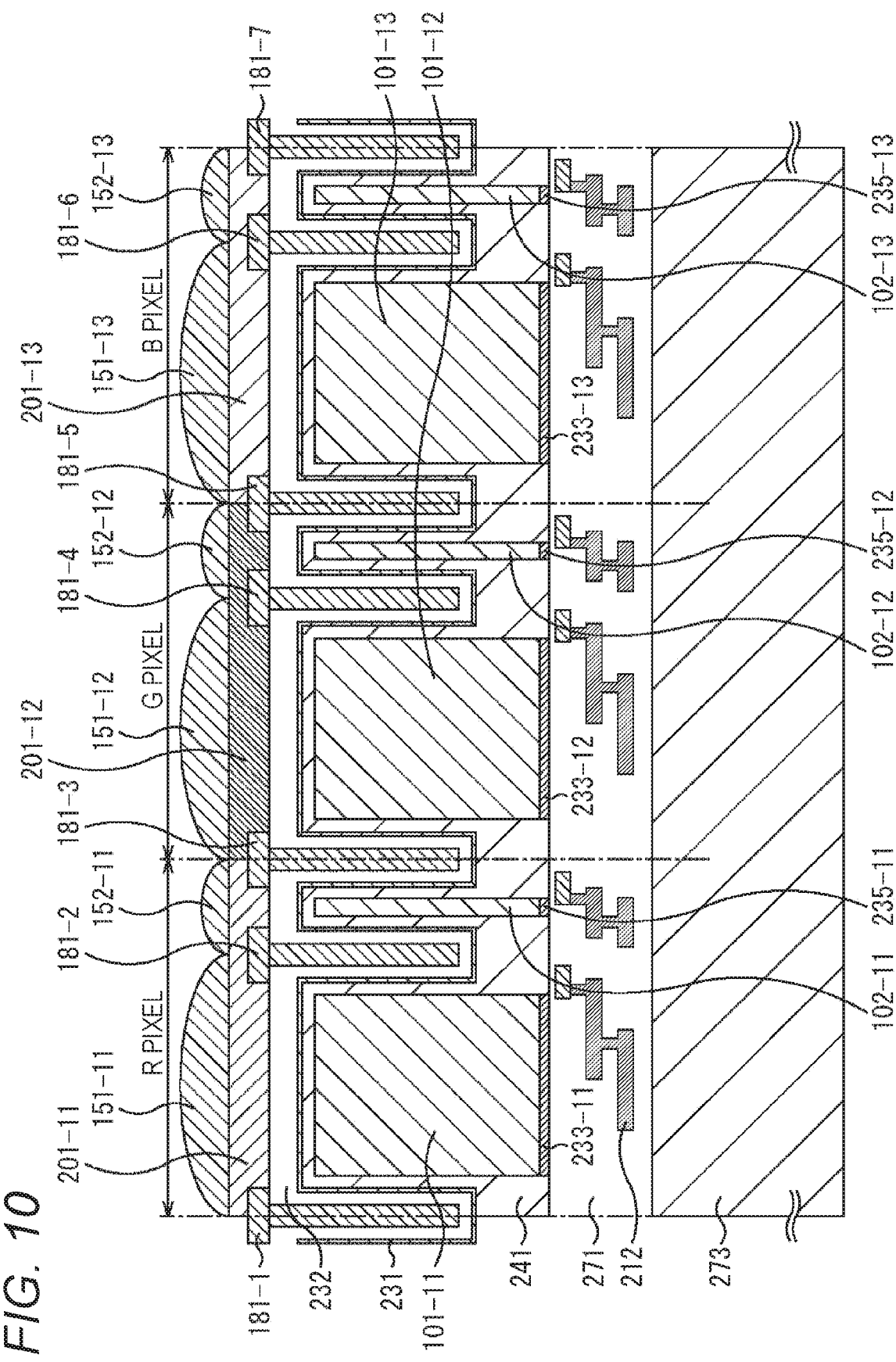
FIG. 10 is a diagram illustrating a structure of a unit pixel in a first embodiment.

FIG. 10 is a schematic diagram of a cross section related to the unit pixel 100, and schematically repeatedly illustrates a portion where the first on-chip lens 151 and the second on-chip lens 152 come closest to each other within one pixel, and a portion where the second on-chip lens 152 of a certain pixel and the first on-chip lens 151 of a pixel adjacent thereto come closest to each other in adjacent two pixels.

In FIG. 10, each pixel includes the first photoelectric conversion unit 101, the second photoelectric conversion unit 102, the first on-chip lens 151 and the second on-chip lens 152 respectively arranged on the photoelectric conversion units, the color filter 201 arranged between the photoelectric conversion unit and the on-chip lens, a film having a negative fixed charge (so-called pinning film 231) arranged between the photoelectric conversion unit and the color filter, an inter-layer insulating film 232, and the inter-pixel light shielding unit 181 arranged around the first photoelectric conversion unit 101 and the second photoelectric conversion unit 102.

FIG. 10 illustrates an example in which an R pixel, a G pixel, and a B pixel are arrayed from left in a horizontal direction. For example, refer to the G pixel located in the center. In the G pixel, a wiring layer 271 in which wiring 272 is arranged is laminated on a support substrate 273. A first photoelectric conversion unit 101-12 and a second photoelectric conversion unit 102-12 are formed on the wiring layer 271.

Each of the first photoelectric conversion unit 101-12 and the second photoelectric conversion unit 102-12 is a photodiode including a P well region 241 and an n-type impurity region formed therein. Furthermore, a P-type pinning region 233-12 is formed between the first photoelectric conversion unit 101-12 and the wiring layer 271, and a P-type pinning region 235-12 is formed between the second photoelectric conversion unit 102-12 and the wiring layer 271.

An inter-pixel light shielding unit 181-4 is formed between the first photoelectric conversion unit 101-12 and the second photoelectric conversion unit 102-12, and is configured to prevent leakage of light from the first photoelectric conversion unit 101-12 to the second photoelectric conversion unit 102-12 and leakage of light from the second photoelectric conversion unit 102-12 to the first photoelectric conversion unit 101-12.

Furthermore, an inter-pixel light shielding unit 181-3 is formed between the G pixel and the pixel adjacent to the left side (the R pixel in FIG. 10), and is configured to prevent leakage of light from the R pixel adjacent to the left side and prevent leakage of light to the R pixel adjacent to the left side.

Similarly, an inter-pixel light shielding unit 181-5 is formed between the G pixel and the pixel adjacent to the right side (the B pixel in FIG. 10), and is configured to prevent leakage of light from the B pixel adjacent to the right side and leakage of light to the B pixel adjacent to the right side.

A method of manufacturing a pixel having such a configuration, in particular, a method of forming the on-chip lenses 151 and 152 illustrated in FIG. 10 on the color filters 201 will be described with reference to FIG. 11.

Figure 11:
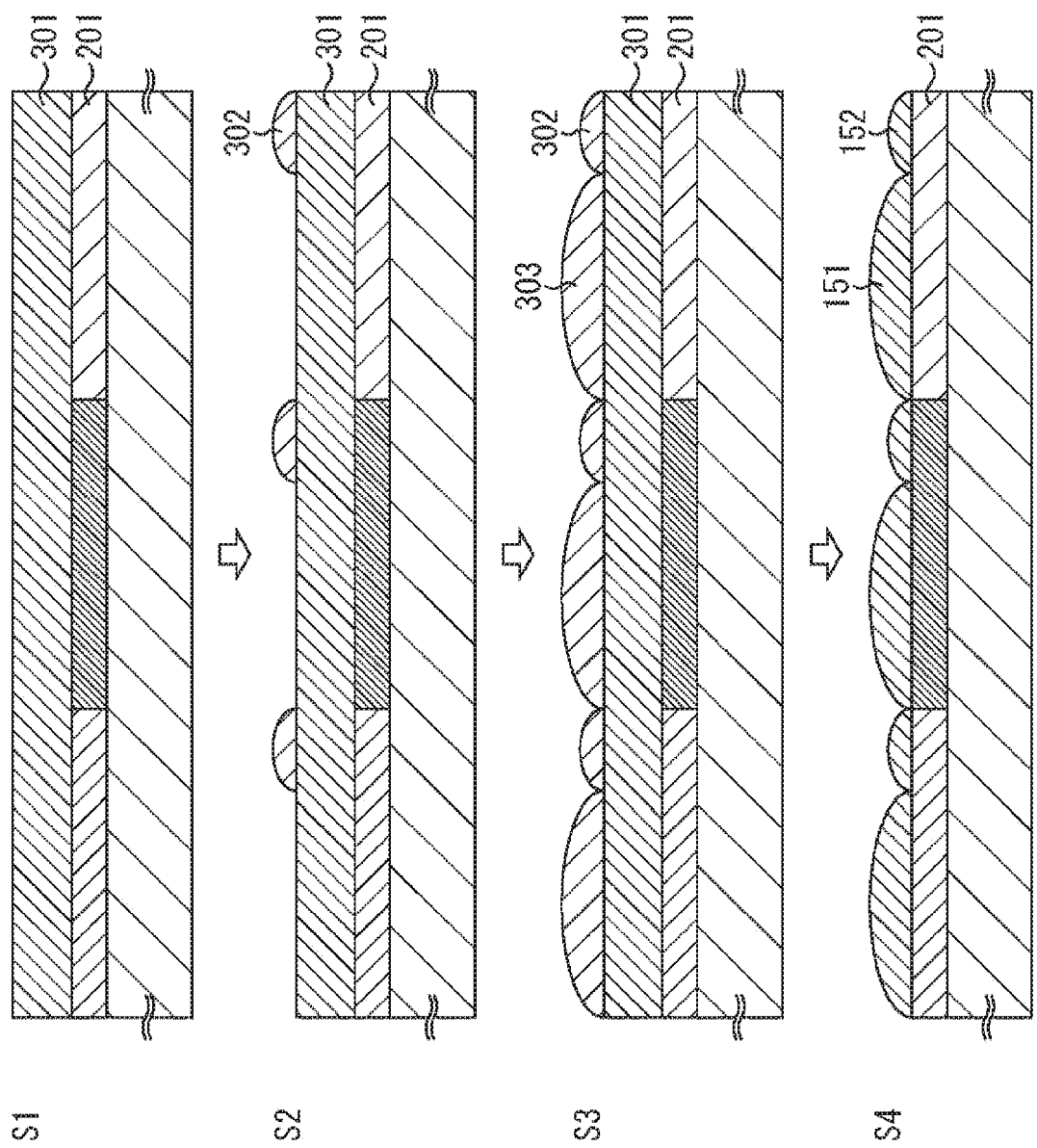
FIG. 11 is a diagram for describing manufacturing of the on-chip lens.

In step S1, a photoelectric conversion unit (photodiode), a pixel transistor, and wiring (none are illustrated in FIG. 11), and the color filter 201, which are provided in the unit pixel 100, and a peripheral circuit unit included in the CMOS image sensor 10 are formed on the semiconductor substrate, using a known manufacturing method.

A material of the on-chip lenses 151 and 152, for example, an organic material 301, such as an epoxy resin, is formed in layers on the semiconductor substrate on which the color filter 201 is formed.

In step S2, a resist pattern 302 for forming the second on-chip lens 152 is formed on the semiconductor substrate on which the organic material 301 is formed.

In step S3, a resist pattern 303 for forming the first on-chip lens 151 is formed on the semiconductor substrate on which the resist pattern 302 is formed.

In step S4, the formed resist patterns 302 and 303 and the layer of the organic material 301 that is the material of the on-chip lens are etched back over the entire surface of the semiconductor substrate on which the resist pattern 303 is formed.

The first on-chip lens 151 and the second on-chip lens 152 are formed in each pixel by the manufacturing method.

The CMOS image sensor 10 provided with the unit pixel 100 formed using the structure and manufacturing method described with reference to FIGS. 4 to 11 captures an image with high sensitivity using the first photoelectric conversion unit 101, and captures an image with a wide dynamic range using the second photoelectric conversion unit 102.

These two images are synthesized into an image through image signal processing in the image signal processing circuit provided inside the CMOS image sensor 10 or in the image signal processing device externally connected to the CMOS image sensor 10. With the configuration, the effect of capturing an image having both high sensitivity and a wide dynamic range is brought about.

Modifications of First Embodiment

Modifications of the first embodiment to which the present technology is applied will be described with reference to FIGS. 12 to 16. Note that detailed description of the same configuration portion between the modifications of the first embodiment and the first embodiment (FIGS. 4 to 10) is omitted unless otherwise specified.

FIGS. 12 to 16 are planar layout diagrams illustrating embodiments of the unit pixel 100 illustrated in FIG. 4, and are diagrams illustrating modifications of the first embodiment illustrated in FIGS. 5 to 9. FIGS. 12 to 16 are diagrams of a case where a unit pixel 100 is a so-called backside illumination imaging device, similar to the first embodiment.

Therefore, the backside illumination imaging device illustrated in FIGS. 12 to 16 has a structure in which a silicon substrate on which a first photoelectric conversion unit 101 and a second photoelectric conversion unit 102 are formed includes a first surface serving as a light incidence surface to a photodiode (photoelectric conversion unit), and a second surface facing the first surface, similarly to the first embodiment.

Figure 12:
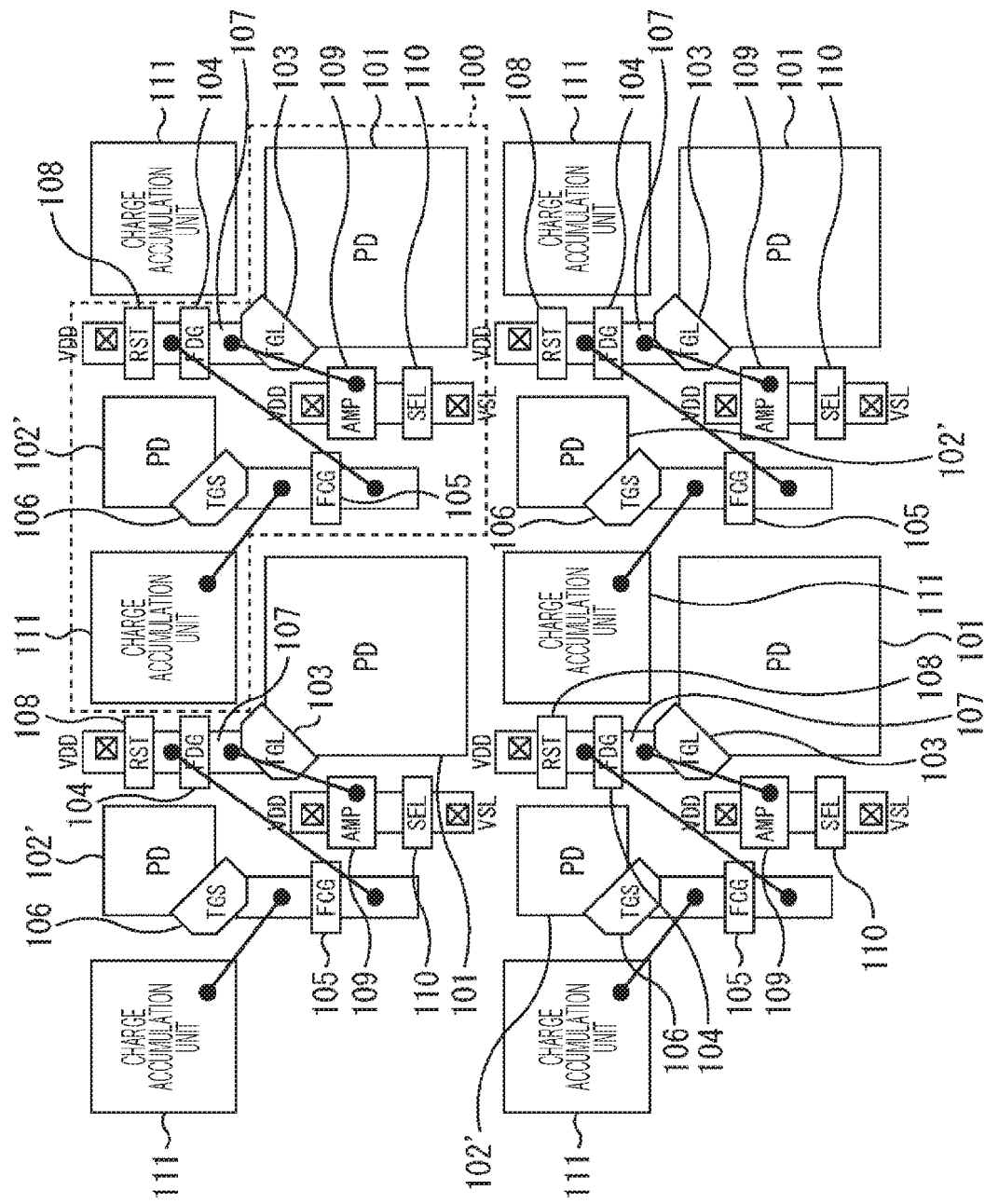

FIG. 12 is a planar layout diagram on the second surface of the silicon substrate related to the unit pixel 100, and is a planar layout diagram of active regions, the photoelectric conversion units, pixel transistors, a charge accumulation unit, and wiring connecting the aforementioned elements included in the unit pixel 100.

The planar layout related to the modification of the first embodiment illustrated in FIG. 12 is compared with the planar layout related to the first embodiment illustrated in FIG. 5. A second photoelectric conversion unit 102' (described with a dash to be distinguished from the second photoelectric conversion unit 102 illustrated in FIG. 5) described in FIG. 12 has a larger light receiving area of the photodiode than the second photoelectric conversion unit 102 illustrated in FIG. 5.

Therefore, in a case where an object with certain illuminance is captured with a certain exposure time, an electric charge generated in the second photoelectric conversion unit 102' illustrated in FIG. 12 is larger than an electric charge generated in the second photoelectric conversion unit 102 illustrated in FIG. 5.

Therefore, when the electric charge generated in the second photoelectric conversion unit 102' illustrated in FIG. 12 and the electric charge generated in the second photoelectric conversion unit 102 illustrated in FIG. 5 are transferred to FD portions 107 having the same area and are respectively converted into voltages, voltage change before and after transferring the electric charge generated in the second photoelectric conversion unit 102' illustrated in FIG. 12 to the FD portion 107 is larger than voltage change before and after transferring the electric charge generated in the second photoelectric conversion unit 102 illustrated in FIG. 5 to the FD portion 107.

With the characteristic, the second photoelectric conversion unit 102' illustrated in FIG. 12 has effects of having higher sensitivity than the second photoelectric conversion unit 102 illustrated in FIG. 5.

Figure 13:
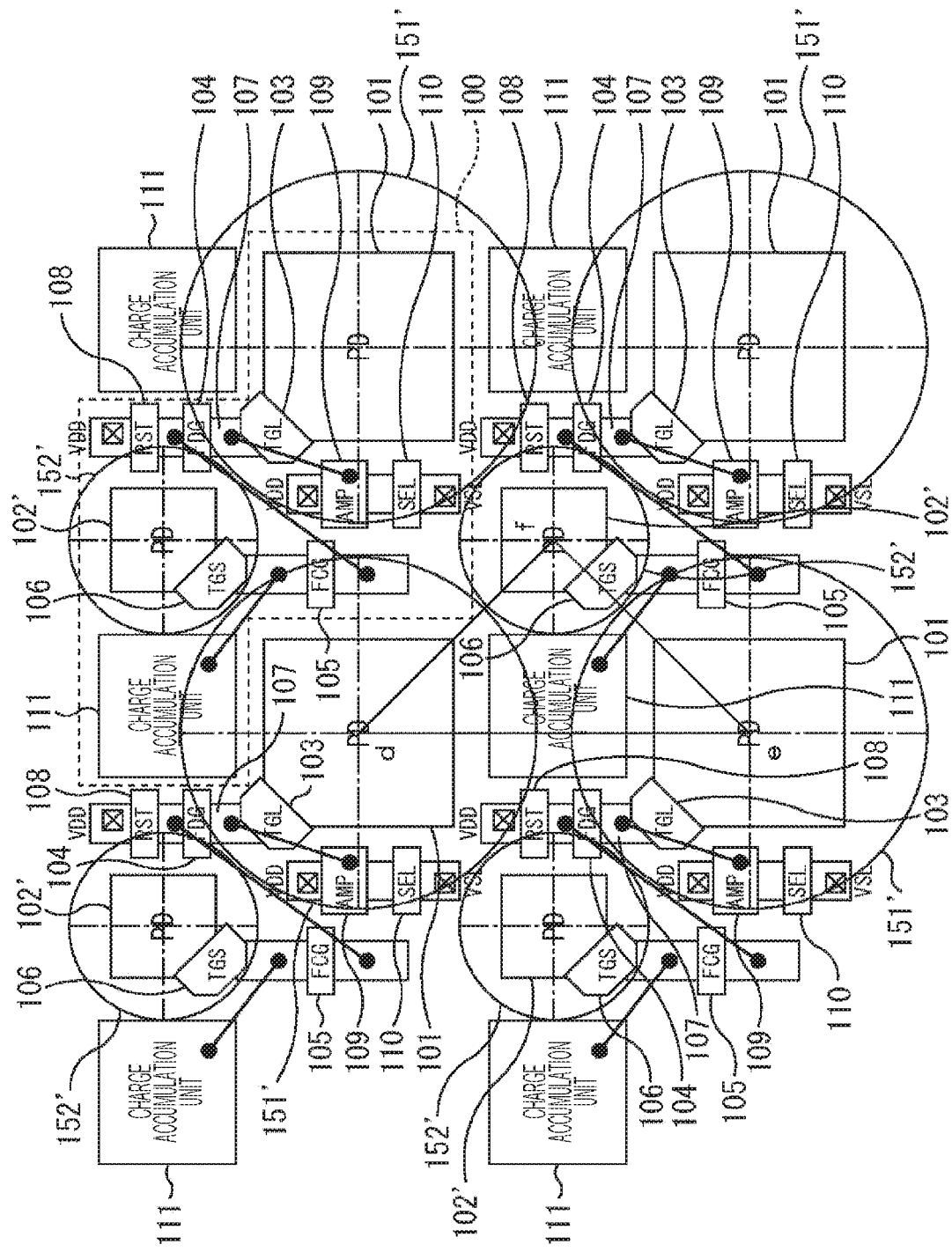
FIG. 13 is a diagram for describing a size of an on-chip lens.

The planar layout related to the modification of the first embodiment illustrated in FIG. 13 is compared with the planar layout related to the first embodiment illustrated in FIG. 6. FIG. 13 is a planar layout diagram related to the unit pixel 100, and is a diagram in which the planar layout diagram on the second surface and the planar layout diagram on the first surface, of the silicon substrate, are superimposed and illustrated, similarly to FIG. 6.

FIG. 13 illustrates a planar layout of active regions, photoelectric conversion units, pixel transistors, a charge accumulation unit, and wiring connecting the aforementioned elements arranged on the second surface, and of the photoelectric conversion units and on-chip lenses arranged on the first surface, similarly to FIG. 6.

Comparing the planar layout illustrated in FIG. 13 and the planar layout illustrated in FIG. 6, as described with reference to the planar layout illustrated in FIG. 12, the second photoelectric conversion unit 102' illustrated in FIG. 13 has a larger light receiving area of the photodiode than the second photoelectric conversion unit 102 illustrated in FIG. 6.

As a result, a second on-chip lens 152' arranged to cover the second photoelectric conversion unit 102' to condense light to enter the second photoelectric conversion unit 102' is larger than the second on-chip lens 152 illustrated in FIG. 6. In other words, the diameter of the second on-chip lens 152' illustrated in FIG. 13 is larger than the diameter of the second on-chip lens 152 illustrated in FIG. 6.

The diameter of a first on-chip lens 151' illustrated in FIG. 13 is smaller than the diameter of the first on-chip lens 151 illustrated in FIG. 6, in return for the increase in size of the second on-chip lens 152'.

As a result, in the planar layout illustrated in FIG. 13, the first on-chip lens 151' and the second on-chip lens 152' are arranged in contact with each other, as a result of pixel design. Furthermore, a void portion where no on-chip lens is arranged is caused between the first on-chip lens 151' provided in each pixel and the first on-chip lens 151' provided in an adjacent pixel.

In this case, a distance de between a center d of the first on-chip lens 151' provided in a certain first photoelectric conversion unit 101 and a center e of the first on-chip lens 151' provided in a first photoelectric conversion unit 101 adjacent to the pixel of the first photoelectric conversion unit 101, a distance df between the center d of the first on-chip lens 151' provided in the first photoelectric conversion unit 101 and a center f of the second on-chip lens 152' provided in the second photoelectric conversion unit 102', a distance ef between the center e of the first on-chip lens 151' provided in the first photoelectric conversion unit 101 and the center f of the second on-chip lens 152' provided in the second photoelectric conversion unit 102', a radius r1' of the first on-chip lens 151' provided in each pixel, and a radius r2' of the second on-chip lens 152' provided in each pixel have the following relationship.

$$\text{The distance } de \geq r1' \times 2 \tag{4}$$

$$\text{The distance } df = \text{the distance } ef = r1' + r2' = \text{the distance } de \times \sqrt{2}/2 \tag{5}$$

$$r2' \geq r1' \times (\sqrt{2} - 1) \tag{6}$$

According to the expression (4), the distance de is twice or more of the radius r1' of the first on-chip lens 151', in other words, equal to or larger than the diameter of the first on-chip lens 151'. Furthermore, according to the expression (5), the distance df and the distance ef are the same distance, and are the distance obtained by adding the radius r1' of the first on-chip lens 151' and the radius r2' of the second on-chip lens 152'. Further, the distance df and the distance ef are a value obtained by multiplying the distance de by the square root of 2 and dividing the product by 2.

According to the expression (6), the radius r2' of the second on-chip lens 152' can be derived from the expressions (4) and (5) and is equal to or less than a value obtained by subtracting 1 from the square root of 2 and multiplying the difference by the radius r1'.

Figure 14:
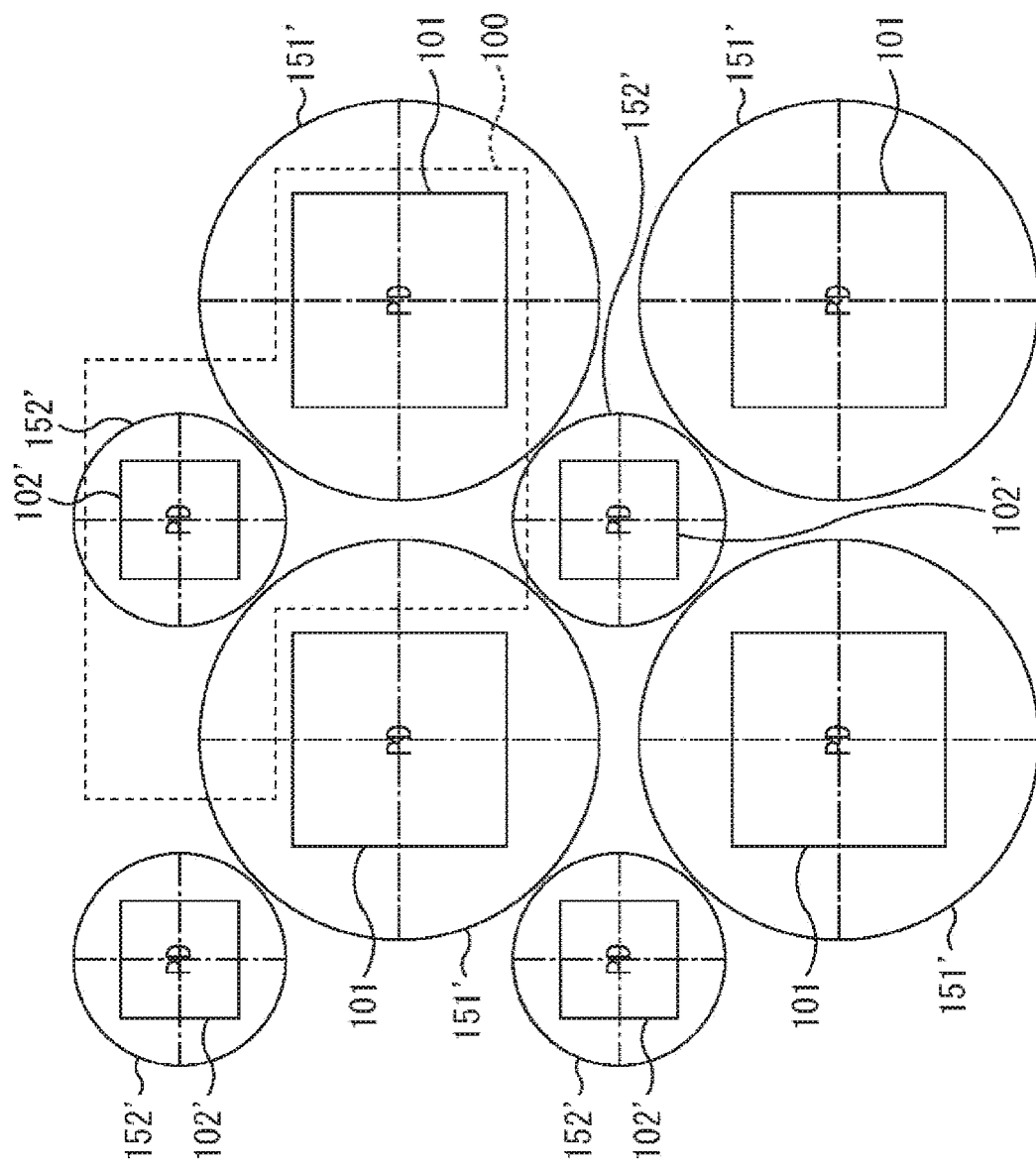
FIG. 14 is a diagram for describing a planar layout of the on-chip lens.

The planar layout related to the modification of the first embodiment illustrated in FIG. 14 is compared with the planar layout related to the first embodiment illustrated in FIG. 7. FIG. 14 is a planar layout diagram related to the unit pixel 100, and illustrates the planar layout of the first photoelectric conversion unit 101, the second photoelectric conversion unit 102', the first on-chip lens 151', and the second on-chip lens 152', on the first surface, which is extracted from FIG. 13.

The region surrounded by the dotted line illustrated in FIG. 14 is the region of one pixel of the unit pixel 100 illustrated in FIG. 4. In FIG. 14, the first on-chip lens 151' and the second on-chip lens 152' are arranged in contact with each other, similarly to FIG. 13. A void portion where no on-chip lens is arranged is caused between the first on-chip lens 151' provided in each pixel and the first on-chip lens 151' provided in an adjacent pixel.

Figure 15:
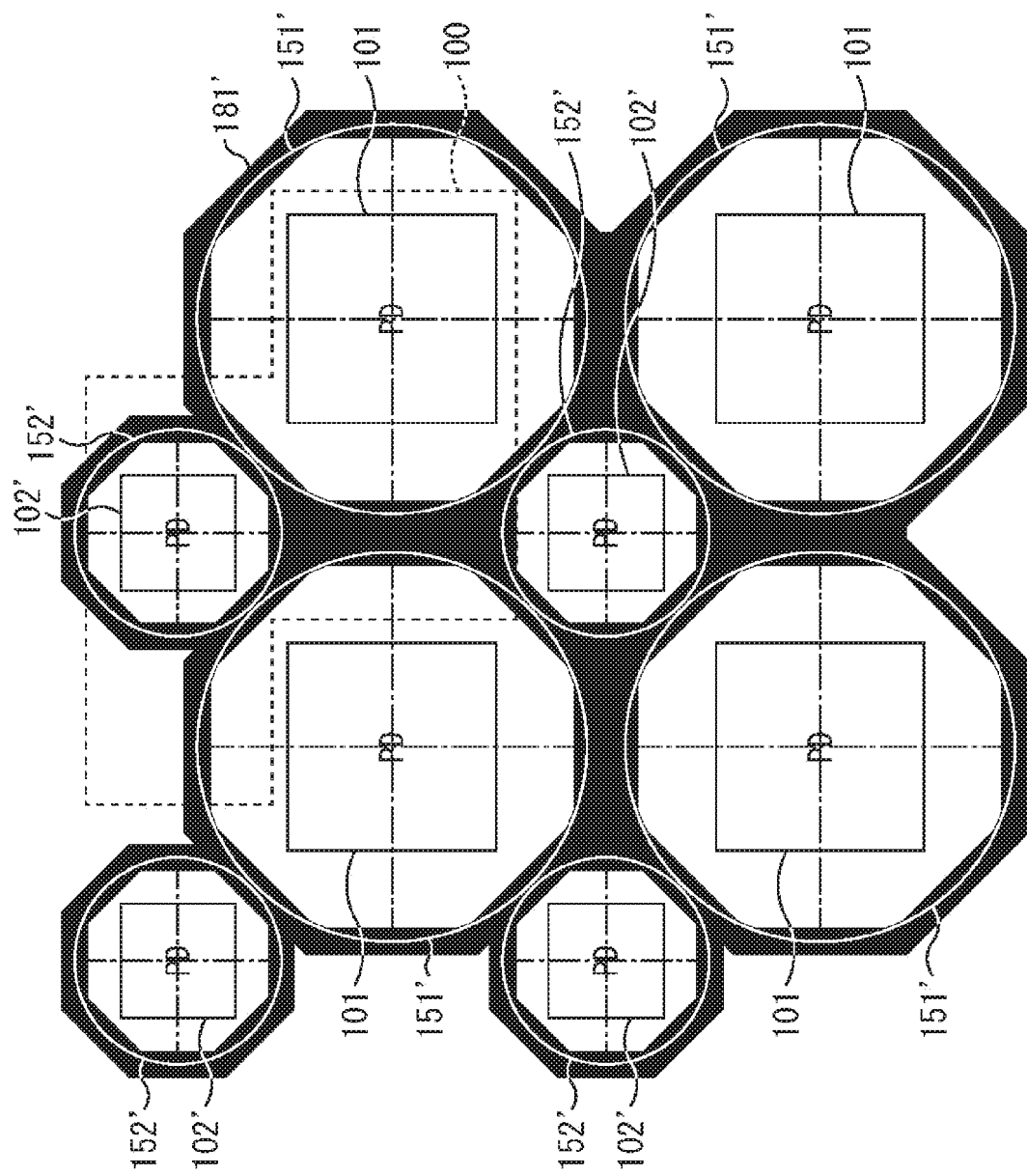
FIG. 15 is a diagram for describing a planar layout of an inter-pixel light shielding unit.

FIG. 15 is a planar layout diagram related to the unit pixel 100, and illustrates a planar layout of an inter-pixel light shielding unit 181' provided between pixels, on the first surface of the unit pixel 100, in addition to the planar layout of the first photoelectric conversion unit 101, the second photoelectric conversion unit 102', the first on-chip lens 151', and the second on-chip lens 152' on the first surface illustrated in FIG. 14, similarly to FIG. 8.

The inter-pixel light shielding unit 181' is arranged in inward directions of the two on-chip lenses with the same width in a portion where the first on-chip lens 151' of a certain pixel and the first on-chip lens 151' of a pixel adjacent thereto come closest to each other.

Furthermore, the inter-pixel light shielding unit 181' is arranged in inward directions of the two on-chip lenses with the same width in a portion where the first on-chip lens 151' and the second on-chip lens 152' come closest to each other.

Figure 16:
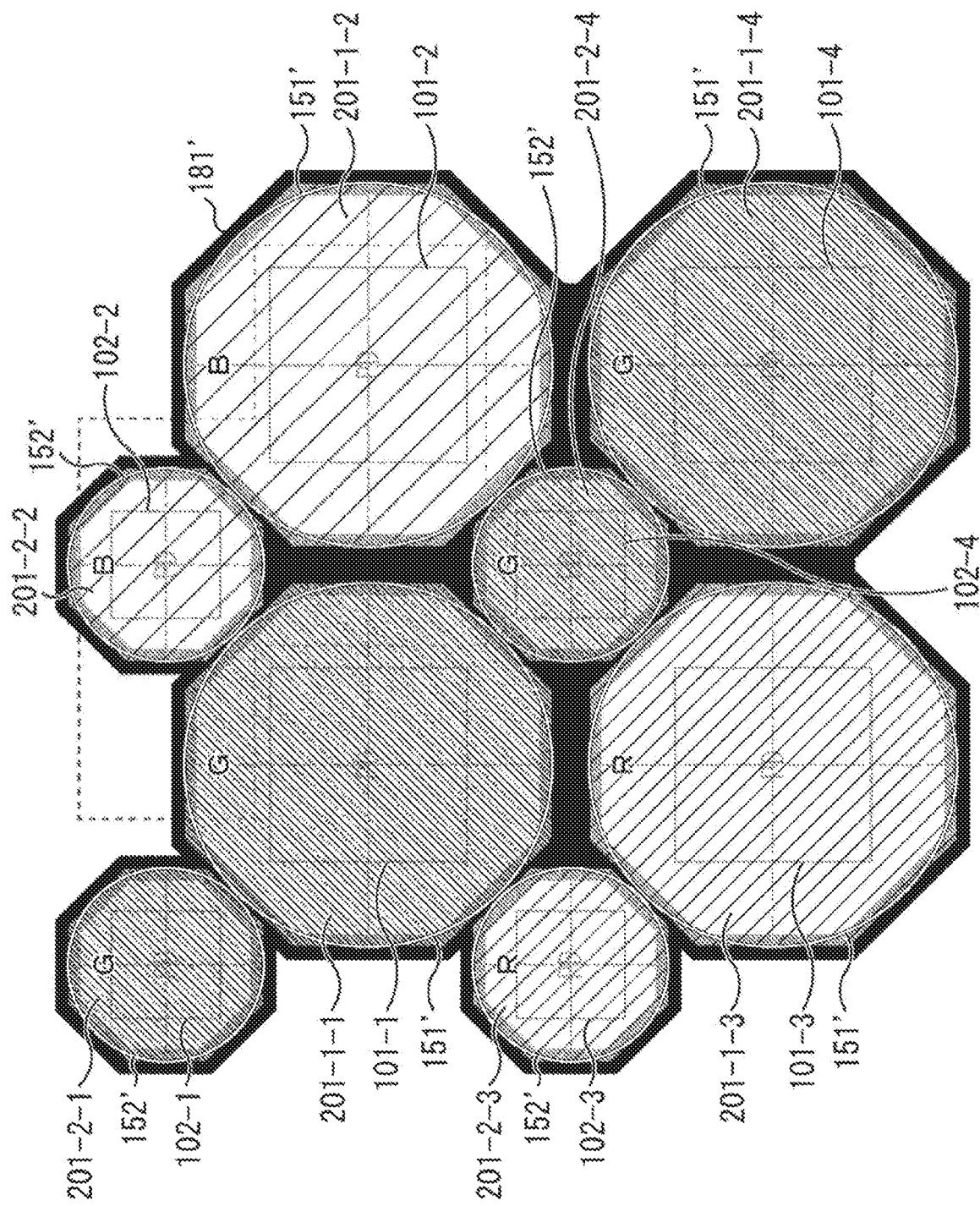
FIG. 16 is a diagram for describing a planar layout of a color filter.

FIG. 16 is a planar layout diagram related to the unit pixel 100, and illustrates a planar layout of a color filter 201' provided in each pixel, on the first surface of the unit pixel 100, in addition to the planar layout of the first photoelectric conversion unit 101, the second photoelectric conversion unit 102', the first on-chip lens 151', the second on-chip lens 152', and the inter-pixel light shielding unit 181' on the first surface illustrated in FIG. 15.

The color filter 201' is arranged under the two on-chip lenses in a portion where the first on-chip lens 151' of a certain pixel and the first on-chip lens 151' of a pixel adjacent thereto come closest to each other. Furthermore, the color filter 201' is arranged under the two on-chip lenses in a portion where the first on-chip lens 151' and the second on-chip lens 152' come closest to each other.

In the modification of the first embodiment, the cross section structure of the unit pixel is basically similar to the cross section structure of the unit pixel illustrated in FIG. 10. The sizes and the like of the second photoelectric conversion unit 102', the first on-chip lens 151', and the second on-chip lens 152' are different in the sizes as described above, but the structure is basically the same.

Furthermore, the first on-chip lens 151' and the second on-chip lens 152' can be formed as described with reference to FIG. 11.

The CMOS image sensor 10 provided with the unit pixel 100 having the structure described using FIGS. 12 to 16 can capture an image with high sensitivity using the first photoelectric conversion unit 101, and capture an image with a wide dynamic range using the second photoelectric conversion unit 102', similarly to the CMOS image sensor 10 provided with the unit pixel 100 having the structure described using FIGS. 4 to 11.

These two images are synthesized into an image through image signal processing in the image signal processing circuit provided inside the CMOS image sensor 10 or in the image signal processing device externally connected to the CMOS image sensor 10. With the configuration, the effect of capturing an image having both high sensitivity and a wide dynamic range is brought about.

Second Embodiment

Next, a second embodiment to which present technology is applied will be described with reference to FIGS. 17 to 19. Note that detailed description of the same configuration portion between the second embodiment and the first embodiment is omitted unless otherwise specified.

The unit pixel 100 in the first embodiment to which the present technology is applied, which has been described with reference to FIGS. 4 to 11, includes two photoelectric conversion units including the first photoelectric conversion unit 101 and the second photoelectric conversion unit 102, in which (1) the first photoelectric conversion unit 101 is configured to have a large light receiving area of the photodiode than the second photoelectric conversion unit 102, thereby to capture an image with high sensitivity, (2) the second photoelectric conversion unit 102 has a structure to accumulate the charge generated exceeding the saturation charge amount in the charge accumulation unit 111 even if light with high illuminance enters and the charge exceeding the saturation charge amount of the second photoelectric conversion unit 102 is generated, thereby to capture an image with a wide dynamic range, and (3) two images of the image with high sensitivity captured using the first photoelectric conversion unit 101 and the image with a wide dynamic range captured using the second photoelectric conversion unit 102 are synthesized into one image, whereby the imaging device captures an image having both high sensitivity and a wide dynamic range.

The second embodiment to which the present technology is applied further includes means for reducing light having entered a second on-chip lens 152 before reaching a second photoelectric conversion unit 102, in addition to the first embodiment.

By further including such means for reducing light, effects of further expanding a range of illuminance of an object, thereby to capture an image having a gradation property, in other words, capturing an image with a wider dynamic range is brought about.

As the means for reducing light having entered the second on-chip lens 152 before reaching the second photoelectric conversion unit 102, more specifically, a light reducing filter is included, which reduces light by transmitting the light with an achromatic optical filter.

A circuit diagram illustrating a configuration of a unit pixel 100 in the second embodiment is the same as the circuit diagram in the first embodiment, and description thereof is omitted as having been described with reference to FIG. 4. Furthermore, a planar layout of the unit pixel 100 in the second embodiment is basically similar to the planar layout of the first embodiment illustrated in FIGS. 5 to 9, except for addition of the light reducing filter, and thus description thereof is appropriately omitted.

Figure 17:
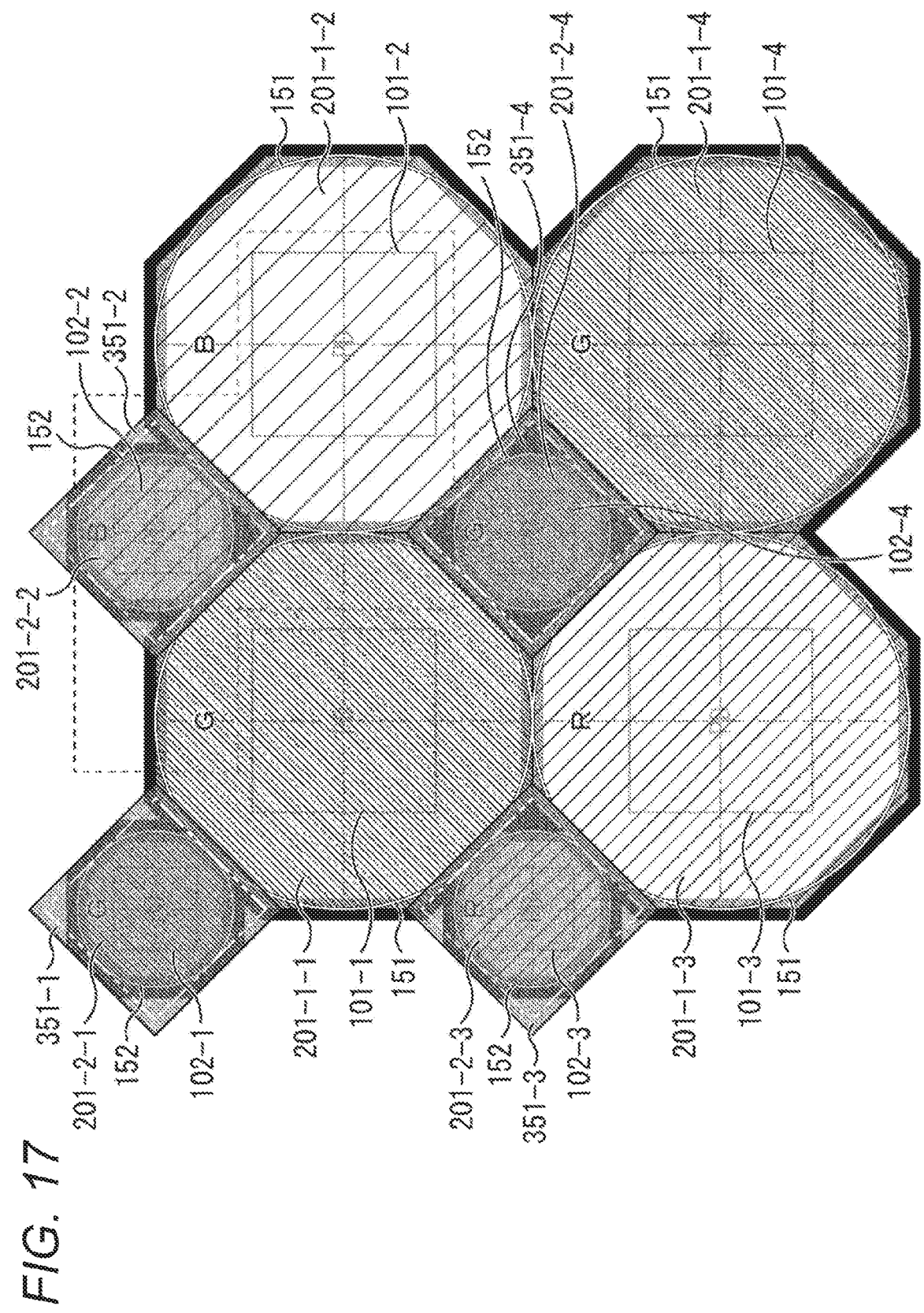
FIG. 17 is a diagram for describing a shape of a light reducing filter.

FIG. 17 is a planar layout diagram related to the unit pixel 100, and illustrates a planar layout of a light reducing filter 351 provided above the second photoelectric conversion unit 102, in addition to the planar layout of a first photoelectric conversion unit 101, the second photoelectric conversion unit 102, a first on-chip lens 151, a second on-chip lens 152, an inter-pixel light shielding unit 181, and a color filter 201 on a first surface illustrated in FIG. 9.

The light reducing filter 351 illustrated in FIG. 17 is arranged between the second on-chip lens 152 and a color filter 201-2 provided in the second photoelectric conversion unit 102 in a structure in a cross-sectional direction (to be described below with reference to FIG. 18, for example). Furthermore, the light reducing filter 351 illustrated in FIG. 17 is more specifically an achromatic optical filter, which is, for example, a gray filter for reducing light by transmitting the light through the optical filter.

Note that gray has been cited as an example of the color of the light reducing filter 351. However, another color may be used as long as the color can uniformly absorb visible light.

A planar layout of the light reducing filter 351 in FIG. 17 will be more specifically described. For the sake of convenience, in FIG. 17, description will be given on the assumption that an X axis is parallel to the drawing and is in a left and right direction of the drawing, and a Y axis is parallel to the drawing and is in an up and down direction of the drawing.

In FIG. 17, the first on-chip lenses 151 provided in pixels are arrayed such that its centers are arrayed at equal intervals both in an X-axis direction and in a Y-axis direction. Four first on-chip lenses 151 are arranged around the second on-chip lens 152 provided in each pixel. A center of each of the four first on-chip lenses 151 arranged around one second on-chip lens 152 is at an angle of 45° with respect to the X axis from a center of the second on-chip lens 152, respectively.

In FIG. 17, the quadrangle illustrated by the two-dot chain line around the second on-chip lens 152 has four sides each passing through a region where the second on-chip lens 152 and one of the four first on-chip lenses 151 arranged around the second on-chip lens 152 come closest to each other, and each being orthogonal to a line segment connecting the center of the second on-chip lens 152 and the center of one of the four first on-chip lenses 151 arranged around the second on-chip lens 152.

In FIG. 17, the belt-shaped inter-pixel light shielding unit 181 arranged between the second photoelectric conversion unit 102 and the four first photoelectric conversion units 101 arranged around the second photoelectric conversion unit 102 has a center in a width direction of the belt shape being arranged to coincide with each of the four sides of the quadrangle illustrated by the two-dot chain line, and being arranged to go along at least a part of the side, in at least a part of the inter-pixel light shielding unit 181.

In FIG. 17, the light reducing filter 351 arranged above the second photoelectric conversion unit 102 extends up to the outside of the quadrangle illustrated by the two-dot chain line, in at least a region where the second on-chip lens 152 and the first on-chip lens 151 come closest to each other.

In other words, the light reducing filter 351 arranged above the second photoelectric conversion unit 102 extends in a direction of the first photoelectric conversion unit 101 with respect to the center in the width direction of the belt-shaped inter-pixel light shielding unit 181 arranged between the second photoelectric conversion unit 102 and the first photoelectric conversion unit 101, in at least the region where the second on-chip lens 152 and the first on-chip lens 151 come closest to each other.

The first photoelectric conversion unit 101 has higher sensitivity than the second photoelectric conversion unit 102. For this reason, an adverse effect due to occurrence of color mixture where light entering the second on-chip lens formed on the second photoelectric conversion unit 102 enters the adjacent first photoelectric conversion unit 101 is greater than an adverse effect due to occurrence of color mixture where light entering the first on-chip lens formed on the first photoelectric conversion unit 101 enters the adjacent second photoelectric conversion unit 102.

The layout in which the light reducing filter 351 extends in the direction of the first photoelectric conversion unit 101 with respect to the center in the width direction of the belt-shaped inter-pixel light shielding unit 181 arranged between the second photoelectric conversion unit 102 and the first photoelectric conversion unit 101 brings about effects of reducing the color mixture from the second on-chip lens 152 to the first photoelectric conversion unit 101, which has greater adverse effect due to the color mixture.

Figure 18:
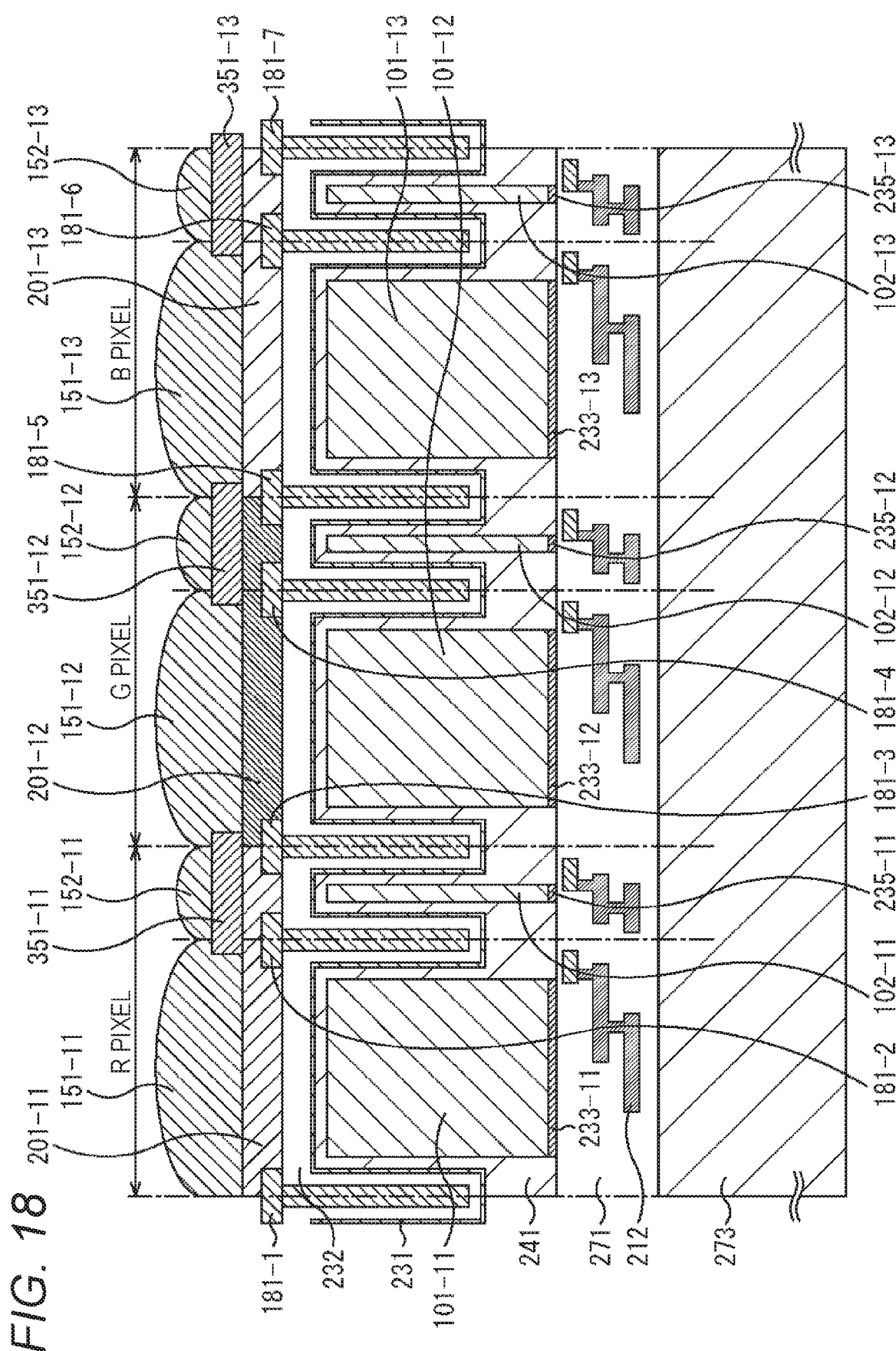
FIG. 18 is a diagram illustrating a structure of a unit pixel in a second embodiment.

FIG. 18 is a schematic diagram of a cross section related to the unit pixel 100, and illustrates a configuration in which the light reducing filter 351 is added to the configuration illustrated in FIG. 10. The cross section configuration of the unit pixel 100 illustrated in FIG. 18 schematically repeatedly illustrates a portion where the first on-chip lens 151 and the second on-chip lens 152 come closest to each other within one pixel, and a portion where the second on-chip lens 152 of a certain pixel and the first on-chip lens 151 of a pixel adjacent thereto come closest to each other in adjacent two pixels, same as the cross section structure of the unit pixel 100 illustrated in FIG. 10.

The light reducing filter 351 arranged above the second photoelectric conversion unit 102 has the layout to extend in a direction of the first photoelectric conversion unit 101 with respect to the center in the width direction of the belt-shaped inter-pixel light shielding unit 181 arranged between the second photoelectric conversion unit 102 and the first photoelectric conversion unit 101, in the region where the second on-chip lens 152 and the first on-chip lens 151 come closest to each other.

For example, a light reducing filter 351-11 arranged on the second photoelectric conversion unit 102-11 is formed between a second on-chip lens 152-11 and a color filter 201-11.

Furthermore, the light reducing filter 351 has the layout to extend in the direction of the first photoelectric conversion unit 101-11 with respect to the center in the width direction of the belt-shaped inter-pixel light shielding unit 181-2 arranged between the second photoelectric conversion unit 102-11 and the first photoelectric conversion unit 101-11, in the region where the second on-chip lens 152-11 and the first on-chip lens 151-11 come closest to each other.

Furthermore, the light reducing filter 351 has the layout to extend in the direction of the first photoelectric conversion unit 101-12 with respect to the center in the width direction of the belt-shaped inter-pixel light shielding unit 181-3 arranged between the second photoelectric conversion unit 102-11 and the first photoelectric conversion unit 101-12, in the region where the second on-chip lens 152-11 and the first on-chip lens 151-12 come closest to each other.

In this way, by including the light reducing filter 351 that reduces light having entered second on-chip lens 152 before reaching the second photoelectric conversion unit 102, effects of further expanding a range of illuminance of an object to capture an image having a gradation property, in other words, capturing an image with a wider dynamic range is brought about.

Modification of Second Embodiment

In the second embodiment, a modification in which a second photoelectric conversion unit 102 is configured to be large can be applied, as in the first embodiment. The modification of the first embodiment is an embodiment in which the light receiving area of the second photoelectric conversion unit 102' is made large as described with reference to FIGS. 12 to 16. Detailed description of the same configuration portion between the modification of the second embodiment and the second embodiment (the modification of the first embodiment) is omitted unless otherwise specified.

A circuit illustrating a configuration of a unit pixel 100 in the modification of the second embodiment is the same as in FIG. 4. Furthermore, a planar layout of the unit pixel 100 in the modification of the second embodiment is the same as the planar layout of the modification of the first embodiment illustrated in FIGS. 12 to 16, except for addition of a light reducing filter 351'. Since portions other than a first photoelectric conversion unit 101 are different in size and shape, each portion in the modification of the second embodiment will be described with a dash to be distinguished from each portion in the second embodiment.

Figure 19:
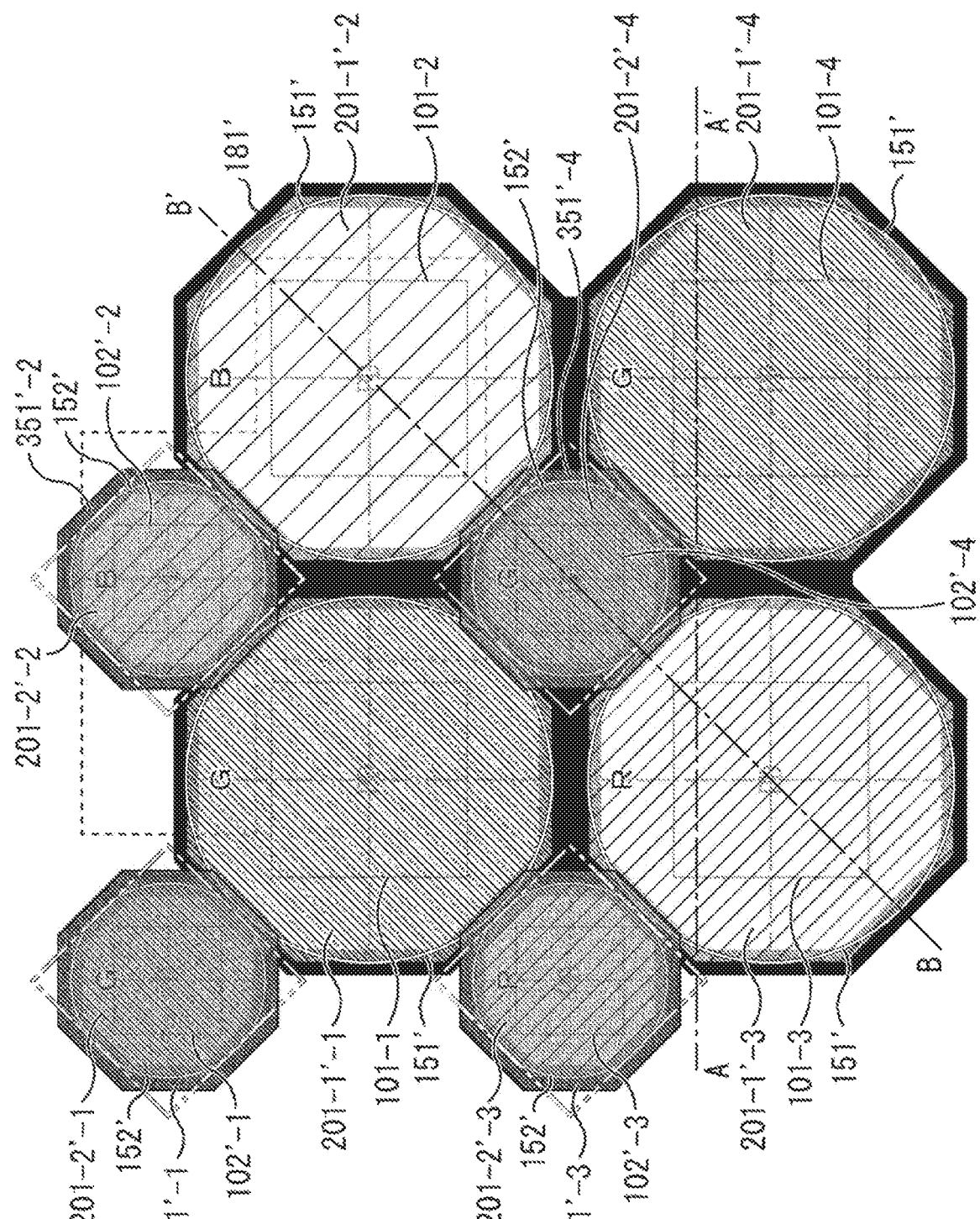
FIG. 19 is a diagram for describing a shape of a light reducing filter.

FIG. 19 is a planar layout diagram related to the unit pixel 100 according to the modification of the second embodiment, and is a diagram illustrating a configuration in which the light reducing filter 351 is added to the planar layout diagram related to the unit pixel 100 according to the modification of the second embodiment illustrated in FIG. 16.

FIG. 19 illustrates a planar layout of the light reducing filter 351' arranged above a second photoelectric conversion unit 102, in addition to a planar layout of a first photoelectric conversion unit 101, a second photoelectric conversion unit 102', a first on-chip lens 151', a second on-chip lens 152', an inter-pixel light shielding unit 181', and a color filter 201' provided in each pixel on a first surface.

The light reducing filter 351' illustrated in FIG. 19 is arranged between the second on-chip lens 152' and the color filter 201-2' provided in the second photoelectric conversion unit 102' in a structure in a cross-sectional direction, similarly to the light reducing filter 351 illustrated in FIG. 17.

Furthermore, the light reducing filter 351' illustrated in FIG. 19 is an achromatic optical filter and is a light reducing filter 351' that reduces light by transmitting the light with the optical filter, similar to the light reducing filter 351 illustrated in FIG. 17.

In FIG. 19, similarly to FIG. 17, the first on-chip lenses 151' provided in pixels are arrayed such that its centers are arrayed at equal intervals both in an X-axis direction and in a Y-axis direction. Four first on-chip lenses 151' are arranged around the second on-chip lens 152' provided in each pixel. A center of each of the four first on-chip lenses 151' arranged around one second on-chip lens 152' is at an angle of 45° with respect to the X axis from a center of the second on-chip lens 152', respectively.

In FIG. 19, the quadrangle illustrated by the two-dot chain line around the second on-chip lens 152' has four sides each passing through a region where the second on-chip lens 152' and one of the four first on-chip lenses 151' arranged around the second on-chip lens 152' come closest to each other, and each being orthogonal to a line segment connecting the center of the second on-chip lens 152' and the center of one of the four first on-chip lenses 151' arranged around the second on-chip lens 152', similarly to FIG. 17.

In FIG. 19, the belt-shaped inter-pixel light shielding unit 181' arranged between the second photoelectric conversion unit 102' and the four first photoelectric conversion units 101 arranged around the second photoelectric conversion unit 102' has a center in a width direction of the belt shape being arranged to coincide with each of four sides of the quadrangle illustrated by the two-dot chain line, and being arranged to go along at least a part of the side, in at least a part of the inter-pixel light shielding unit 181', similarly to FIG. 17.

In FIG. 19, the light reducing filter 351' arranged above the second photoelectric conversion unit 102' extends up to the outside of the quadrangle illustrated by the two-dot chain line, in at least the region where the second on-chip lens 152' and the first on-chip lens 151' come closest to each other, similarly to FIG. 17.

In other words, the light reducing filter 351' arranged above the second photoelectric conversion unit 102' extends in a direction of the first photoelectric conversion unit 101 with respect to the center in the width direction of the belt-shaped inter-pixel light shielding unit arranged between the second photoelectric conversion unit 102' and the first photoelectric conversion unit 101, in at least the region where the second on-chip lens 152' and the first on-chip lens 151' come closest to each other.

Even in the layout illustrated in FIG. 19, similarly to the layout illustrated in FIG. 17, the effects of reducing color mixture from the second on-chip lens 152' to the first photoelectric conversion unit 101, which is a greater adverse effect due to color mixture, can be obtained.

In the layout illustrated in FIG. 19, similarly to the layout illustrated in FIG. 17, a void portion where no on-chip lens is arranged is caused between the first on-chip lens 151' provided in each pixel and the first on-chip lens 151' provided in an adjacent pixel. Then, in FIG. 19, the light reducing filter 351' is arranged to avoid below the void portion between the two first on-chip lenses 151'.

In the layout illustrated in FIG. 19, the light reducing filter 351 is (1) arranged to extend in the direction of the first photoelectric conversion unit 101 with respect to the center in the width direction of the belt-shaped inter-pixel light shielding unit 181' arranged between the second photoelectric conversion unit 102' and the first photoelectric conversion unit 101, in at least the region where the second on-chip lens 152' and the first on-chip lens 151' come closest to each other, and (2) arranged to avoid below the void portion where no on-chip lens is arranged between the two first on-chip lenses 151' provided in adjacent two pixels.

Figure 20:
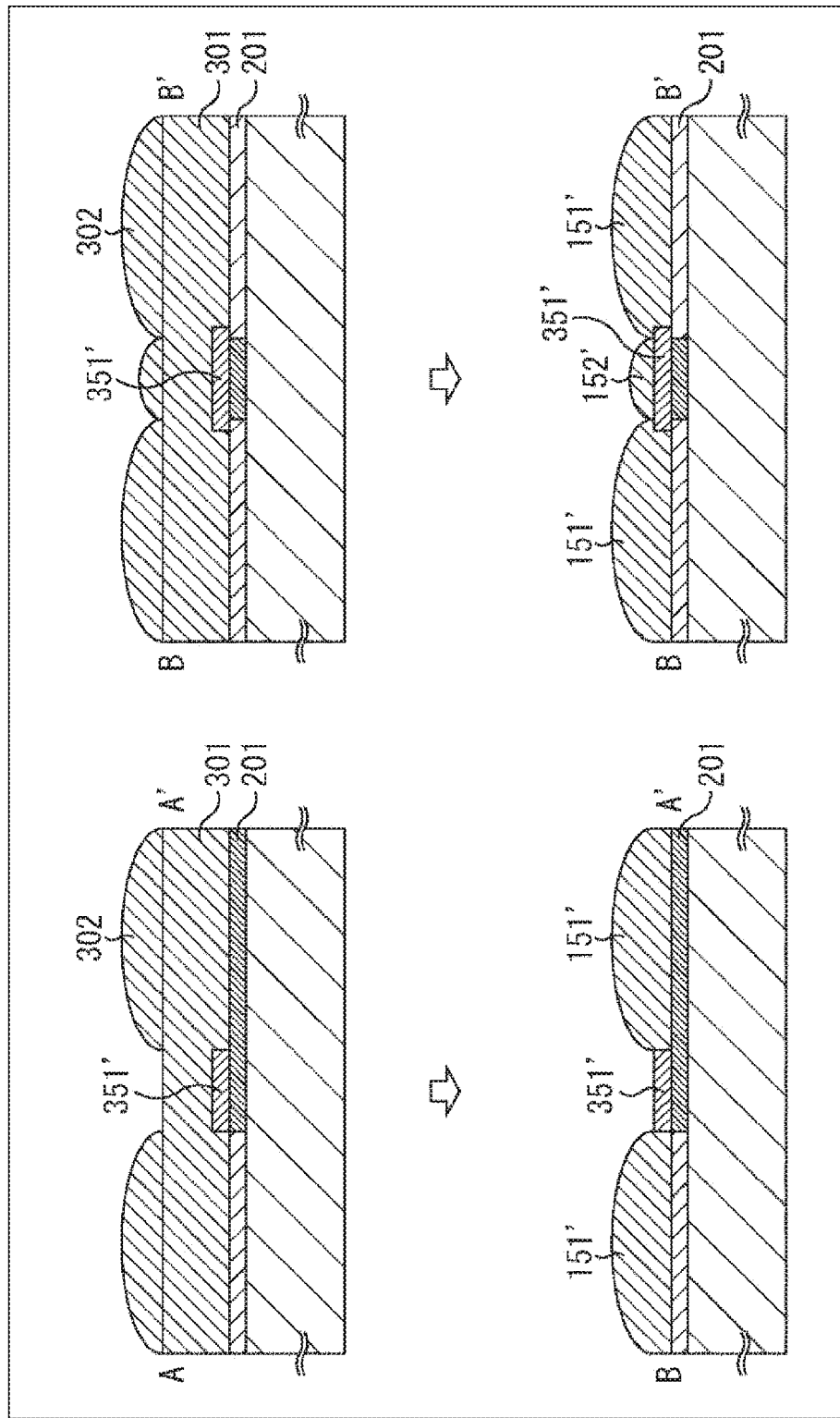
FIG. 20 is a diagram for describing an effect by making the light reducing filter have a predetermined shape.
Figure 21:
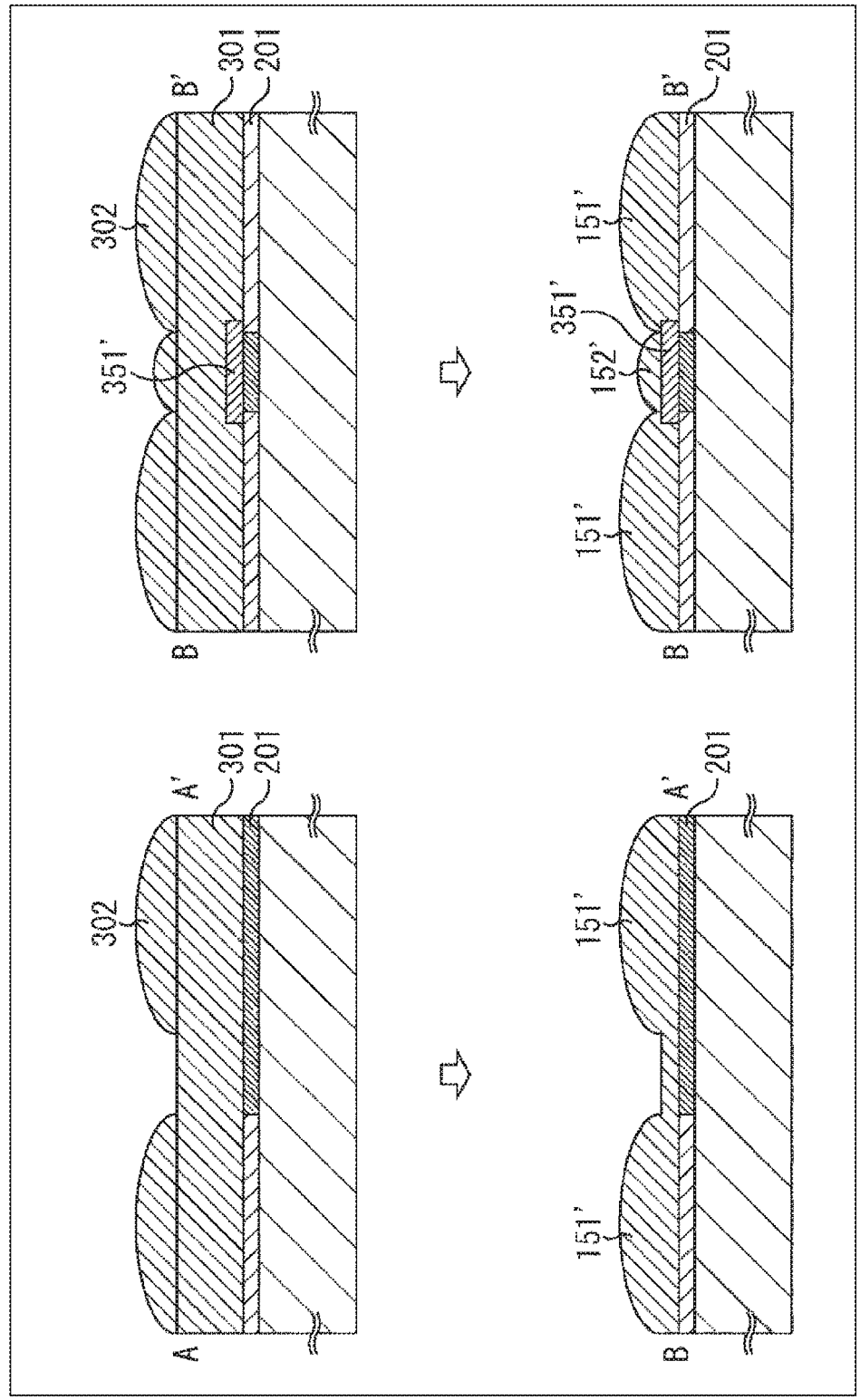
FIG. 21 is a diagram for describing an effect by making the light reducing filter have a predetermined shape.

The reason why disposing the light reducing filter 351' as described above is favorable will be described with reference to FIGS. 20 and 21. FIGS. 20 and 21 are flowcharts of a manufacturing method for forming an on-chip lens.

FIG. 20 is a flowchart in the case of using an on-chip lens forming process illustrated in FIG. 11, in the unit pixel 100 in which the void portion exists between the two first on-chip lenses 151' as illustrated in FIG. 19, and the light reducing filter 351' extends up to each vertex of the quadrangle illustrated by the two dot-chain line in FIG. 19, unlike the illustration in FIG. 19.

The cross-sectional view in the upper part on the left in FIG. 20 is a view illustrating a cross section taken along line A-A' in FIG. 19 in a process of forming a resist pattern for forming an on-chip lens. A void portion where no on-chip lens is arranged exists between resist patterns 302 for forming two first on-chip lenses 151.

The cross-sectional view in the upper part on the right in FIG. 20 is a cross-sectional view taken along line B-B' in FIG. 19 in the process of forming the resist pattern for forming an on-chip lens. Since the resist pattern 302 for forming the second on-chip lens 152' is arranged between the resist patterns 302 for forming the two first on-chip lenses 151, the void portion where no on-chip lens is arranged does not exist.

When the on-chip lens is formed by entirely etching back a substrate on which the resist pattern for forming an on-chip lens is formed, illustrated in the upper part on the right in FIG. 20, using a dry etching device, the cross-sectional shape illustrated in the lower part on the right in FIG. 20 is obtained.

In the cross-sectional view illustrated in the lower part on the right in FIG. 20, the second on-chip lens 152' and the first on-chip lens 151' are formed above the light reducing filter 351', and the light reducing filter 351' is not exposed.

When the on-chip lens is formed by entirely etching back the substrate on which the resist pattern for forming an on-chip lens is formed, illustrated in the upper part on the left in FIG. 20, using a dry etching device, the cross-sectional shape illustrated in the lower part on the left in FIG. 20 is obtained.

In the cross-sectional view in the upper part on the left in FIG. 20, the void portion where no on-chip lens is arranged exists between the resist patterns for forming two first on-chip lenses. Therefore, when this substrate is etched back, the light reducing filter 351' is exposed and the exposed light reducing filter 351' is etched back.

If the light reducing filter 351' is etched back by a dry etching device, the inclusion contained in the light reducing filter 351' may adhere to an inner wall of a chamber of the dry etching device. The inclusion contained in the light reducing filter 351' is, for example, a heavy metal. If such inclusion adheres to the inner wall of the chamber of the dry etching device, another product for which dry etching processing other than etch-back of an on-chip lens is performed using the dry etching device may be contaminated by the inclusion of the light reducing filter 351'.

Therefore, it is desirable that the light reducing filter 351' is not etched back in the etch-back processing for forming an on-chip lens.

FIG. 21 is a flowchart of a manufacturing method in the case of forming the light reducing filter 351' illustrated in FIG. 19. The light reducing filter 351' illustrated in FIG. 19 is formed into a shape in which vertexes of the light reducing filter 351' are retracted toward the second photoelectric conversion unit 102' side with respect to the quadrangle illustrated by the two-dot chain line in FIG. 19. With the formation, the light reducing filter 351' is formed to avoid a portion crossed by the line A-A' in FIG. 19.

The cross-sectional view in the upper part on the left in FIG. 21 is a view illustrating a cross section taken along line A-A' in FIG. 19 in the process of forming a resist pattern for forming an on-chip lens. A void portion where no on-chip lens is arranged exists between the resist patterns 302 for forming two first on-chip lenses 151'.

The cross-sectional view in the upper part on the right in FIG. 21 is a cross-sectional view taken along line B-B' in FIG. 19 in the process of forming the resist pattern for forming an on-chip lens. The resist pattern 302 for forming the second on-chip lens 152' is arranged between the resist patterns 302 for forming the two first on-chip lenses 151, and the void portion where no on-chip lens is arranged does not exist.

When the on-chip lens is formed by entirely etching back the substrate on which the resist pattern 302 for forming an on-chip lens is formed, illustrated in the upper part on the right in FIG. 21, using a dry etching device, the cross-sectional shape illustrated in the lower part on the right in FIG. 21 is obtained.

In the cross-sectional view illustrated in the lower part on the right in FIG. 21, the second on-chip lens 152' and the first on-chip lens 151' are formed above the light reducing filter 351', and the light reducing filter 351' is not exposed.

When the on-chip lens is formed by entirely etching back the substrate on which the resist pattern 302 for forming an on-chip lens is formed, illustrated in the upper part on the left in FIG. 21, using a dry etching device, the cross-sectional shape illustrated in the lower part on the left in FIG. 21 is obtained.

In the cross-sectional view in the upper part on the left in FIG. 21, the light reducing filter 351' is not arranged below the void portion between the resist patterns 302 for forming the two first on-chip lenses 151'. Therefore, in the cross-sectional view illustrated in the lower part on the left in FIG. 21, the light reducing filter 351' is not exposed and etched back.

Therefore, another product for which dry etching processing other than etch-back of an on-chip lens is performed can be prevented from being contaminated by the inclusion of the light reducing filter 351' in the etch-back device used in formation of an on-chip lens.

In this way, the layout in which the light reducing filter 351' is arranged to avoid below the void portion where no on-chip lens exists between the two first on-chip lenses 151' provided in adjacent two pixels brings about the effects of preventing another product for which etching processing other than etch-back of an on-chip lens is performed in an etch-back device used in formation of an on-chip lens from being contaminated by the inclusion of the light reducing filter 351'.

Other shapes of the light reducing filter 351' capable of obtaining such effects will be described. The light reducing filter 351' illustrated in FIGS. 22 to 24 described below is (1) arranged to extend in the direction of the first photoelectric conversion unit with respect to the center in the width direction of the belt-shaped inter-pixel light shielding unit arranged between the second photoelectric conversion unit 102 and the first photoelectric conversion unit 101 in at least the region where the second on-chip lens and the first on-chip lens come closest to each other, and (2) arranged to avoid below the void portion where no on-chip lens is arranged between the two first on-chip lenses provided in adjacent two pixels.

Figure 22:
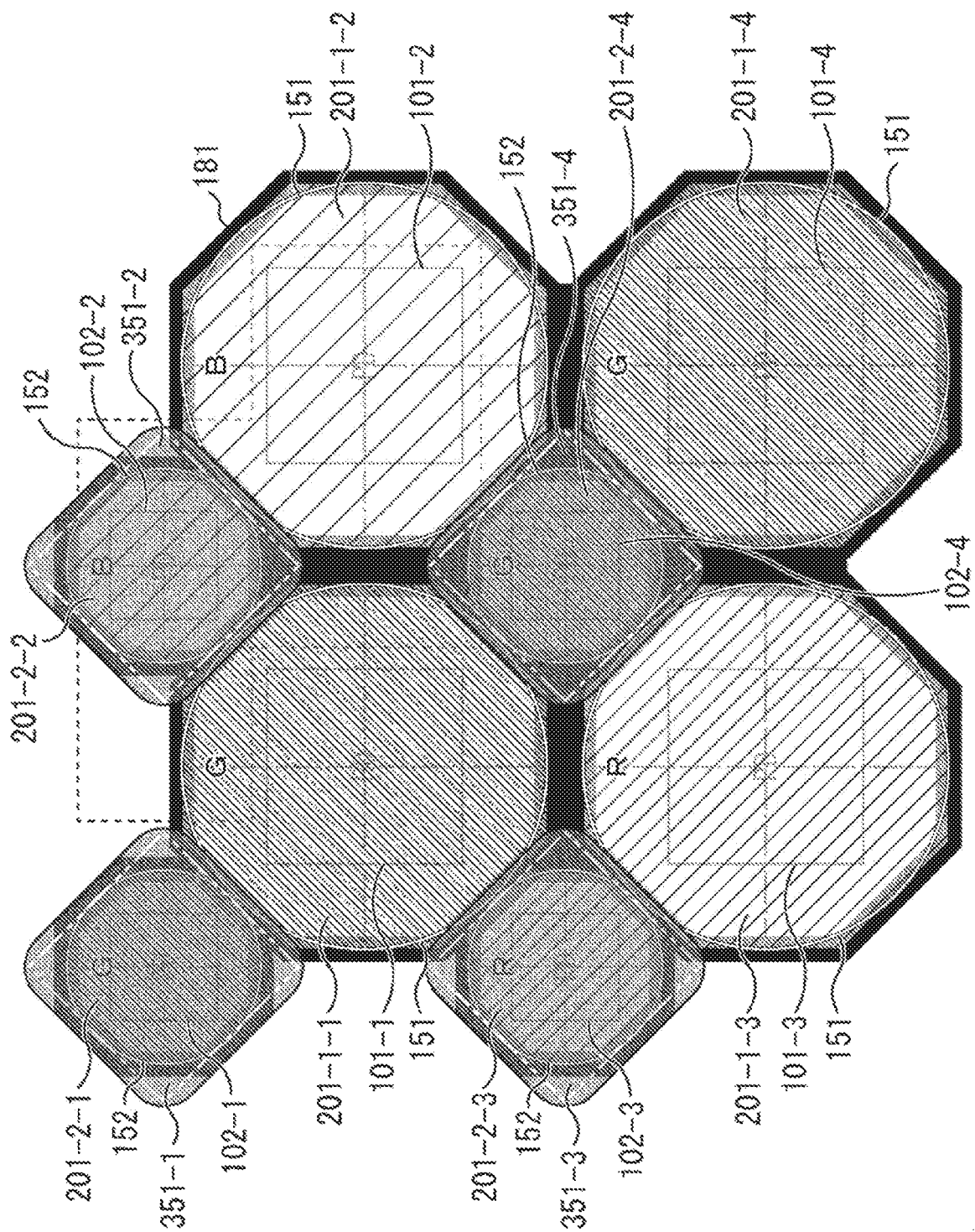
FIG. 22 is a diagram for describing a shape of a light reducing filter.
Figure 23:
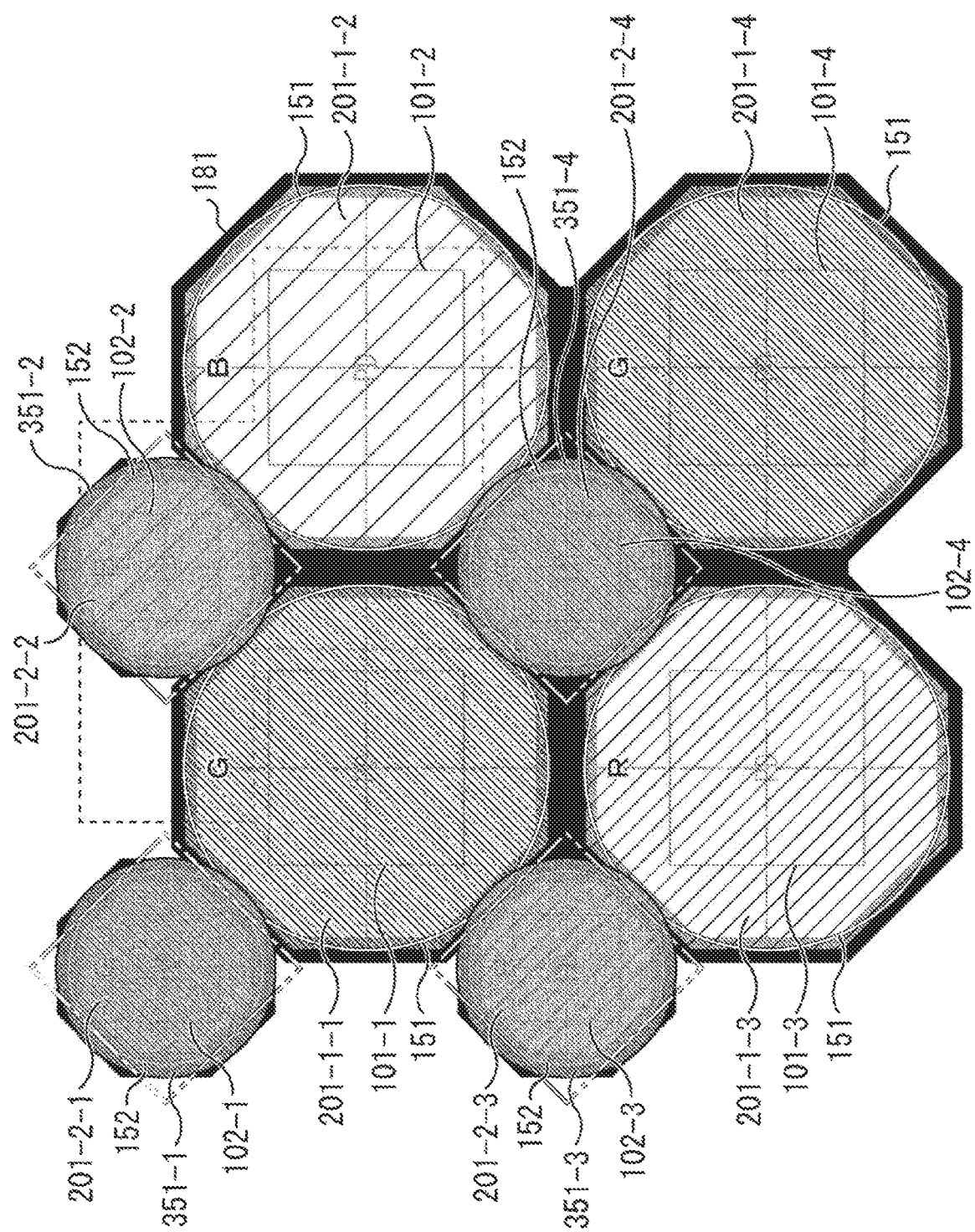
FIG. 23 is a diagram for describing another shape of the light reducing filter.
Figure 24:
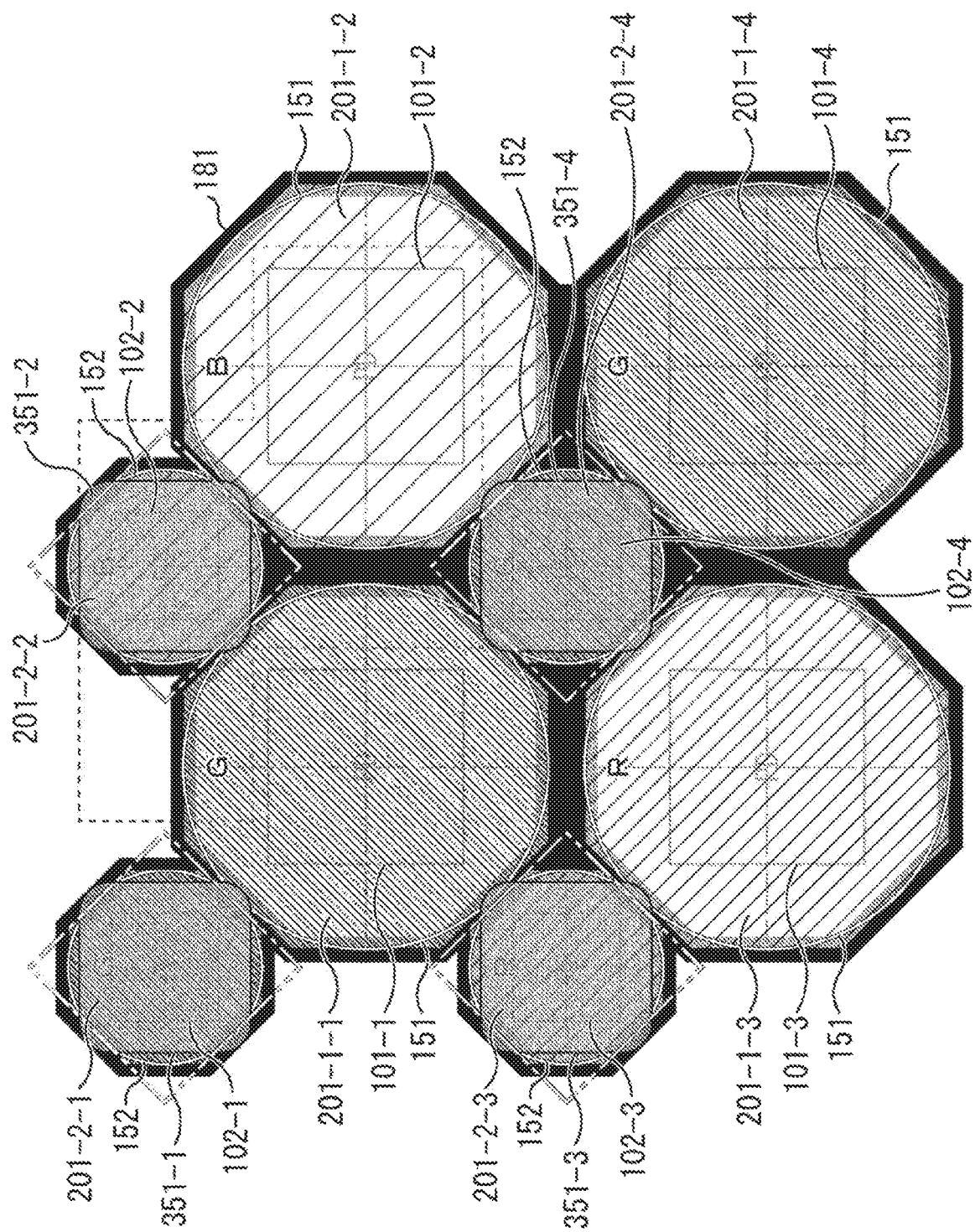
FIG. 24 is a diagram for describing still another shape of the light reducing filter.

Note that the planar layouts illustrated in FIGS. 22 to 24 are basically similar to the planar layout illustrated in FIG. 19, but the description will be continued without attaching a dash (') to the reference numerals. Furthermore, a layout basically similar to the planar layout illustrated in FIG. 19 will be described as an example. However, description to be given with reference to FIGS. 22 to 24 can be applied to the planar layout illustrated in FIG. 17.

FIG. 22 illustrates a planar layout in which the shape of the light reducing filter 351 that covers the second photoelectric conversion unit 102 is approximately the same as the quadrangle, and the vertexes of the quadrangle are retracted in the inward directions, whereby the light reducing filter 351 is not arranged in the void portion where no on-chip lens exists between the two first on-chip lenses 151 provided in adjacent two pixels.

In the layout illustrated in FIG. 22, the light reducing filter 351 arranged above the second photoelectric conversion unit 102 extends up to the outside of the quadrangle illustrated by the two-dot chain line, in at least the region where the second on-chip lens 152 and the first on-chip lens 151 come closest to each other, similarly to the layouts illustrated in FIGS. 17 and 19.

In other words, the light reducing filter 351 arranged above the second photoelectric conversion unit 102 extends in a direction of the first photoelectric conversion unit 101 with respect to the center in the width direction of the belt-shaped inter-pixel light shielding unit 181 arranged between the second photoelectric conversion unit 102 and the first photoelectric conversion unit 101, in at least the region where the second on-chip lens 152 and the first on-chip lens 151 come closest to each other.

In the layout illustrated in FIG. 22, similarly to the layout illustrated in FIG. 19, a void portion where no on-chip lens is arranged is caused between the first on-chip lens 151 provided in each pixel and the first on-chip lens 151 provided in an adjacent pixel. Then, in FIG. 22, the light reducing filter 351 is arranged to avoid below the void portion between the two first on-chip lenses 151.

In other words, the light reducing filter 351 illustrated in FIG. 22 is formed in an approximately quadrangular shape, but the vertexes (corners) thereof are formed in arc shapes, and the light reducing filter 351 does not extend in the void portion where no on-chip lens exists.

FIG. 23 illustrates a layout in which the shape of the light reducing filter 351 that covers the second photoelectric conversion unit 102 is a circular or elliptical shape, and the light reducing filter 351 is not arranged in the void portion where no on-chip lens exists between the two first on-chip lenses provided in adjacent two pixels.

In the layout illustrated in FIG. 23, the light reducing filter 351 arranged above the second photoelectric conversion unit 102 extends up to the outside of the quadrangle illustrated by the two-dot chain line, in at least the region where the second on-chip lens 152 and the first on-chip lens 151 come closest to each other, similarly to the layouts illustrated in FIGS. 17 and 19.

In other words, the light reducing filter 351 arranged above the second photoelectric conversion unit 102 extends in a direction of the first photoelectric conversion unit 101 with respect to the center in the width direction of the belt-shaped inter-pixel light shielding unit 181 arranged between the second photoelectric conversion unit 102 and the first photoelectric conversion unit 101, in at least the region where the second on-chip lens 152 and the first on-chip lens 151 come closest to each other.

In the layout illustrated in FIG. 23, similarly to the layout illustrated in FIG. 19, a void portion where no on-chip lens is arranged is caused between the first on-chip lens 151 provided in each pixel and the first on-chip lens 151 provided in an adjacent pixel. Then, in FIG. 23, the light reducing filter 351 is arranged to avoid below the void portion between the two first on-chip lenses 151.

In other words, the light reducing filter 351 illustrated in FIG. 23 is formed in an approximately circular or elliptical shape, and has a shape not extending in the void portion where no on-chip lens exists.

FIG. 24 illustrates a planar layout in which the shape of the light reducing filter 351 that covers the second photoelectric conversion unit 102 is approximately the same as the quadrangle, and the vertex of the quadrangle is arranged in the region where the second on-chip lens 152 and the first on-chip lens 151 come closest to each other, whereby the light reducing filter 351 is not arranged in the void portion where no on-chip lens exists between the two first on-chip lenses 151 provided in adjacent two pixels.

In the layout illustrated in FIG. 24, the light reducing filter 351 arranged above the second photoelectric conversion unit 102 has a shape in which at least a part of the light reducing filter 351 extends up to the outside of the quadrangle illustrated by the two-dot chain line, in at least the region where the second on-chip lens 152 and the first on-chip lens 151 come closest to each other, similarly to the layouts illustrated in FIGS. 17 and 19.

In other words, the light reducing filter 351 arranged above the second photoelectric conversion unit 102 has a shape having a part extending in a direction of the first photoelectric conversion unit 101 with respect to the center in the width direction of the belt-shaped inter-pixel light shielding unit 181 arranged between the second photoelectric conversion unit 102 and the first photoelectric conversion unit 101, in at least the region where the second on-chip lens 152 and the first on-chip lens 151 come closest to each other.

In the layout illustrated in FIG. 24, similarly to the layout illustrated in FIG. 19, a void portion where no on-chip lens is arranged is caused between the first on-chip lens 151 provided in each pixel and the first on-chip lens 151 provided in an adjacent pixel. Then, in FIG. 24, the light reducing filter 351 is arranged to avoid below the void portion between the two first on-chip lenses 151.

In other words, the light reducing filter 351 illustrated in FIG. 24 is formed in an approximately quadrangular shape, and has a shape not existing in the void portion where no on-chip lens exists.

Note that the layout illustrated in FIGS. 22 to 24 has been described using the layout in which the void portion exists between the two first photoelectric conversion units 101, in other words, the layout in which the area of the second photoelectric conversion unit 102 is made large, similar to the layout illustrated in FIG. 19. However, the present layout can be applied to the layout illustrated in FIG. 17.

In other words, the shape and arrangement of the light reducing filter 351 illustrated in FIGS. 19 and 22 to 24 can be applied to the layout in which no void portion exists between the two first photoelectric conversion units 101, as illustrated in FIG. 17.

In any of FIGS. 19 and 22 to 24, the light reducing filter 351 is arranged to extend in a direction of the first photoelectric conversion unit 101 with respect to a center in a width direction of the belt-shaped inter-pixel light shielding unit 181 arranged between the second photoelectric conversion unit 102 and the first photoelectric conversion unit 101, in at least a region where the second on-chip lens and the first on-chip lens come closest to each other.

Further, in any of FIGS. 19 and 22 to 24, the void portion where no on-chip lens exists has a shape without the light reducing filter 351.

With the configuration, the effects of reducing color mixture from the second on-chip lens 152 to the first photoelectric conversion unit 101, which has a greater adverse effect due to color mixture, and the effects of preventing another product for which dry etching processing other than etch-back of an on-chip lens is performed in an etch-back device used in formation of an on-chip lens from being contaminated by the inclusion of the light reducing filter 351 are brought about.

Arrangement Position of Light Reducing Filter

In the above-described second embodiment, the CMOS image sensor 10 provided with the light reducing filter 351 has been described, and the case in which the light reducing filter 351 is arranged between the color filter 201 and the second on-chip lens 152 in the structure in the cross-sectional direction has been described as an example.

Arrangement of the light reducing filter 351 is not limited to between the color filter 201 and the second on-chip lens 152, and the light reducing filter 351 may be arranged as described with reference to FIGS. 25 to 27.

Figure 25:
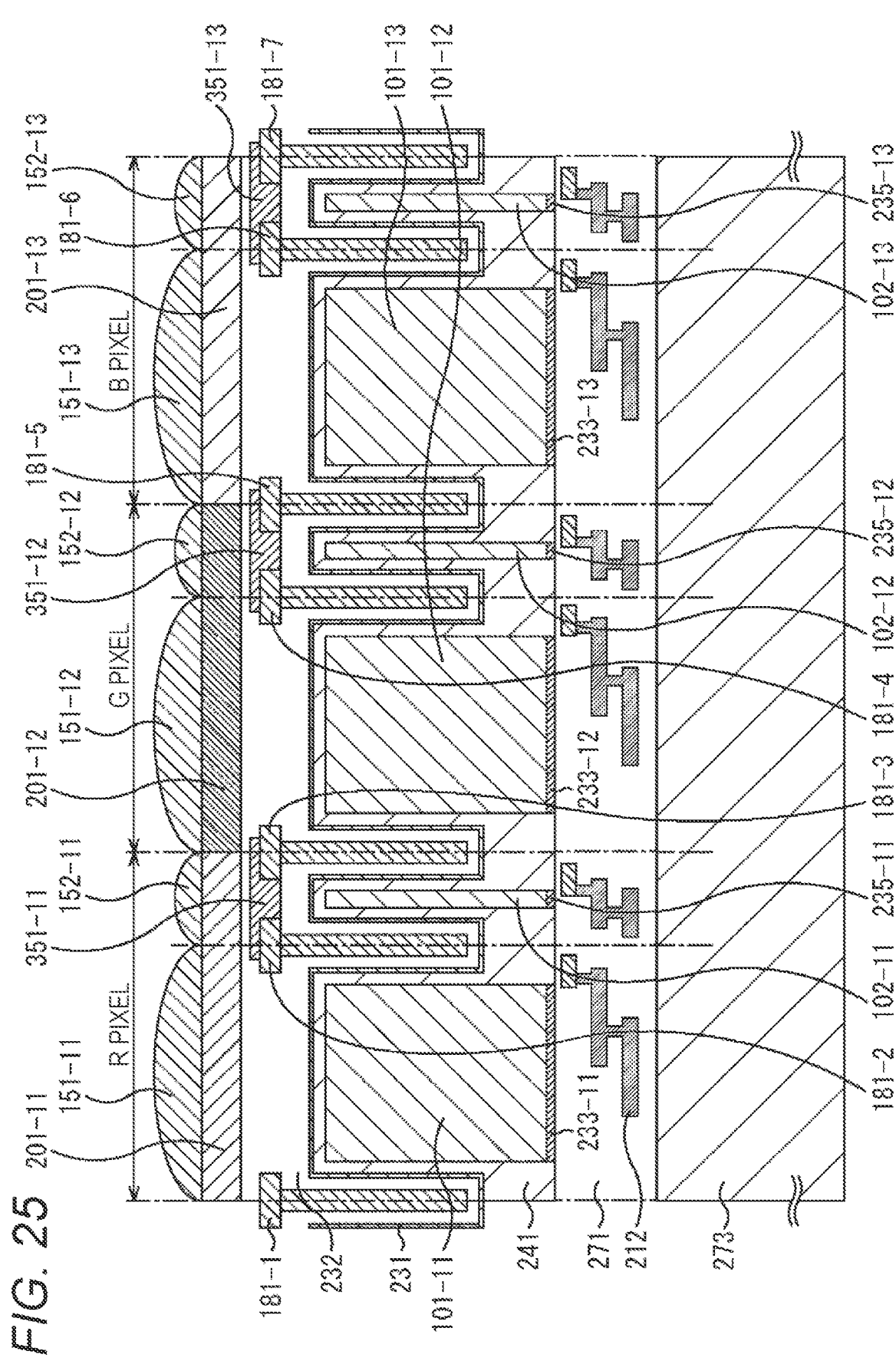
FIG. 25 is a diagram illustrating another structure of the unit pixel in the second embodiment.
Figure 26:
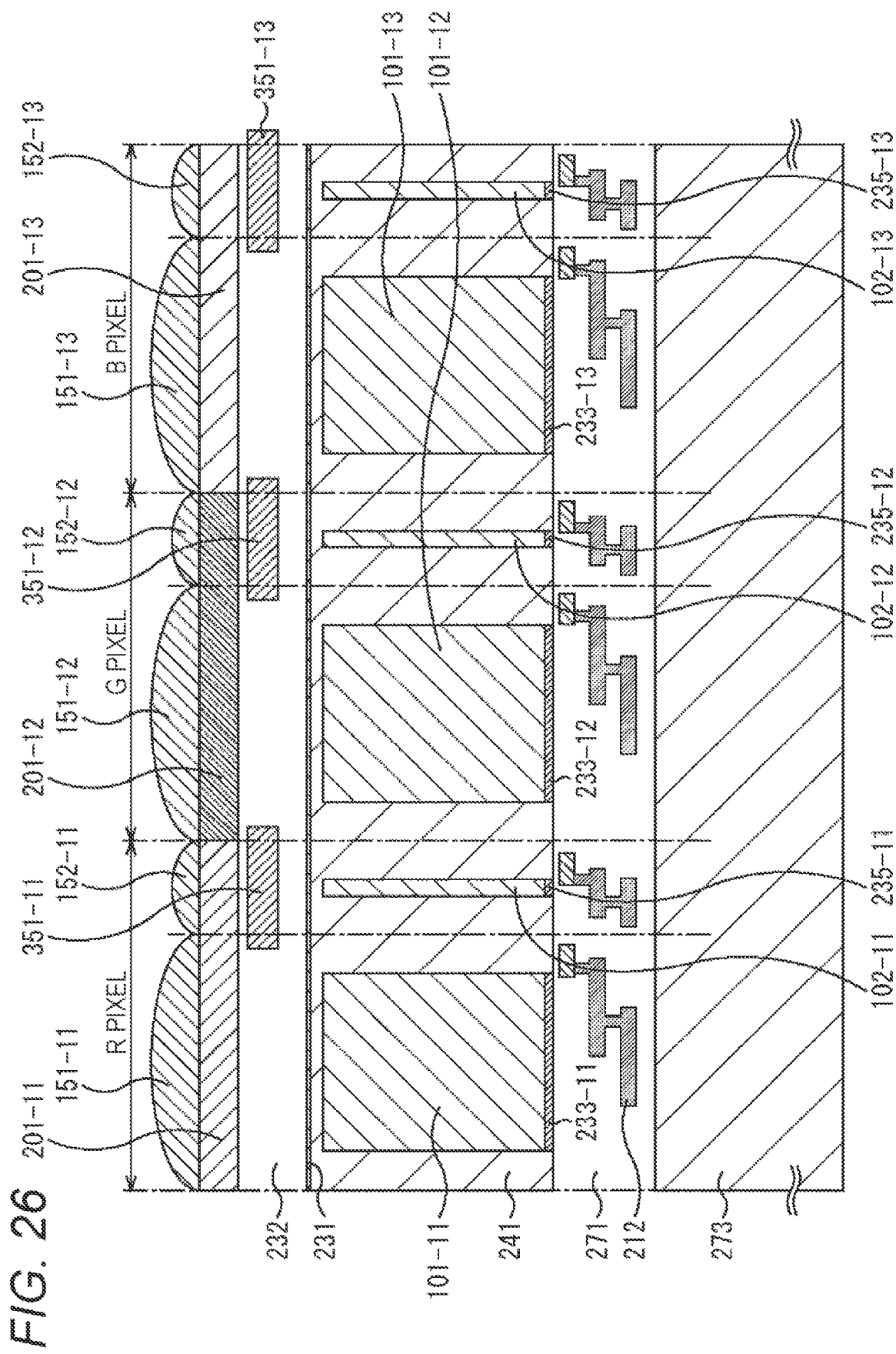
FIG. 26 is a diagram illustrating another structure of the unit pixel in the second embodiment.
Figure 27:
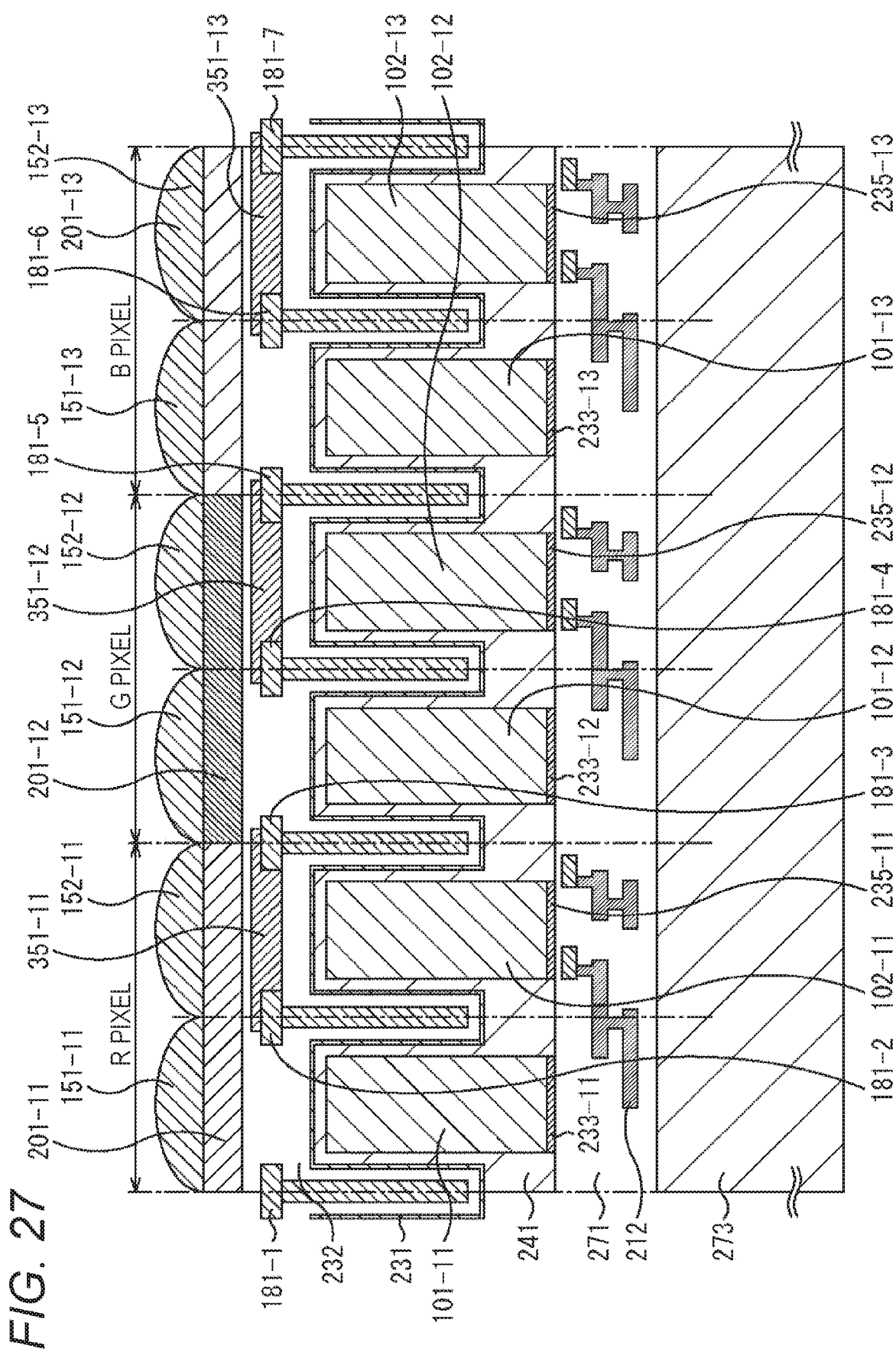
FIG. 27 is a diagram illustrating still another structure of the unit pixel in the second embodiment.

FIGS. 25 to 27 illustrate modifications of the CMOS image sensor 10 using the light reducing filter 351. The configuration of the CMOS image sensor 10 illustrated in each of FIGS. 25 to 27 is basically similar to that of the CMOS image sensor 10 illustrated in FIGS. 10 and 18, except for the light reducing filter 351, and thus is denoted by similar reference numerals, and description thereof is omitted.

In the CMOS image sensor 10 illustrated in FIG. 25, the light reducing filter 351 is arranged under the color filter 201, and is arranged between the color filter 201 and the inter-pixel light shielding unit 181.

Even in a case where the light reducing filter 351 is arranged under the color filter 201 in this way, light transmitted through the second on-chip lens 152 and entering the second photoelectric conversion unit 102 becomes light transmitted through the light reducing filter 351, and thus the light entering the second photoelectric conversion unit 102 becomes reduced light. Therefore, the effects of further expanding a range of illuminance of an object to capture an image having a gradation property, in other words, capturing an image with a wider dynamic range can be brought about, similarly to the above case.

The CMOS image sensor 10 illustrated in FIG. 26 has a configuration in which no inter-pixel light shielding unit 181 is formed. The CMOS image sensor 10 illustrated in FIG. 26 has basically a similar configuration to the CMOS image sensor 10 illustrated in FIG. 25. However, the CMOS image sensor 10 illustrated in FIG. 26 is different in the configuration in which the inter-pixel light shielding unit 181 is deleted from the CMOS image sensor 10 illustrated in FIG. 25.

In the CMOS image sensor 10 illustrated in FIG. 26, the light reducing filter 351 is arranged under the color filter 201, and is arranged between the color filter 201 and the inter-pixel light shielding unit 181.

Even in a case where the light reducing filter 351 is arranged under the color filter 201 in this way, light transmitted through the second on-chip lens 152 and entering the second photoelectric conversion unit 102 becomes light transmitted through the light reducing filter 351, and thus the light entering the second photoelectric conversion unit 102 becomes reduced light.

Even if light from the second on-chip lens 152 is leaked into the first photoelectric conversion unit 101 adjacent to the second photoelectric conversion unit 102, the light is light reduced by the light reducing filter 351. Therefore, even if light is leaked into the first photoelectric conversion unit 101, the influence is small. From the above point, even in the configuration where no inter-pixel light shielding unit 181 is formed, as illustrated in FIG. 26, the influence due to leakage of light can be suppressed by including the light reducing filter 351.

Furthermore, although not illustrated, a configuration in which the inter-pixel light shielding unit 181 is not formed in the CMOS image sensor 10 illustrated in FIG. 18, in which the light reducing filter 351 is formed on the color filter 201, for example, can be applied. In other words, the CMOS image sensor 10 in which no inter-pixel light shielding unit 181 is formed, and in which the light reducing filter 351 is formed on the color filter 201 (between the color filter 201 and the second on-chip lens 152) may be used.

Even in such a configuration, the effects of further expanding a range of illuminance of an object to capture an image having a gradation property, in other words, capturing an image with a wider dynamic range can be brought about, similarly to the above case.

In the above-described embodiment, the configuration in which the light receiving area of the photodiode is made larger in the first photoelectric conversion unit 101 than in the second photoelectric conversion unit 102 in order to provide a difference in sensitivity between the first photoelectric conversion unit 101 and the second photoelectric conversion unit 102 has been described as an example. Furthermore, the example provided with the light reducing filter 351 in order to make the difference in sensitivity between the first photoelectric conversion unit 101 and the second photoelectric conversion unit 102 larger has been described.

In a case where the CMOS image sensor 10 has the configuration provided with the light reducing filter 351 to provide the difference in sensitivity between the first photoelectric conversion unit 101 and the second photoelectric conversion unit 102, the configuration illustrated in FIG. 27 can be employed.

In the CMOS image sensor 10 illustrated in FIG. 27, the light receiving areas of the photodiodes of the first photoelectric conversion unit 101 and the second photoelectric conversion unit 102 are equally configured. Furthermore, since the light receiving areas of the photodiodes of the first photoelectric conversion unit 101 and the second photoelectric conversion unit 102 are equally configured, for example, there are changes in sizes and the like in the accompanying portions, such as the first on-chip lens 151 and the second on-chip lens 152 having the same size. However, the basic configuration is similar to that of the CMOS image sensor 10 illustrated in FIG. 25 or the like.

In the CMOS image sensor 10 illustrated in FIG. 27, the light reducing filter 351 is arranged under the color filter 201, and is arranged between the color filter 201 and the inter-pixel light shielding unit 181, as in the CMOS image sensor 10 illustrated in FIG. 25.

Even in a case where the light reducing filter 351 is arranged under the color filter 201 in this way, light transmitted through the second on-chip lens 152 and entering the second photoelectric conversion unit 102 becomes light transmitted through the light reducing filter 351, and thus the light entering the second photoelectric conversion unit 102 becomes reduced light.

Therefore, even in a case where the light receiving areas of the photodiodes of the first photoelectric conversion unit 101 and the second photoelectric conversion unit 102 are equally configured, the difference in sensitivity can be given between the first photoelectric conversion unit 101 and the second photoelectric conversion unit 102 by providing the light reducing filter 351 in the second photoelectric conversion unit 102.

Therefore, even in the CMOS image sensor 10 as illustrated in FIG. 27, the effects of further expanding a range of illuminance of an object to capture an image having a gradation property, in other words, capturing an image with a wider dynamic range can be brought about, similarly to the above case.

Third Embodiment

Next, a third embodiment to which present technology is applied will be described. The third embodiment to which the present technology is applied further includes means for reducing light having entered a second on-chip lens 152 before reaching a second photoelectric conversion unit 102, in addition to the first embodiment, similarly to the second embodiment.

With the configuration, effects of further expanding a range of illuminance of an object to capture an image having a gradation property, in other words, capturing an image with a wider dynamic range is brought about.

In the third embodiment, as the means for reducing light having entered a second on-chip lens 152 before reaching a second photoelectric conversion unit 102, an optical diaphragm that reduces the cross-sectional area of light flux passing through the diaphragm, using a light shielding member that shields light is provided.

Note that the same configuration portion between the third embodiment and the first embodiment is denoted by the same reference numeral and detailed description thereof is omitted unless otherwise specified.

A circuit illustrating a configuration of a unit pixel 100 in the third embodiment is the circuit diagram illustrated in FIG. 4. Furthermore, a planar layout of the unit pixel 100 in the third embodiment is the planar layout of the first embodiment illustrated in FIGS. 5 to 9, except for addition of the optical diaphragm to be described below (except for a portion related to the optical diaphragm), and thus description thereof is omitted.

Figure 28:
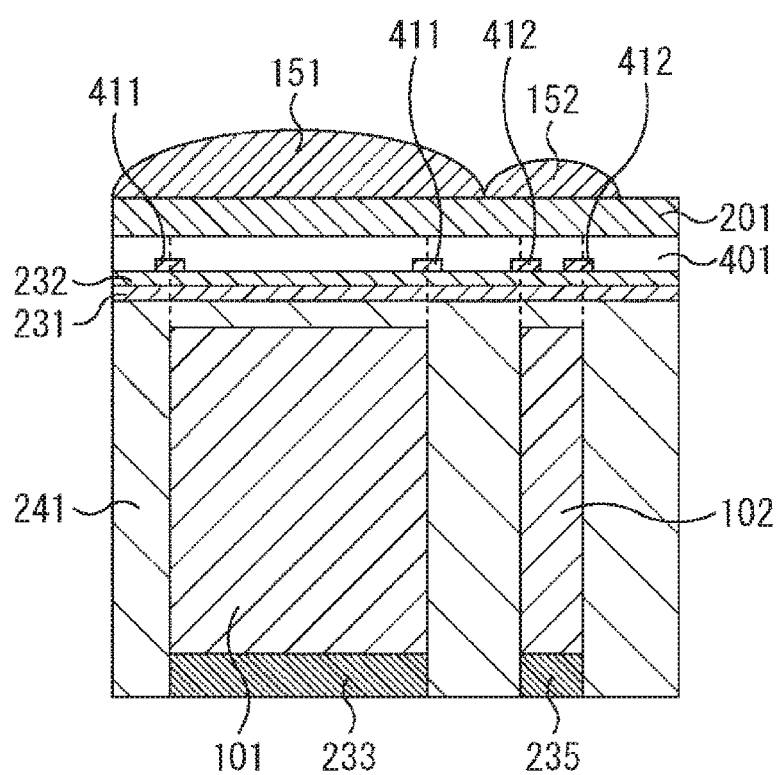
FIG. 28 is a diagram illustrating a structure of a unit pixel in a third embodiment.

FIG. 28 is a schematic diagram of a cross section related to the unit pixel 100 in the third embodiment. The unit pixel 100 in the third embodiment has a structure including a first photoelectric conversion unit 101, a second photoelectric conversion unit 102, a first on-chip lens 151 and a second on-chip lens 152 respectively formed on the first photoelectric conversion unit 101 and the second photoelectric conversion unit 102, and a color filter 201 arranged between the photoelectric conversion unit and the on-chip lens.

Furthermore, the first photoelectric conversion unit 101 and the second photoelectric conversion unit 102 of the unit pixel 100 are formed as n-type impurity regions in a P-well silicon substrate 241, and a P-type pinning region 233 is formed under the first photoelectric conversion unit 101, and a P-type pinning region 235 is formed under the second photoelectric conversion unit 102.

Furthermore, a wiring layer, a support substrate, and the like (not illustrated) are also arranged under the silicon substrate 241. Furthermore, a film having a negative charge (pinning film 231) and an insulating film 232 are formed between the color filter 201 and the upper side of the silicon substrate 241. Moreover, a planarization film 401 is formed between the insulating film 232 and the color filter 201, and a light shielding film 411 and a light shielding film 412 for realizing the optical diaphragm are formed in the planarization film 401.

Note that the planarization film 401 can be formed by the same material as the insulating film 232, and may be formed as the insulating film 232.

As described above, the unit pixel 100 according to the third embodiment includes the light shielding film 411 between the first photoelectric conversion unit 101 and the first on-chip lens 151, and the light shielding film 412 between the second photoelectric conversion unit 102 and the second on-chip lens 152.

The light shielding film 411 provided on the first photoelectric conversion unit 101 has a function to mainly prevent leakage of light from the adjacent second photoelectric conversion unit 102 (the second on-chip lens 152) and leakage of light to the second photoelectric conversion unit 102.

Similarly, the light shielding film 412 provided on the second photoelectric conversion unit 102 has a function to prevent leakage of light from the adjacent first photoelectric conversion unit 101 (the first on-chip lens 151) and leakage of light to the first photoelectric conversion unit 101.

Moreover, the light shielding film 412 provided on the second photoelectric conversion unit 102 has a function to restrict incidence of light to the second photoelectric conversion unit 102, in other words, a function to reduce light. The light shielding film 411 and the light shielding film 412 have different functions as described above, and the light shielding film 412 in particular has a function to restrict the amount of light to enter the second photoelectric conversion unit 102, and thus is appropriately described as optical diaphragm 412.

As described above, as illustrated in FIG. 28, the unit pixel 100 in the third embodiment is provided with the optical diaphragm 412 between the second photoelectric conversion unit 102 and the color filter 201 formed above the second photoelectric conversion unit 102.

The optical diaphragm 412 is an optical component that reduces the cross-sectional area of light flux passing through the diaphragm, using a light shielding member that shields light. The optical diaphragm 412 may be formed as a member constituting a part of an inter-pixel light shielding unit 181 of the unit pixel 100 illustrated in FIG. 10. In other words, a member may be provided between pixels (formed in a T shape as illustrated in FIG. 10), like the inter-pixel light shielding unit 181, and a part (a belt-shaped portion formed in a lateral direction in FIG. 10) of the member may be used as the optical diaphragm 412. Such a configuration can also be applied to the light shielding film 411 provided in the first photoelectric conversion unit 101.

The light shielding film 411 and the optical diaphragm 412 may be formed, respectively, by the same material as the inter-pixel light shielding unit 181 (FIG. 10) arranged around the first photoelectric conversion unit 101 and the second photoelectric conversion unit 102. Alternatively, the light shielding film 411 and the optical diaphragm 412 may be formed using material different from the inter-pixel light shielding unit 181.

In the third embodiment, a ratio in which the light having entered the second on-chip lens 152 is shielded by the optical diaphragm 412 before reaching the second photoelectric conversion unit 102 is made larger than a ratio in which the light having entered the first on-chip lens 151 is shielded by the light shielding film 411 before reaching the first photoelectric conversion unit 101.

As illustrated in FIG. 28, a ratio of an area in which the optical diaphragm 412 (shielding material) is arranged on the second photoelectric conversion unit 102 to a plane area of the second photoelectric conversion unit 102 is larger than a ratio of an area in which the light shielding film 411 (shielding material) is arranged on the first photoelectric conversion unit 101 to a plane area of the first photoelectric conversion unit 101.

As a result, the second photoelectric conversion unit 102 brings about the effects of capturing an image having a gradation property over a wider illuminance range, in other words, capturing an image with a wider dynamic range, than a case not provided with the optical diaphragm 412, while the first photoelectric conversion unit 101 maintains the characteristic of capturing an image with high sensitivity.

Figure 29:
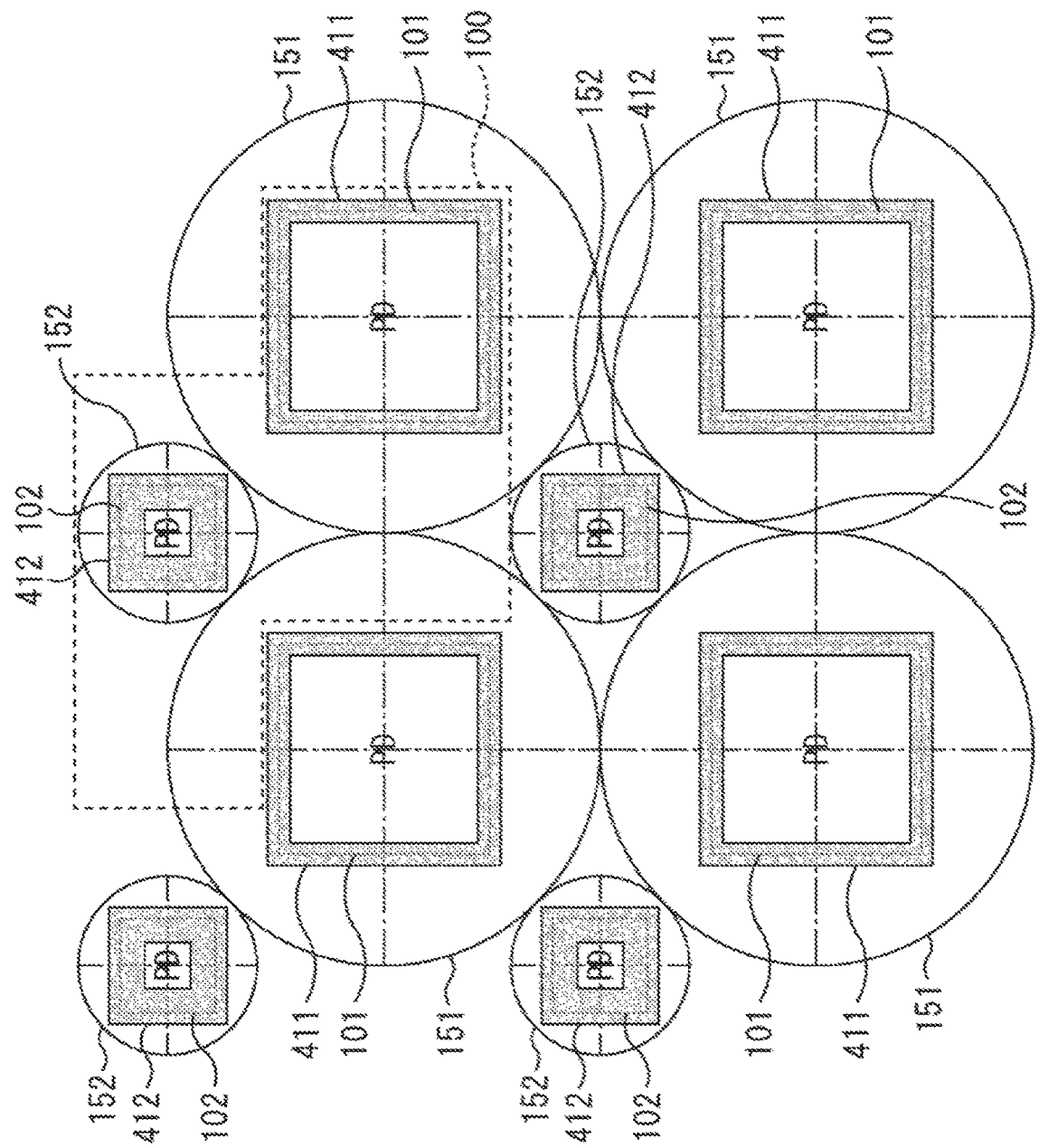
FIG. 29 is a diagram illustrating a structure of an optical diaphragm.

FIG. 29 is a planar layout diagram related to the unit pixel 100 in the third embodiment illustrated in FIG. 28. Further, the planar layout of the unit pixel 100 illustrated in FIG. 29 is a layout in which the light shielding film 411 and the optical diaphragm 412 are added to the planar layout of the unit pixel 100 in the first embodiment illustrated in FIG. 6.

The planar layout of the unit pixel 100 illustrated in FIG. 29 illustrates a planar layout of the optical diaphragm 412 arranged above the second photoelectric conversion unit 102, in addition to the planar layout of the first photoelectric conversion unit 101, the second photoelectric conversion unit 102, the first on-chip lens 151, and the second on-chip lens 152 on a first surface.

In FIG. 29, the optical diaphragm 412 is arranged above the second photoelectric conversion unit 102. Furthermore, in FIG. 29, a ratio of an area in which the optical diaphragm 412 (shielding material) is arranged on the second photoelectric conversion unit 102 to a plane area of the second photoelectric conversion unit 102 is larger than a ratio of an area in which the light shielding film 411 (shielding material) is arranged on the first photoelectric conversion unit 101 to a plane area of the first photoelectric conversion unit 101.

As a result, the second photoelectric conversion unit 102 can capture an image having a gradation property over a wider illuminance range, in other words, can capture an image with a wider dynamic range, than a case not provided with the optical diaphragm 412, while the first photoelectric conversion unit 101 maintains the characteristic of capturing an image with high sensitivity.

The shape of an outer peripheral portion of the optical diaphragm 412 illustrated in FIG. 29 is a shape arranged to follow an outer edge of the second photoelectric conversion unit 102. Further, an opening shape of the optical diaphragm 412 illustrated in FIG. 29 is approximately the same as a shape obtained by reducing the outer edge of the second photoelectric conversion unit 102.

The shape of the optical diaphragm 412 is not limited to the shape as illustrated in FIG. 29, and may be another shape. For example, the shape illustrated in FIG. 30 may be employed.

Figure 30:
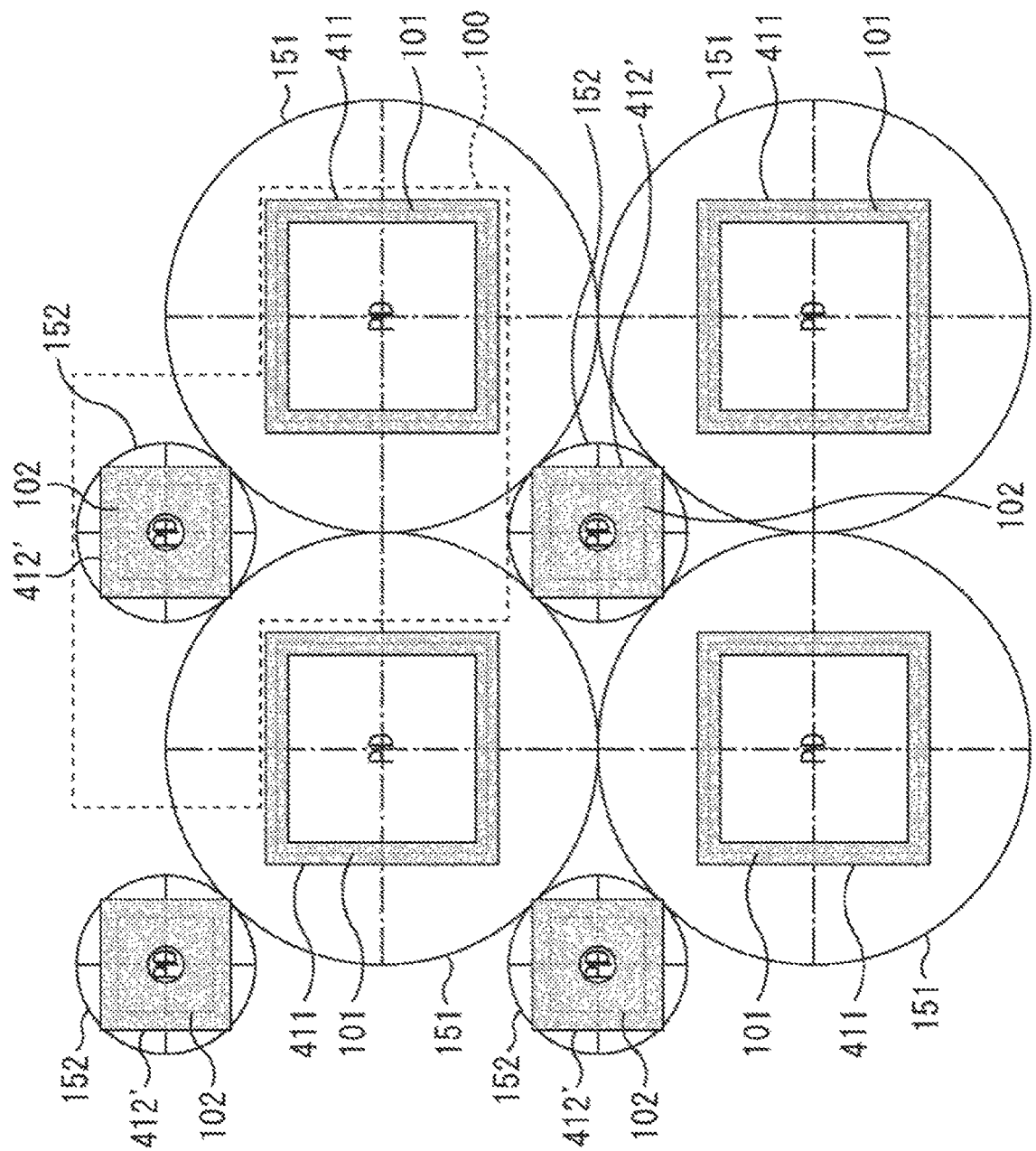
FIG. 30 is a diagram illustrating another structure of the optical diaphragm.

FIG. 30 illustrates a modification of the planar layout of the optical diaphragm 412. FIG. 30 illustrates a planar layout of an optical diaphragm 412' arranged above the second photoelectric conversion unit 102, in addition to the planar layout of the first photoelectric conversion unit 101, the second photoelectric conversion unit 102, the first on-chip lens 151, and the second on-chip lens 152 on a first surface, similarly to FIG. 29.

The shape of an outer peripheral portion of the optical diaphragm 412' illustrated in FIG. 30 is a shape arranged to follow the outer edge of the second photoelectric conversion unit 102, as in the shape of the outer peripheral portion of the optical diaphragm 412 in FIG. 29. The opening shape of the optical diaphragm 412' illustrated in FIG. 30 is an approximately circular shape.

Even when the planar layout of the optical diaphragm 412' has the shape illustrated in FIG. 30, similar effects as that of the optical diaphragm 412 illustrated in FIG. 29 is brought about.

Figure 31:
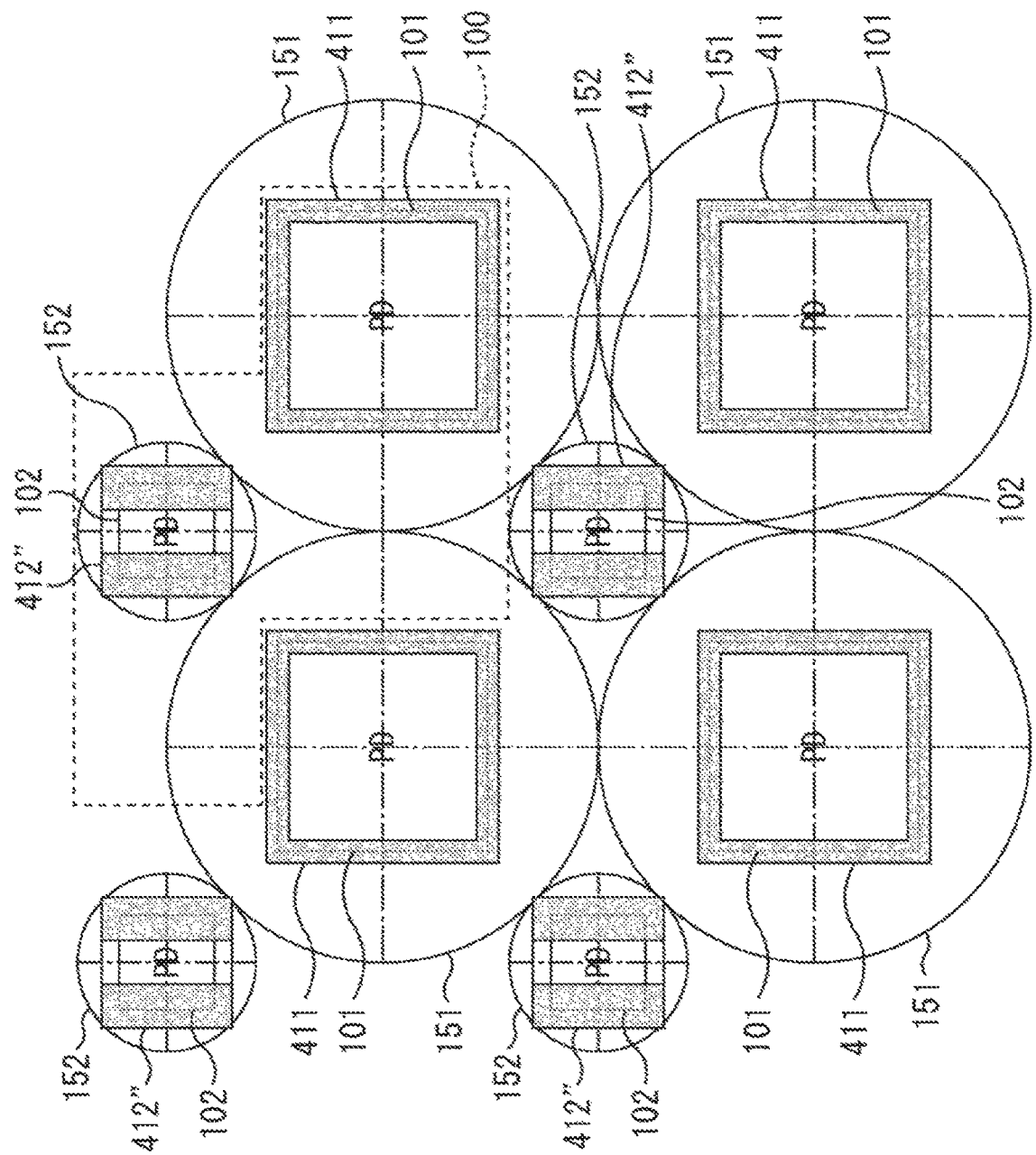
FIG. 31 is a diagram illustrating still another structure of the optical diaphragm.

FIG. 31 illustrates another modification of the planar layout of the optical diaphragm 412. FIG. 31 illustrates a planar layout of an optical diaphragm 412" arranged above the second photoelectric conversion unit 102, in addition to the planar layout of the first photoelectric conversion unit 101, the second photoelectric conversion unit 102, the first on-chip lens 151, and the second on-chip lens 152 on a first surface, similarly to FIG. 29.

The optical diaphragm 412" does not necessarily have a light shielding material arranged over the entire outer edge of the second photoelectric conversion unit 102. An example is illustrated in FIG. 31. The shape of the optical diaphragm 412" illustrated in FIG. 31 is a shape in which the light shielding material is not arranged in a part of the outer edge of the second photoelectric conversion unit 102. Further, the shape of the optical diaphragm 412" illustrated in FIG. 31 is a shape in which the width of the light shielding material arranged in the outer edge of the second photoelectric conversion unit 102 is not necessarily a constant width.

The shape of the optical diaphragm 412" illustrated in FIG. 31 is a shape in which a quadrangular opening portion is provided in a center portion and rectangular light shielding materials are arranged on both ends.

Even if the shape of the optical diaphragm 412" is not arranged in a part of the outer edge of the second photoelectric conversion unit 102, as illustrated in FIG. 31, furthermore, even if the width of the optical diaphragm 412" is not a constant width, similar effects can be brought about to the case provided with the optical diaphragm 412 illustrated in FIG. 29, when a ratio of an area where the optical diaphragm 412", that is, the light shielding material is arranged on the second photoelectric conversion unit 102 to the plane area of the second photoelectric conversion unit 102 is larger than a ratio of an area in which the light shielding film 411, that is, the light shielding material is arranged on the first photoelectric conversion unit 101 to the plane area of the first photoelectric conversion unit 101.

Fourth Embodiment

In the second and third embodiments, the structure to make the difference in sensitivity between the first photoelectric conversion unit 101 and the second photoelectric conversion unit 102 large by providing the light reducing filter 351 or by providing the optical diaphragm 412 has been described.

In a fourth embodiment, a structure to make a difference in sensitivity between a first photoelectric conversion unit 101 and a second photoelectric conversion unit 102 larger by changing the shape of an on-chip lens will be described.

Figure 32:
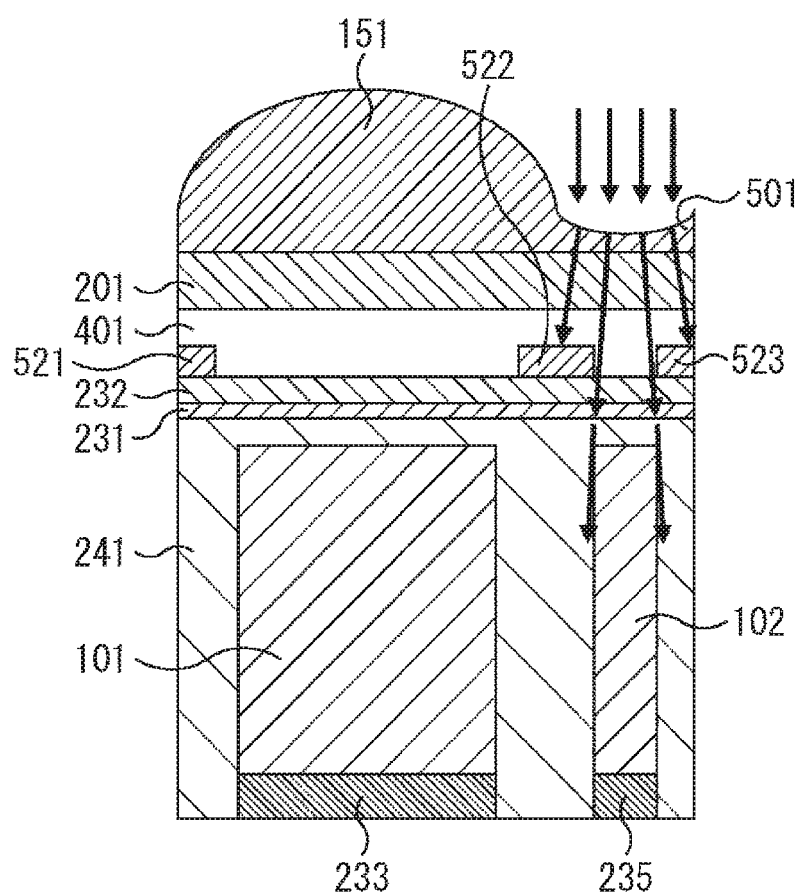
FIG. 32 is a diagram illustrating a structure of a unit pixel in a fourth embodiment.
Figure 33:
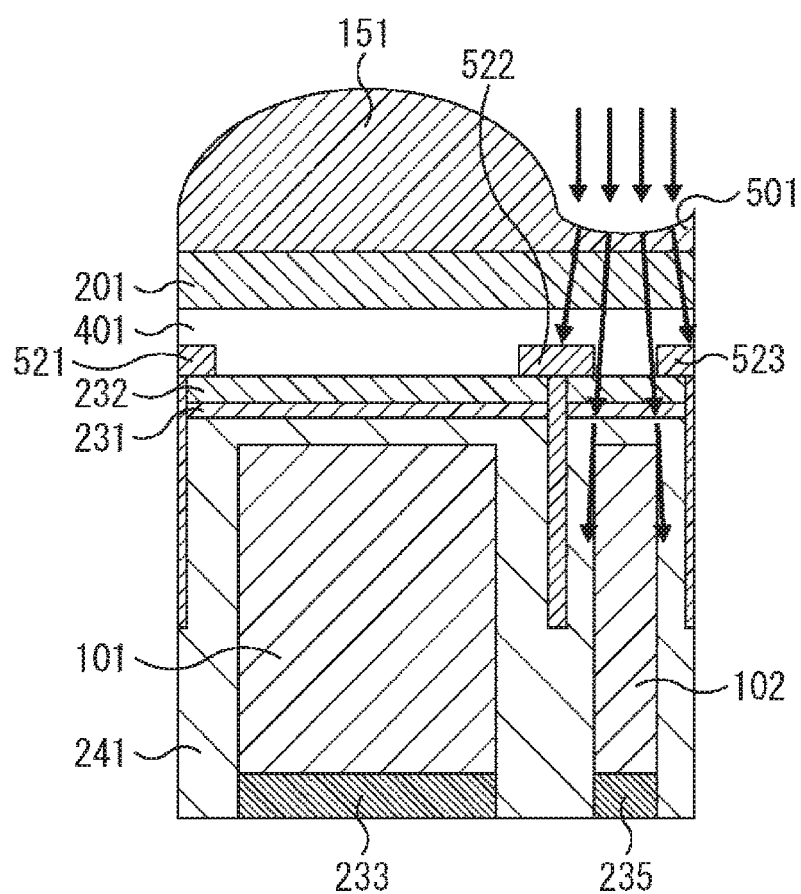
FIG. 33 is a diagram illustrating another structure of the unit pixel in the fourth embodiment.
Figure 34:
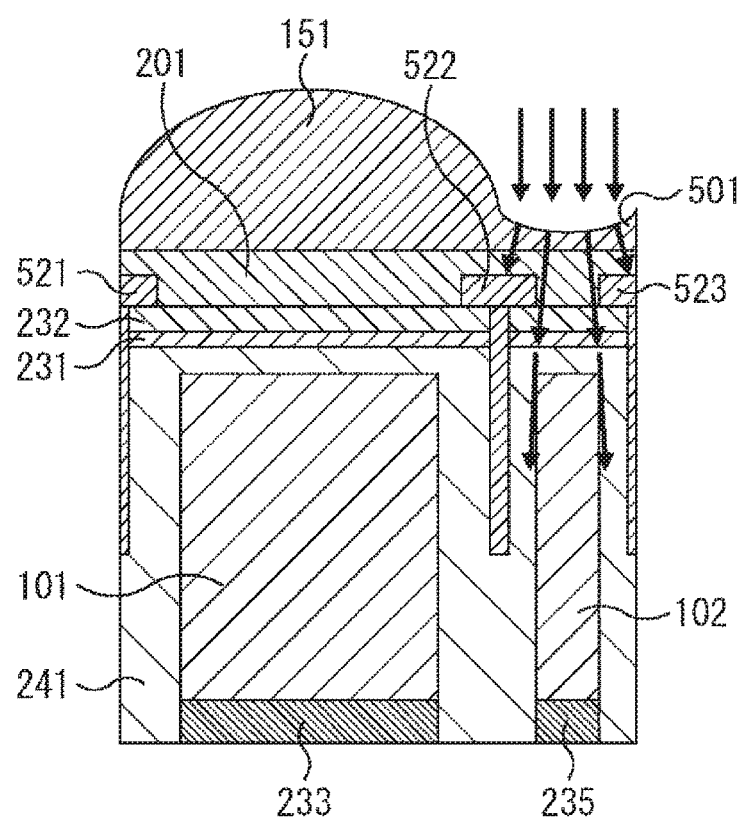
FIG. 34 is a diagram illustrating still another structure of the unit pixel in the fourth embodiment.

FIGS. 32 to 34 are diagrams illustrating a configuration of a unit pixel 100 in the fourth embodiment. The configuration of the unit pixel 100 illustrated in FIGS. 32 to 34 is basically similar to the configuration of the unit pixel 100 illustrated in FIG. 10 or 28, for example, and thus the same portion is denoted with the same reference numerals and description thereof is omitted.

In FIGS. 32 to 34, in the unit pixel 100 in the fourth embodiment, a second on-chip lens 152 arranged above the second photoelectric conversion unit 102 is a second on-chip lens 501 in which the shape is a downward convex shape, in other words, a recessed shape.

Referring to FIG. 32, the second on-chip lens 501 having a recessed shape is formed on the second photoelectric conversion unit 102. By forming the second on-chip lens 501 into a recessed shape, the amount of light to enter the second photoelectric conversion unit 102 can be decreased, in other words, the light can be reduced.

Therefore, as in the first to third embodiments, a difference in sensitivity can be given between the first photoelectric conversion unit 101 and the second photoelectric conversion unit 102. Furthermore, as in the second and third embodiments, the difference in sensitivity between the first photoelectric conversion unit 101 and the second photoelectric conversion unit 102 can be made larger.

Even in such a configuration, the effects of further expanding a range of illuminance of an object to capture an image having a gradation property, in other words, capturing an image with a wider dynamic range can be brought about, similarly to the above case.

Furthermore, with such a configuration, effects of suppressing occurrence of ripples can be obtained.

Referring back to FIG. 32, in a case where the second on-chip lens 501 having a recessed shape is formed, while the light having entered the second on-chip lens 501 tends to diverge and thus the light to enter the second photoelectric conversion unit 102 can be reduced, there is a possibility that the diverging light enters the adjacent first photoelectric conversion unit 101.

Therefore, to prevent such leakage of light, light shielding portions 521 to 523 are provided between the photoelectric conversion units. In the unit pixel 100 illustrated in FIG. 32, the light shielding portions 521 to 523 are arranged between the first photoelectric conversion unit 101 and the second photoelectric conversion unit 102. By providing the light shielding portions 521 to 523, the light transmitted through the second on-chip lens 501 and having diverged can be shielded by the light shielding portions 521 to 523, and thus leakage of light into the first photoelectric conversion unit 101 can be prevented.

For example, the light shielding film 411 and the optical diaphragm 412 (for example, FIG. 28) described as the third embodiment can be applied to the light shielding portions 521 to 523. Furthermore, the light reducing filter 351 described as the second embodiment can be formed on or under the color filter 201, as in the second embodiment. In other words, the second to fourth embodiments can be applied in combination.

FIG. 33 is a diagram illustrating another configuration of the unit pixel 100 provided with the second on-chip lens 501 having a recessed shape. The unit pixel 100 illustrated in FIG. 33 has a configuration in which an inter-pixel light shielding unit 181 is added as the light shielding portions 521 to 523 to the unit pixel 100 illustrated in FIG. 32.

With the configuration to add the light shielding portions 521 to 523 having a similar shape to the inter-pixel light shielding unit 181, the light transmitted through the second on-chip lens 501 and having diverged can be shielded by the inter-pixel light shielding unit 181. Therefore, leakage of light to the first photoelectric conversion unit 101 can be further prevented.

FIG. 34 is a diagram illustrating another configuration of the unit pixel 100 provided with the second on-chip lens 501 having a recessed shape. The unit pixel 100 illustrated in FIG. 34 has a configuration in which a planarization film 401 is removed from the unit pixel 100 illustrated in FIG. 33. Furthermore, with the removal of the planarization film 401, the inter-pixel light shielding unit 181 (light shielding portions 521 to 523) is formed in the color filter 201 (on an inter-layer insulating film 232).

With the configuration of removal of the planarization film 401, the distance from the second on-chip lens 501 to the second photoelectric conversion unit 102 becomes short. With the shorted distance from the second on-chip lens 501 to the second photoelectric conversion unit 102, light diverging after being transmitted through the second on-chip lens 501 and entering the first photoelectric conversion unit 101 can be reduced. Furthermore, by providing the inter-pixel light shielding unit 181 (light shielding portions 521 to 523) as in the unit pixel 100 illustrated in FIG. 33, leakage of light to the first photoelectric conversion unit 101 can be further prevented.

The first on-chip lens 151 and the second on-chip lens 501 may be configured by the same material or by different materials. Furthermore, as the material, material having a high refractive index, for example, inorganic material SiN (silicon nitride or silicon nitride) or the like can be used.

Even in the fourth embodiment, an image with high sensitivity can be captured using the first photoelectric conversion unit 101 and an image with a wide dynamic range can be captured using the second photoelectric conversion unit 102.

These two images are synthesized into an image through image signal processing in the image signal processing circuit provided inside the CMOS image sensor 10 or in the image signal processing device externally connected to the CMOS image sensor 10. With the configuration, the effect of capturing an image having both high sensitivity and a wide dynamic range is brought about.

Color Arrangement of Color Filter

In the above-described embodiment, as the color arrangement of the color filter 201, the RGB Bayer arrangement as illustrated in FIG. 35A has been described as an example. In the color filter 201 illustrated in FIG. 35A, color filters of green (G)/red (R)/green (G)/blue (B) are arrayed in a so-called Bayer array in repeating units, using right and left and up and down 2×2 pixels as the repeating unit.

The application range of the present technology is not limited to the CMOS image sensor 10 having such color arrangement, and the present technology can be applied to another color arrangement. For example, in the color filter 201 illustrated in FIG. 35B, color filters of red (R)/green (G)/blue (B)/transparent (C) may be arrayed in repeating units, using the right and left and up and down 2×2 pixels as the repeating unit.

Further, in the color filter 201 illustrated in FIG. 35C, color filters of red (R)/transparent (C)/transparent (C)/transparent (C) may be arrayed in repeating units, using the right and left and up and down 2×2 pixels as the repeating unit.

Further, the present technology can be applied to another color arrangement (not illustrated).

In a pixel array in which a plurality of the unit pixels 100 illustrated in FIG. 4 is arranged in an array manner, even if any arrangement of these color filters is used as the arrangement of the color filters 201 provided in the unit pixels 100, the effects that the second photoelectric conversion unit 102 can capture an image having a gradation property over a wider illuminance range, in other words, can capture an image with a wider dynamic range, than a case not provided with the light reducing filter 351 or the optical diaphragm 412, while the first photoelectric conversion unit 101 maintains the characteristic of capturing an image with high sensitivity, can be obtained.

Use Examples of Imaging Device

{Imaging Device}

Figure 36:
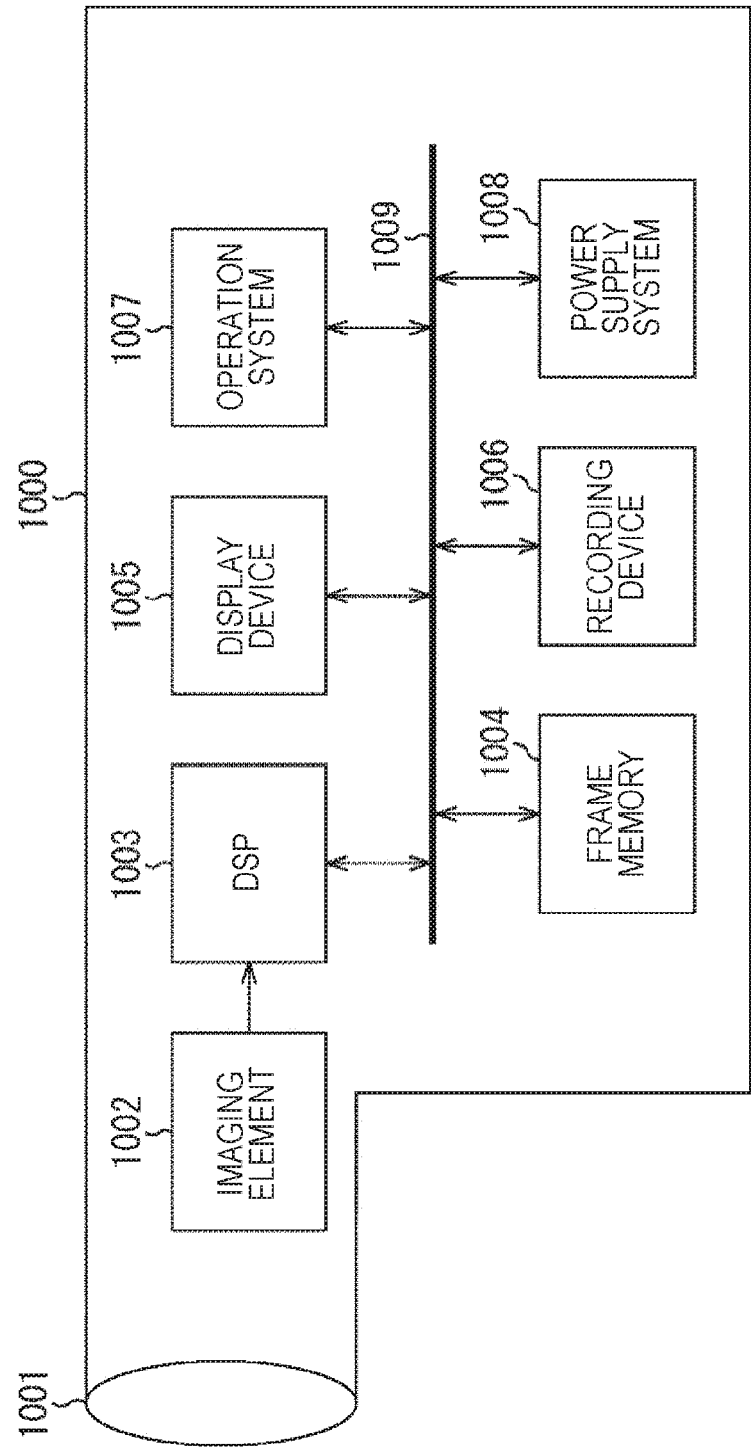
FIG. 36 is a diagram for describing a configuration of an imaging device.

FIG. 36 is a block diagram illustrating a configuration example of an imaging device (camera device) 1000 that is an example of an electronic device to which the present technology is applied.

As illustrated in FIG. 36, the imaging device 1000 includes an optical system including a lens group 1001 or the like, an imaging element 1002, a DSP circuit 1003 that is a camera signal processing unit, a frame memory 1004, a display device 1005, a recording device 1006, an operation system 1007, a power supply system 1008, and the like. Then, the DSP circuit 1003, the frame memory 1004, the display device 1005, the recording device 1006, the operation system 1007, and the power supply system 1008 are mutually connected through a bus line 1009.

The lens group 1001 takes in incident light (image light) from an object and forms an image on an imaging surface of the imaging element 1002. The imaging element 1002 converts a light amount of the incident light imaged on the imaging surface by the lens group 1001 into an electrical signal in pixel units and outputs the electrical signal as a pixel signal.

The display device 1005 is composed of a panel-type display device such as a liquid crystal display device, an organic electro luminescence (EL) display device, or the like, and displays a moving image or a still image imaged by the imaging element 1002. The recording device 1006 records a moving image or a still image imaged by the imaging element 1002 on a recording medium such as a memory card, a video tape, a digital versatile disk (DVD), or the like.

The operation system 1007 issues operation commands for various functions possessed by the imaging device 1000 under an operation by a user. The power supply system 1008 appropriately supplies various power supplies serving as operating power sources of the DSP circuit 1003, the frame memory 1004, the display device 1005, the recording device 1006, and the operation system 1007 to these supply targets.

Such an imaging device 1000 is applied to a video camera, a digital still camera, and a camera module for a mobile device such as a smartphone, a mobile phone, or the like. Then, in the imaging device 1000, the imaging device according to each of the above-described embodiments can be used as the imaging element 1002. With the configuration, the image quality of the imaging device 1000 can be improved.

{Configuration of Endoscope System}

The technology according to the present disclosure can be applied to various products. For example, the technology regarding to the present disclosure may be applied to an endoscopic surgical system. Here, an endoscopic surgical system will be described as an example. However, the present technology can also be applied to a surgical operation system, a microscopic surgery system, and the like.

Figure 37:
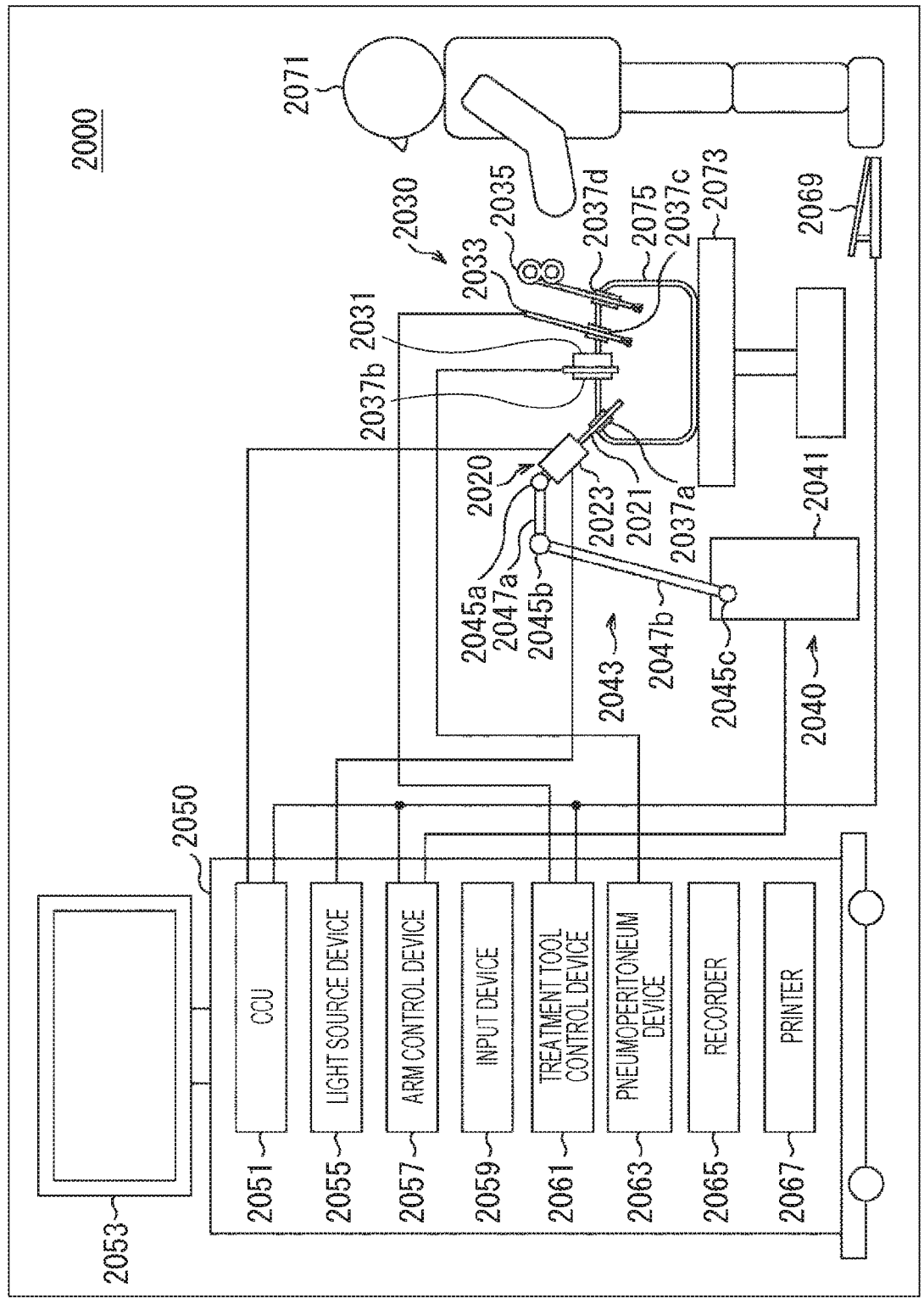
FIG. 37 is a diagram illustrating a configuration of an embodiment of an endoscopic surgical system to which the present technology is applied.

FIG. 37 is a diagram illustrating an example of a schematic configuration of an endoscopic surgical system 2000 to which the technology according to the present disclosure is applicable. FIG. 37 illustrates a state in which an operator (doctor) 2071 is performing an operation on a patient 2075 on a patient bed 2073, using the endoscopic surgical system 2000. As illustrated, the endoscopic surgical system 2000 includes an endoscope 2020, other surgical tools 2030, a support arm device 2040 that supports the endoscope 2020, and a cart 2050 in which various devices for endoscopic surgery are mounted.

In an endoscopic surgery, a plurality of cylindrical puncture devices called trocars 2037a to 2037d are punctured into an abdominal wall instead of cutting the abdominal wall and opening the abdomen. Then, a lens barrel 2021 of the endoscope 2020 and other surgical tools 2030 are inserted into a body cavity of the patient 2075 through the trocars 2037a to 2037d. In the illustrated example, as the other surgical tools 2030, a pneumoperitoneum tube 2031, an energy treatment tool 2033, and a forceps 2035 are inserted into the body cavity of the patient 2075. Further, the energy treatment tool 2033 is a treatment tool for performing incision and detachment of tissue, sealing of a blood vessel, and the like with a high-frequency current or an ultrasonic vibration. Note that the illustrated surgical tools 2030 are mere examples, and various kinds of surgical tools typically used in endoscopic surgery such as tweezers, a retractor, and the like may be used as the surgical tool 2030.

An image of an operation site in the body cavity of the patient 2075 captured by the endoscope 2020 is displayed on a display device 2053. The operator 2071 performs treatment such as removal of an affected part, using the energy treatment tool 2033 and the forceps 2035 while viewing the image of the operation site displayed on the display device 2053 in real time. Note that the pneumoperitoneum tube 2031, the energy treatment tool 2033, and the forceps 2035 are supported by the operator 2071, an assistant, or the like during surgery.

(Support Arm Device)

The support arm device 2040 includes an arm unit 2043 extending from a base unit 2041. In the illustrated example, the arm unit 2043 includes joint portions 2045a, 2045b, and 2045c, and links 47a and 47b, and is driven under the control of an arm control device 2057. The endoscope 2020 is supported by the arm unit 2043, and the position and posture of the endoscope 2020 are controlled. With the control, stable fixation of the position of the endoscope 2020 can be realized.

(Endoscope)

The endoscope 2020 includes the lens barrel 2021 and a camera head 2023. A region having a predetermined length from a distal end of the lens barrel 2021 is inserted into the body cavity of the patient 2075. The camera head 2023 is connected to a proximal end of the lens barrel 2021. In the illustrated example, the endoscope 2020 configured as a so-called hard endoscope including the hard lens barrel 2021 is illustrated. However, the endoscope 2020 may be configured as a so-called soft endoscope including the soft lens barrel 2021.

An opening portion in which an object lens is fit is provided in the distal end of the lens barrel 2021. A light source device 2055 is connected to the endoscope 2020, and light generated by the light source device 2055 is guided to the distal end of the lens barrel 2021 by a light guide extending inside the lens barrel 2021 and an object to be observed in the body cavity of the patient 2075 is irradiated with the light through the object lens. Note that the endoscope 2020 may be a direct-viewing endoscope, an oblique-viewing endoscope, or a side-viewing endoscope.

An optical system and an imaging element are provided inside the camera head 2023, and reflected light (observation light) from the object to be observed is condensed to the imaging element by the optical system. The observation light is photoelectrically converted by the imaging element, and an electrical signal corresponding to the observation light, that is, an image signal corresponding to an observed image is generated. The image signal is transmitted to a camera control unit (CCU) 2051 as raw data. Note that the camera head 2023 has a function to adjust magnification and a focal length by appropriately driving the optical system.

Note that, for example, a plurality of imaging elements may be provided in the camera head 2023 to support a stereoscopic view (3D display), and the like. In this case, a plurality of relay optical systems is provided inside the lens barrel 2021 to guide the observation light to each of the plurality of imaging elements.

(Various Devices Mounted in Cart)

The CCU 2051 includes a central processing unit (CPU), a graphics processing unit (GPU), and the like, and generally controls the operation of the endoscope 2020 and the display device 2053. Specifically, the CCU 2051 applies, to the image signal received from the camera head 2023, various types of image processing for displaying an image based on the image signal, such as developing processing (demosaic processing). The CCU 2051 provides the image signal to which the image processing has been applied to the display device 2053. Furthermore, the CCU 2051 transmits a control signal to the camera head 2023 to control its driving. The control signal may include information regarding imaging conditions such as the magnification and focal length.

The display device 2053 displays an image based on the image signal to which the image processing has been applied by the CCU 2051, by the control of the CCU 2051. In a case where the endoscope 2020 supports high-resolution capturing such as 4K (horizontal pixel number 3840×vertical pixel number 2160) or 8K (horizontal pixel number 7680×vertical pixel number 4320), and/or in a case where the endoscope 2020 supports 3D display, for example, the display device 2053, which can perform high-resolution display and/or 3D display, can be used corresponding to each case. In a case where the endoscope 2020 supports the high-resolution capturing such as 4K or 8K, a greater sense of immersion can be obtained by use of the display device 2053 with the size of 55 inches or more. Furthermore, a plurality of the display devices 2053 having different resolutions and sizes may be provided depending on the use.

The light source device 2055 is configured by a light source such as a light emitting diode (LED), and supplies irradiation light, which is used in capturing an operation site, to the endoscope 2020.

The arm control device 2057 is configured by a processor such as a CPU, and is operated according to a predetermined program thereby to control driving of the arm unit 2043 of the support arm device 2040 according to a predetermined control method.

An input device 2059 is an input interface for the endoscopic surgical system 2000. The user can input various types of information and instructions to the endoscopic surgical system 2000 through the input device 2059. For example, the user inputs various types of information regarding surgery, such as patient's physical information and information of an operative procedure of the surgery, through the input device 2059. Furthermore, for example, the user inputs an instruction to drive the arm unit 2043, an instruction to change the imaging conditions (such as the type of the irradiation light, the magnification, and the focal length) of the endoscope 2020, an instruction to drive the energy treatment tool 2033, or the like through the input device 2059.

The type of the input device 2059 is not limited, and the input device 2059 may be one of various known input devices. For example, a mouse, a keyboard, a touch panel, a switch, a foot switch 2069, and/or a lever can be applied to the input device 2059. In a case where a touch panel is used as the input device 2059, the touch panel may be provided on a display surface of the display device 2053.

Alternatively, the input device 2059 is a device worn by the user, such as a glass-type wearable device or a head mounted display (HMD), and various inputs are performed according to a gesture or a line of sight of the user detected by the device. Further, the input device 2059 includes a camera capable of detecting a movement of the user, and various inputs are performed according to a gesture or a line of sight of the user detected from a video captured by the camera.

Moreover, the input device 2059 includes a microphone capable of collecting a voice of the user, and various inputs are performed by an audio through the microphone. In this way, the input device 2059 is configured to be able to input various types of information in a non-contact manner, whereby the user (for example, the operator 2071) in particular belonging to a clean area can operate a device belonging to a filthy area in a non-contact manner. Furthermore, since the user can operate the device without releasing his/her hand from the possessed surgical tool, the user's convenience is improved.

A treatment tool control device 2061 controls driving of the energy treatment tool 2033 for cauterization and incision of tissue, sealing of a blood vessel, and the like. A pneumoperitoneum device 2063 sends a gas into the body cavity of the patient 2075 through the pneumoperitoneum tube 2031 to expand the body cavity for the purpose of securing a field of vision by the endoscope 2020 and a work space for the operator. A recorder 2065 is a device that can record various types of information regarding the surgery. A printer 2067 is a device that can print the various types of information regarding the surgery in various formats such as a text, an image, or a graph.

Hereinafter, a particularly characteristic configuration in the endoscopic surgical system 2000 will be further described in detail.

(Support Arm Device)

The support arm device 2040 includes the base unit 2041 as a base and the arm unit 2043 extending from the base unit 2041. In the illustrated example, the arm unit 2043 is configured by the plurality of joint portions 2045a, 2045b, and 2045c and a plurality of links 2047a and 2047b connected by the joint portion 2045b. In FIG. 37, the configuration of the arm unit 2043 is illustrated in a simplified manner.

In reality, the shapes, the number, and the arrangement of the joint portions 2045a to 2045c and the links 2047a and 2047b, the directions of rotation axes of the joint portions 2045a to 2045c, and the like can be appropriately set so that the arm unit 2043 has a desired degree of freedom. For example, the arm unit 2043 can be favorably configured to have 6 degrees of freedom or more. With the configuration, the endoscope 2020 can be freely moved within a movable range of the arm unit 2043. Therefore, the lens barrel 2021 of the endoscope 2020 can be inserted from a desired direction into the body cavity of the patient 2075.

Actuators are provided in the joint portions 2045a to 2045c, and the joint portions 2045a to 2045c are configured to be rotatable around a predetermined rotation axis by driving of the actuators. The driving of the actuators is controlled by the arm control device 2057, whereby rotation angles of the joint portions 2045a to 2045c are controlled and driving of the arm unit 2043 is controlled. With the control, control of the position and posture of the endoscope 2020 can be realized. At this time, the arm control device 2057 can control the driving of the arm unit 2043 by various known control methods such as force control or position control.

For example, by an appropriate operation input by the operator 2071 via the input device 2059 (including the foot switch 2069), the driving of the arm unit 2043 may be appropriately controlled by the arm control device 2057 according to the operation input, and the position and posture of the endoscope 2020 may be controlled. With the control, the endoscope 2020 at the distal end of the arm unit 2043 can be moved from an arbitrary position to an arbitrary position, and then can be fixedly supported at the position after the movement. Note that the arm unit 2043 may be operated by a so-called master-slave system. In this case, the arm unit 2043 can be remotely operated by the user via the input device 2059 installed at a place distant from an operating room.

Furthermore, in a case where the force control is applied, the arm control device 2057 may perform so-called power assist control in which the arm control device 2057 receives an external force from the user and drives the actuators of the joint portions 2045a to 2045c so that the arm unit 2043 is smoothly moved according to the external force. With the control, the user can move the arm unit 2043 with a relatively light force when moving the arm unit 2043 while being in direct contact with the arm unit 2043. Accordingly, the user can intuitively move the endoscope 2020 with a simpler operation, and the user's convenience can be improved.

Here, in endoscopic surgery, the endoscope 2020 has been generally supported by a doctor called scopist. In contrast, by use of the support arm device 2040, the position of the endoscope 2020 can be reliably fixed without manual operation, and thus an image of the operation site can be stably obtained and the surgery can be smoothly performed.

Note that the arm control device 2057 is not necessarily provided in the cart 2050. Further, the arm control device 2057 is not necessarily one device. For example, the arm control device 2057 may be provided in each of the joint portions 2045a to 2045c of the arm unit 2043 of the support arm device 2040, and the drive control of the arm unit 2043 may be realized by mutual cooperation of the plurality of arm control devices 2057.

(Light Source Device)

The light source device 2055 supplies irradiation light, which is used in capturing an operation site, to the endoscope 2020. The light source device 2055 is configured by a white light source configured by for example, an LED, a laser light source, or a combination thereof. In a case where the white light source is configured by a combination of RGB laser light sources, output intensity and output timing of the respective colors (wavelengths) can be controlled with high accuracy. Therefore, white balance of a captured image can be adjusted in the light source device 2055.

Furthermore, in this case, an object to be observed is irradiated with the laser light from each of the RGB laser light sources in a time division manner, and the driving of the imaging element of the camera head 2023 is controlled in synchronization with the irradiation timing, whereby images respectively corresponding to RGB can be captured in a time division manner. According to the method, a color image can be obtained without providing a color filter to the imaging element.

Furthermore, driving of the light source device 2055 may be controlled to change intensity of light to be output every predetermined time. The driving of the imaging element of the camera head 2023 is controlled in synchronization with change timing of the intensity of light, and images are acquired in a time division manner and are synthesized, whereby a high-dynamic range image without clipped blacks and flared highlights can be generated.

Further, the light source device 2055 may be configured to be able to supply light in a predetermined wavelength band corresponding to special light observation. In the special light observation, for example, so-called narrow band imaging to capture a predetermined tissue such as a blood vessel in a mucosal surface layer at high contrast is performed by radiating light in a narrower band than the irradiation light (in other words, white light) at the time of normal observation, using wavelength dependency of absorption of light in a body tissue.

Alternatively, in the special light observation, fluorescence observation to obtain an image by fluorescence generated by radiation of exciting light may be performed. In the fluorescence observation, irradiating the body tissue with exciting light to observe fluorescence from the body tissue (self-fluorescence observation), injecting a reagent such as indocyanine green (ICG) into the body tissue and irradiating the body tissue with exciting light corresponding to a fluorescence wavelength of the reagent to obtain a fluorescence image, or the like can be performed. The light source device 2055 can be configured to be able to supply narrowband light and/or exciting light corresponding to such special light observation.

(Camera Head and CCU)

Figure 38:
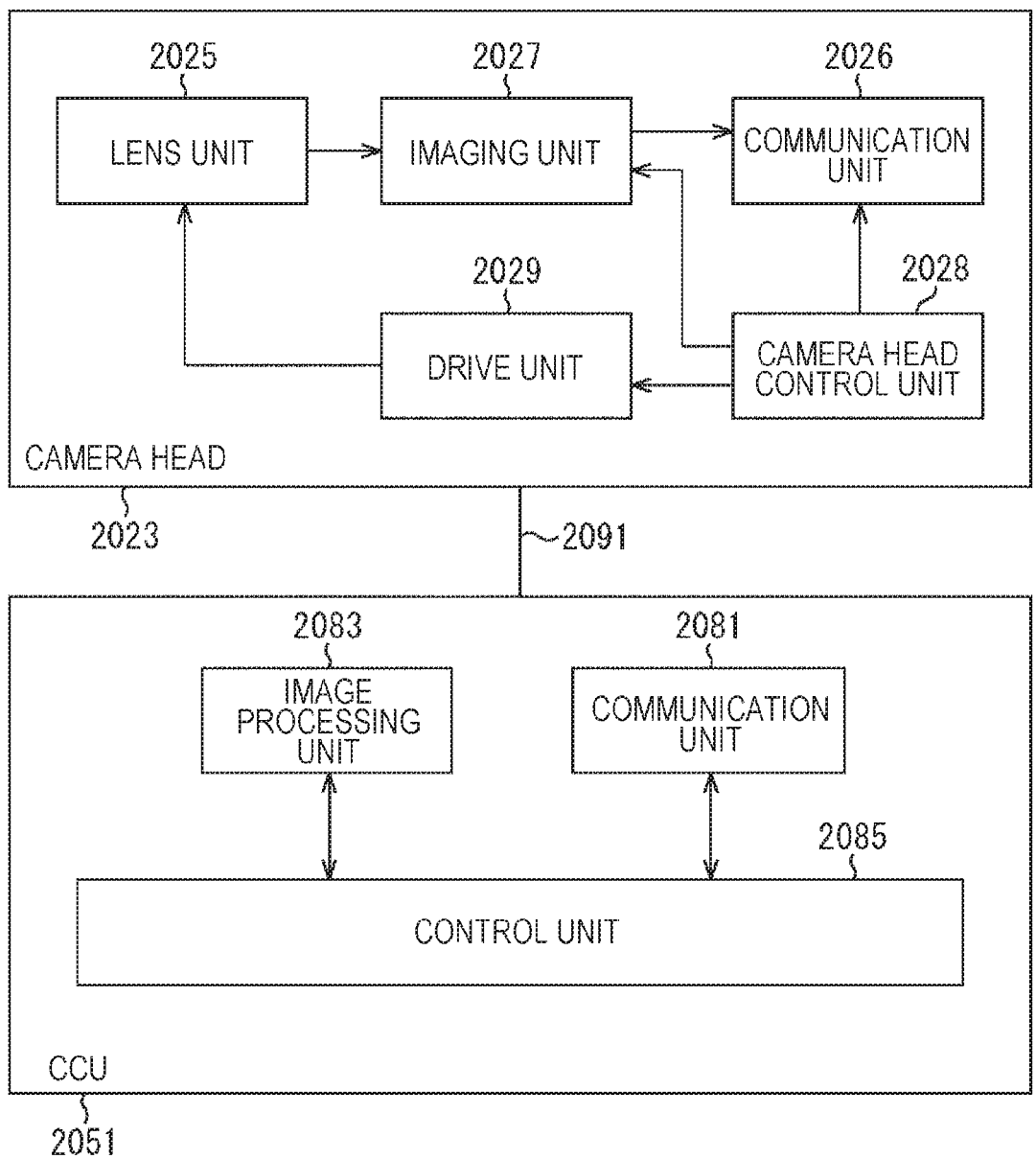
FIG. 38 is a block diagram illustrating an example of functional configurations of a camera head and a CCU.

Functions of the camera head 2023 of the endoscope 2020 and the CCU 2051 will be described in more detail with reference to FIG. 38. FIG. 38 is a block diagram illustrating an example of functional configurations of the camera head 2023 and the CCU 2051 illustrated in FIG. 37.

Referring to FIG. 38, the camera head 2023 has a lens unit 2025, an imaging unit 2027, a drive unit 29, a communication unit 2026, and a camera head control unit 2028 as its functions. Further, the CCU 2051 has a communication unit 2081, an image processing unit 2083, and a control unit 2085 as its functions. The camera head 2023 and the CCU 2051 are communicatively connected with each other by a transmission cable 2091.

First, a functional configuration of the camera head 2023 will be described. The lens unit 2025 is an optical system provided in a connection portion between the lens unit 2025 and the lens barrel 2021. Observation light taken through the distal end of the lens barrel 2021 is guided to the camera head 2023 and enters the lens unit 2025. The lens unit 2025 is configured by a combination of a plurality of lenses including a zoom lens and a focus lens. Optical characteristics of the lens unit 2025 are adjusted to condense the observation light on a light receiving surface of an imaging element of the imaging unit 2027. Furthermore, the zoom lens and the focus lens are configured to have their positions on the optical axis movable for adjustment of the magnification and focal point of the captured image.

The imaging unit 2027 is configured by an imaging element, and is disposed at a rear stage of the lens unit 2025. The observation light having passed through the lens unit 2025 is focused on the light receiving surface of the imaging element, and an image signal corresponding to the observed image is generated by photoelectric conversion. The image signal generated by the imaging unit 2027 is provided to the communication unit 2026.

As the imaging element constituting the imaging unit 2027, for example, a complementary metal oxide semiconductor (CMOS)-type image sensor having Bayer arrangement and capable of color capturing is used.

As the imaging unit 2027, the imaging device according to one of the above-described embodiments can be used. By the imaging device, the dynamic range of the imaging unit 2027 can be expanded, and the image quality can be improved.

Note that, as the imaging element, for example, an imaging element that can capture a high-resolution image of 4K or more may be used. By obtainment of the image of the operation site with high resolution, the operator 2071 can grasp the state of the operation site in more detail and can more smoothly advance the surgery.

Furthermore, the imaging element constituting the imaging unit 2027 includes a pair of imaging elements for respectively obtaining image signals for right eye and for left eye corresponding to 3D display. With the 3D display, the operator 2071 can more accurately grasp the depth of biological tissue in the operation site. Note that, in a case where the imaging unit 2027 is configured by a multi imaging element, a plurality of lens units 2025 may be provided corresponding to the imaging elements.

Furthermore, the imaging unit 2027 is not necessarily provided in the camera head 2023. For example, the imaging unit 2027 may be provided just behind the objective lens inside the lens barrel 2021.

The drive unit 29 is configured by an actuator, and moves the zoom lens and the focus lens of the lens unit 2025 by a predetermined distance along an optical axis by the control of the camera head control unit 2028. With the movement, the magnification and focal point of the captured image by the imaging unit 2027 can be appropriately adjusted.

The communication unit 2026 is configured by a communication device for transmitting or receiving various types of information to or from the CCU 2051. The communication unit 2026 transmits the image signal obtained from the imaging unit 2027 to the CCU 2051 through the transmission cable 2091 as raw data. At this time, to display the captured image of the operation site with low latency, the image signal is favorably transmitted by optical communication.

This is because, in surgery, the operator 2071 performs surgery while observing the state of the affected part with the captured image, and thus display of a moving image of the operation site in as real time as possible is demanded for more safe and reliable surgery. In the case of the optical communication, a photoelectric conversion module that converts an electrical signal into an optical signal is provided in the communication unit 2026. The image signal is converted into the optical signal by the photoelectric conversion module, and is then transmitted to the CCU 2051 via the transmission cable 2091.

Furthermore, the communication unit 2026 receives a control signal for controlling driving of the camera head 2023 from the CCU 2051. The control signal includes information regarding the imaging conditions such as information for specifying a frame rate of a captured image, information for specifying an exposure value at the time of imaging, and/or information for specifying the magnification and focal point of the captured image. The communication unit 2026 provides the received control signal to the camera head control unit 2028.

Note that the control signal from that CCU 2051 may also be transmitted by the optical communication. In this case, the communication unit 2026 is provided with a photoelectric conversion module that converts an optical signal into an electrical signal, and the control signal is converted into an electrical signal by the photoelectric conversion module and is then provided to the camera head control unit 2028.

Note that the imaging conditions such as the frame rate, exposure value, magnification, and focal point are automatically set by the control unit 2085 of the CCU 2051 on the basis of the acquired image signal. That is, a so-called auto exposure (AE) function, an auto focus (AF) function, and an auto white balance (AWB) function are incorporated in the endoscope 2020.

The camera head control unit 2028 controls the driving of the camera head 2023 on the basis of the control signal received from the CCU 2051 through the communication unit 2026. For example, the camera head control unit 2028 controls driving of the imaging element of the imaging unit 2027 on the basis of the information for specifying the frame rate of the captured image and/or the information for specifying exposure at the time of imaging. Furthermore, for example, the camera head control unit 2028 appropriately moves the zoom lens and the focus lens of the lens unit 2025 via the drive unit 29 on the basis of the information for specifying the magnification and focal point of the captured image. The camera head control unit 2028 may further have a function to store information for identifying the lens barrel 2021 and the camera head 2023.

Note that the configuration of the lens unit 2025, the imaging unit 2027, and the like is arranged in a hermetically sealed structure having high airtightness and waterproofness, whereby the camera head 2023 can have resistance to autoclave sterilization processing.

Next, a functional configuration of the CCU 2051 will be described. The communication unit 2081 is configured by a communication device for transmitting or receiving various types of information to or from the camera head 2023. The communication unit 2081 receives the image signal transmitted from the camera head 2023 through the transmission cable 2091. At this time, as described above, the image signal can be favorably transmitted by the optical communication. In this case, the communication unit 2081 is provided with a photoelectric conversion module that converts an optical signal into an electrical signal, corresponding to the optical communication. The communication unit 2081 provides the image signal converted into the electrical signal to the image processing unit 2083.

Furthermore, the communication unit 2081 transmits the control signal for controlling the driving of the camera head 2023 to the camera head 2023. The control signal may also be transmitted by the optical communication.

The image processing unit 2083 applies various types of image processing to the image signal as raw data transmitted from the camera head 2023. The image processing include various types of known signal processing such as development processing, high image quality processing (such as band enhancement processing, super resolution processing, noise reduction (NR) processing, and/or camera shake correction processing), and/or enlargement processing (electronic zoom processing). Furthermore, the image processing unit 2083 performs wave detection processing for image signals for performing AE, AF and AWB.

The image processing unit 2083 is configured by a processor such as a CPU or a GPU, and the processor is operated according to a predetermined program, whereby the above-described image processing and wave detection processing can be performed. Note that in a case where the image processing unit 2083 is configured by a plurality of GPUs, the image processing unit 2083 appropriately divides the information regarding the image signal and performs the image processing in parallel by the plurality of GPUs.

The control unit 2085 performs various types of control related to imaging of the operation site by the endoscope 2020 and display of the captured image. For example, the control unit 2085 generates the control signal for controlling the driving of the camera head 2023. At this time, in a case where the imaging conditions are input by the user, the control unit 2085 generates the control signal on the basis of the input by the user. Alternatively, in a case where the AE function, the AF function, and the AWB function are incorporated in the endoscope 2020, the control unit 2085 appropriately calculates optimum exposure value, focal length, and white balance according to a result of the wave detection processing by the image processing unit 2083, and generates the control signal.

Furthermore, the control unit 2085 displays the image of the operation site on the display device 2053 on the basis of the image signal to which the image processing has been applied by the image processing unit 2083. At this time, the control unit 2085 recognizes various objects in the image of the operation site, using various image recognition technologies.

For example, the control unit 2085 can recognize the surgical tool such as the forceps, a specific living body portion, blood, mist when using the energy treatment tool 2033, and the like, by detecting the shape, color, or the like of an edge of the object included in the image of the operation site. The control unit 2085 superimposes and displays various types of surgery support information on the image of the operation site, in displaying the image of the operation site on the display device 2053 using the result of recognition. The surgery support information is superimposed, displayed, and presented to the operator 2071, so that the surgery can be more safely and reliably advanced.

The transmission cable 2091 that connects the camera head 2023 and the CCU 2051 is an electrical signal cable supporting communication of electrical signals, an optical fiber supporting optical communication, or a composite cable thereof.

Here, in the illustrated example, the communication has been performed in a wired manner using the transmission cable 2091. However, the communication between the camera head 2023 and the CCU 2051 may be wirelessly performed. In a case where the communication between the camera head 2023 and the CCU 2051 is wirelessly performed, it is unnecessary to lay the transmission cable 2091 in the operating room. Therefore, the situation in which movement of medical staffs in the operating room is hindered by the transmission cable 2091 can be eliminated.

Thus, an example of the endoscopic surgical system 2000 to which the technology according to the present disclosure is applicable has been described.

Note that, here, the endoscopic surgical system 2000 has been described as an example. However, a system to which the technology according to the present disclosure is applicable is not limited to this example. For example, the technology according to the present disclosure may be applied to a flexible endoscope system for examination or a microscopic surgery system.

Figure 39:
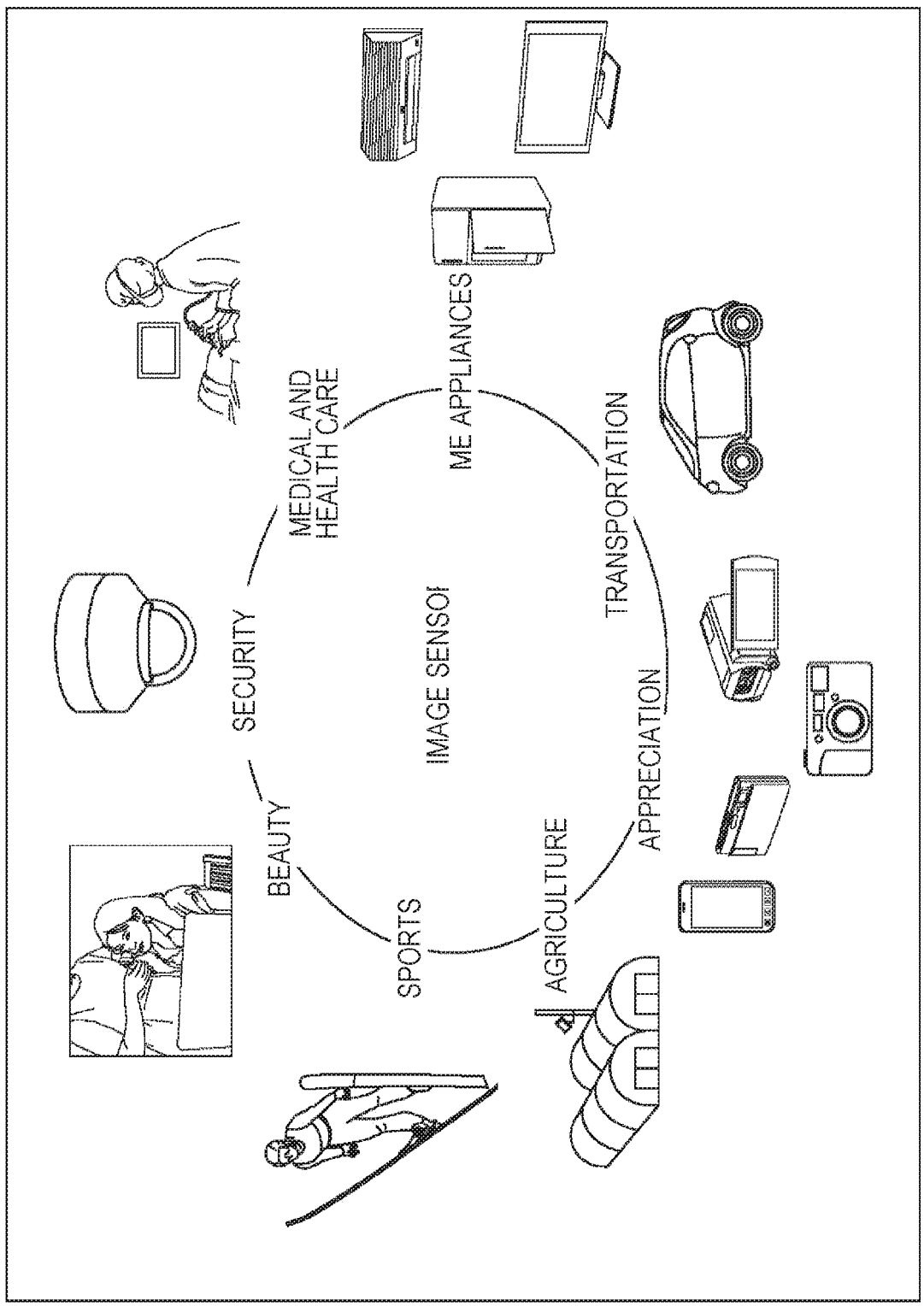
FIG. 39 is a diagram for describing use examples of the imaging device.

FIG. 39 is a diagram for describing use examples of the above-described imaging device.

The above-described imaging device can be used in various cases of sensing light such as visible light, infrared light, ultraviolet light, and an X-rays, as follows, for example.

Devices that capture images provided for appreciation, such as digital cameras, portable devices with a camera function, and the like Devices provided for transportation, such as in-vehicle sensors that capture the front, rear, peripheries, an interior of the vehicle, etc. for safe driving such as automatic stop, recognition of a state of a driver, or the like, monitoring cameras that monitor traveling vehicles and roads, distance measuring sensors that measure a distance between vehicles, and the like Devices provided for home appliances such as TVs, refrigerators, air conditioners, etc. to capture gestures of users and perform device operations according to the gestures Devices provided for medical and healthcare, such as endoscopes, devices that perform angiography by receiving infrared light, and the like Devices provided for security, such as monitoring cameras for crime prevention, cameras for person authentication use, and the like Devices provided for beauty, such as skin measuring instruments that capture skin, microscopes that capture scalp, and the like Devices provided for sports, such as action cameras, wearable cameras, and the like for sport use or the like Devices provided for agriculture, such as cameras for monitoring the condition of fields and crops In the present specification, the term "system" refers to an entire device configured by a plurality of devices.

Note that the effects described in the present specification are mere examples and are not limited, and other effects may be exhibited.

Note that an embodiment of the present technology is not limited to the above-described embodiments and various modifications can be made without departing from the gist of the present technology.

Note that the present technology can also have the following configurations.

(1)

An imaging device including:

a first photoelectric conversion unit;

a second photoelectric conversion unit having a smaller electric charge amount to be converted per unit time than the first photoelectric conversion unit;

a charge accumulation unit configured to accumulate an electric charge generated by the second photoelectric conversion unit;

a charge voltage conversion unit;

a first transfer gate unit configured to transfer an electric charge from the first photoelectric conversion unit to the charge voltage conversion unit;

a second transfer gate unit configured to couple potentials of the charge voltage conversion unit and the charge accumulation unit;

a third transfer gate unit configured to transfer an electric charge from the second photoelectric conversion unit to the charge accumulation unit;

an overflow path formed under a gate electrode of the third transfer gate unit, and configured to transfer an electric charge overflowing from the second photoelectric conversion unit to the charge accumulation unit; and a light reducing unit configured to reduce light to enter the second photoelectric conversion unit.

(2)

The imaging device according to (1), in which the light reducing unit is formed between the second photoelectric conversion unit and an on-chip lens formed on the second photoelectric conversion unit.

(3)
The imaging device according to (2), in which
the light reducing unit is an optical filter that reduces light transmitted through the on-chip lens.
(4)
The imaging device according to (2), in which
the light reducing unit is an achromatic filter.
(5)
The imaging device according to any one of (2) to (4), in which
the light reducing unit is formed in a portion not exposed at formation of the on-chip lens, and in a portion covering the second photoelectric conversion unit.
(6)
The imaging device according to any one of (2) to (5), in which,
in a portion where a first on-chip lens formed on the first photoelectric conversion unit and a second on-chip lens formed on the second photoelectric conversion unit are adjacent to each other, the light reducing unit is formed to extend to a side of the first on-chip lens, and is not formed in a void portion between the first on-chip lenses.
(7)
The imaging device according to any one of (2) to (6), in which
the light reducing unit has an approximate quadrangular shape, and a vertex portion is formed into an approximate arc shape.
(8)
The imaging device according to any one of (2) to (6), in which
the light reducing unit has an approximate circular shape.
(9)
The imaging device according to any one of (2) to (6), in which
the light reducing unit has an approximate quadrangular shape, and a vertex portion of the approximate quadrangular shape is arranged in a portion where a first on-chip lens formed on the first photoelectric conversion unit and a second on-chip lens formed on the second photoelectric conversion unit are adjacent to each other.
(10)
The imaging device according to any one of (2) to (9), further including:
an inter-pixel light shielding unit between the first photoelectric conversion unit and the second photoelectric conversion unit.
(11)
The imaging device according to any one of (2) to (10), in which
the first photoelectric conversion unit and the second photoelectric conversion unit are formed in an approximate same size.
(12)
The imaging device according to any (2), in which
the light reducing unit makes a passage area through which light transmitted through the on-chip lens passes small.
(13)
The imaging device according to (12), in which
an opening shape of the light shielding unit is a reduced shape of an outer edge of the second photoelectric conversion unit.
(14)
The imaging device according to (12), in which
an opening shape of the light shielding unit is an approximate circular shape.
(15)
The imaging device according to (12), in which
the light shielding unit is arranged in an approximate quadrangular shape in both ends of the second photoelectric conversion unit.
(16)
The imaging device according to (1), in which
the light reducing unit is an on-chip lens formed in a recessed manner in the second photoelectric conversion unit.
(17)
The imaging device according to (16), further including:
an inter-pixel light shielding unit between the first photoelectric conversion unit and the second photoelectric conversion unit.
(18)
The imaging device according to (17), in which
a part of the inter-pixel light shielding unit is formed in a same layer as a color filter.
(19)
The imaging device according to (16), in which
the on-chip lens is formed by a material having a high refractive index.
(20)
An electronic device including:
an imaging device including:
a first photoelectric conversion unit;
a second photoelectric conversion unit having a smaller electric charge amount converted per unit time than the first photoelectric conversion unit;
a charge accumulation unit configured to accumulate an electric charge generated by the second photoelectric conversion unit;
a charge voltage conversion unit;
a first transfer gate unit configured to transfer an electric charge from the first photoelectric conversion unit to the charge voltage conversion unit;
a second transfer gate unit configured to couple potentials of the charge voltage conversion unit and the charge accumulation unit;
a third transfer gate unit configured to transfer an electric charge from the second photoelectric conversion unit to the charge accumulation unit;
an overflow path formed under a gate electrode of the third transfer gate unit, and configured to transfer an electric charge overflowing from the second photoelectric conversion unit to the charge accumulation unit; and
a light reducing unit configured to reduce light entering the second photoelectric conversion unit.

REFERENCE SIGNS LIST 10, 10A, 10B CMOS image sensor
11 Pixel array unit
12 Vertical drive unit
13 Column processing unit
14 Horizontal drive unit
15 System control unit
16 Pixel drive line
17 Vertical signal line
18 Signal processing unit
19 Data storage unit
100A to 100F Unit pixel
101 First photoelectric conversion unit
102 Second photoelectric conversion unit
103 First transfer transistor
104 Second transfer transistor 105 Third transfer transistor
106 Fourth transfer transistor
107 Floating diffusion (FD) portion
108 Reset transistor
109 Amplifier transistor
110 Selection transistor
351 Light reducing filter
412 Optical diaphragm
501 Second on-chip lens

The invention claimed is:

1. An imaging device, comprising:
a first photoelectric conversion unit;
a second photoelectric conversion unit having a smaller electric charge amount to convert per unit time than the first photoelectric conversion unit;
a first on-chip lens on the first photoelectric conversion unit;
a first light shielding film between the first photoelectric conversion unit and the first on-chip lens;
a second on-chip lens on the second photoelectric conversion unit;
a second light shielding film between the second photoelectric conversion unit and the second on-chip lens;
a charge accumulation unit configured to accumulate a first electric charge generated by the second photoelectric conversion unit;
a charge voltage conversion unit;
an inter-pixel light shielding unit between the first photoelectric conversion unit and the second photoelectric conversion unit, wherein the inter-pixel light shielding unit includes a center in a width direction of the inter-pixel light shielding unit;
a first transfer gate unit configured to transfer a second electric charge from the first photoelectric conversion unit to the charge voltage conversion unit;
a second transfer gate unit configured to couple a potential of the charge voltage conversion unit and a potential of the charge accumulation unit;
a third transfer gate unit configured to transfer the first electric charge from the second photoelectric conversion unit to the charge accumulation unit, wherein the first transfer gate unit, the second transfer gate unit, and the third transfer gate unit are connected in series between the first photoelectric conversion unit and the second photoelectric conversion unit;
an overflow path configured to transfer an overflowing electric charge from the second photoelectric conversion unit to the charge accumulation unit, wherein the overflow path is under a gate electrode of the third transfer gate unit;
a color filter on each of the first photoelectric conversion unit and the second photoelectric conversion unit; and
a light reducing unit between the color filter and the second on-chip lens, wherein
the light reducing unit is configured to reduce light that enters the second photoelectric conversion unit, and
in a portion where the first on-chip lens and the second on-chip lens are adjacent to each other, the light reducing unit extends in a direction of the first photoelectric conversion unit with respect to the center of the inter-pixel light shielding unit.

2. The imaging device according to claim 1, wherein the light reducing unit is between the second photoelectric conversion unit and the second on-chip lens.

3. The imaging device according to claim 2, wherein the light reducing unit is an optical filter configured to reduce light transmitted through the second on-chip lens.

4. The imaging device according to claim 2, wherein the light reducing unit is an achromatic filter.

5. The imaging device according to claim 2, wherein the light reducing unit is in a portion not exposed by the second on-chip lens, and in a portion that covers the second photoelectric conversion unit.

6. The imaging device according to claim 1, wherein the light reducing unit has an approximate quadrangular shape.

7. The imaging device according to claim 1, wherein the light reducing unit has an approximate circular shape.

8. The imaging device according to claim 1, wherein
the light reducing unit has an approximate quadrangular shape, and
a vertex portion of the approximate quadrangular shape is in the portion where the first on-chip lens and the second on-chip lens are adjacent to each other.

9. The imaging device according to claim 1, wherein the first photoelectric conversion unit and the second photoelectric conversion unit have an approximate same size.

10. The imaging device according to claim 2, wherein the light reducing unit includes a passage area through which light transmitted through the second on-chip lens passes.

11. The imaging device according to claim 10, wherein an opening shape of a light shielding unit is a reduced shape of an outer edge of the second photoelectric conversion unit.

12. The imaging device according to claim 10, wherein an opening shape of a light shielding unit is an approximate circular shape.

13. The imaging device according to claim 10, wherein a light shielding unit is in an approximate quadrangular shape and in both ends of the second photoelectric conversion unit.

14. The imaging device according to claim 1, wherein
the light reducing unit is an on-chip lens in a recessed shape, and
the light reducing unit is on the second photoelectric conversion unit.

15. The imaging device according to claim 1, wherein a part of the inter-pixel light shielding unit and the color filter are in a same layer.

16. The imaging device according to claim 14, wherein a material of the on-chip lens has a high refractive index.

17. An electronic device, comprising:
an imaging device including:
a first photoelectric conversion unit;
a second photoelectric conversion unit having a smaller electric charge amount to convert per unit time than the first photoelectric conversion unit;
a first on-chip lens on the first photoelectric conversion unit;
a first light shielding film between the first photoelectric conversion unit and the first on-chip lens;
a second on-chip lens on the second photoelectric conversion unit;
a second light shielding film between the second photoelectric conversion unit and the second on-chip lens;
a charge accumulation unit configured to accumulate a first electric charge generated by the second photoelectric conversion unit;
a charge voltage conversion unit;
an inter-pixel light shielding unit between the first photoelectric conversion unit and the second photoelectric conversion unit, wherein the inter-pixel light shielding unit includes a center in a width direction of the inter-pixel light shielding unit;

a first transfer gate unit configured to transfer a second electric charge from the first photoelectric conversion unit to the charge voltage conversion unit;

a second transfer gate unit configured to couple a potential of the charge voltage conversion unit and a potential of the charge accumulation unit;

a third transfer gate unit configured to transfer the first electric charge from the second photoelectric conversion unit to the charge accumulation unit, wherein the first transfer gate unit, the second transfer gate unit, and the third transfer gate unit are connected in series between the first photoelectric conversion unit and the second photoelectric conversion unit;

an overflow path configured to transfer an overflowing electric charge from the second photoelectric conversion unit to the charge accumulation unit, wherein the overflow path is under a gate electrode of the third transfer gate unit;

a color filter on each of the first photoelectric conversion unit and the second photoelectric conversion unit; and a light reducing unit between the color filter and the second on-chip lens, wherein
- the light reducing unit is configured to reduce light entering the second photoelectric conversion unit, and
- in a portion where the first on-chip lens and the second on-chip lens are adjacent to each other, the light reducing unit extends in a direction of the first photoelectric conversion unit with respect to the center of the inter-pixel light shielding unit.

\* \* \* \* \*